(12) United States Patent
Herbsommer et al.

(10) Patent No.: US 12,386,317 B2
(45) Date of Patent: Aug. 12, 2025

(54) QUANTUM-BASED DEVICE INCLUDING VAPOR CELL

(71) Applicant: Texas Instruments Incorporated, Dallas, TX (US)

(72) Inventors: Juan Herbsommer, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/374,724

(22) Filed: Sep. 29, 2023

(65) Prior Publication Data

US 2024/0142915 A1  May 2, 2024

Related U.S. Application Data

(60) Provisional application No. 63/383,971, filed on Nov. 16, 2022, provisional application No. 63/419,375, filed on Oct. 26, 2022.

(51) Int. Cl.
*G04F 5/14* (2006.01)
*H03L 7/26* (2006.01)

(52) U.S. Cl.
CPC .............. *G04F 5/145* (2013.01); *G04F 5/14* (2013.01); *H03L 7/26* (2013.01)

(58) Field of Classification Search
CPC .............. G04F 5/14; G04F 5/145; H03L 7/26
See application file for complete search history.

(56) References Cited

U.S. PATENT DOCUMENTS

| | | | |
|---|---|---|---|
| 2016/0291549 A1* | 10/2016 | Herbsommer | G04F 5/145 |
| 2019/0071304 A1* | 3/2019 | Fruehling | G01L 9/0051 |
| 2019/0204786 A1* | 7/2019 | Herbsommer | G04F 5/14 |
| 2021/0199598 A1* | 7/2021 | Dellis | G01N 27/02 |

* cited by examiner

*Primary Examiner* — Ryan Johnson
(74) *Attorney, Agent, or Firm* — Ming Wai Choy; Frank D. Cimino

(57) ABSTRACT

In one example, a system includes a first sealed container, a second sealed container, a signal coupler, a container enclosure, and an electromagnetic (EM) reflective coating. The first sealed container encloses a first dipolar gas. The second sealed container encloses a second dipolar gas. The signal coupler is communicatively coupled between the first and second sealed containers. The signal coupler includes a solid material or a hollow sealed tube. The container enclosure encloses the first and second sealed containers and the signal coupler. The EM reflective coating is inside the container enclosure and covers at least part of the first container, at least part of the second container, and at least part of the signal coupler.

26 Claims, 57 Drawing Sheets

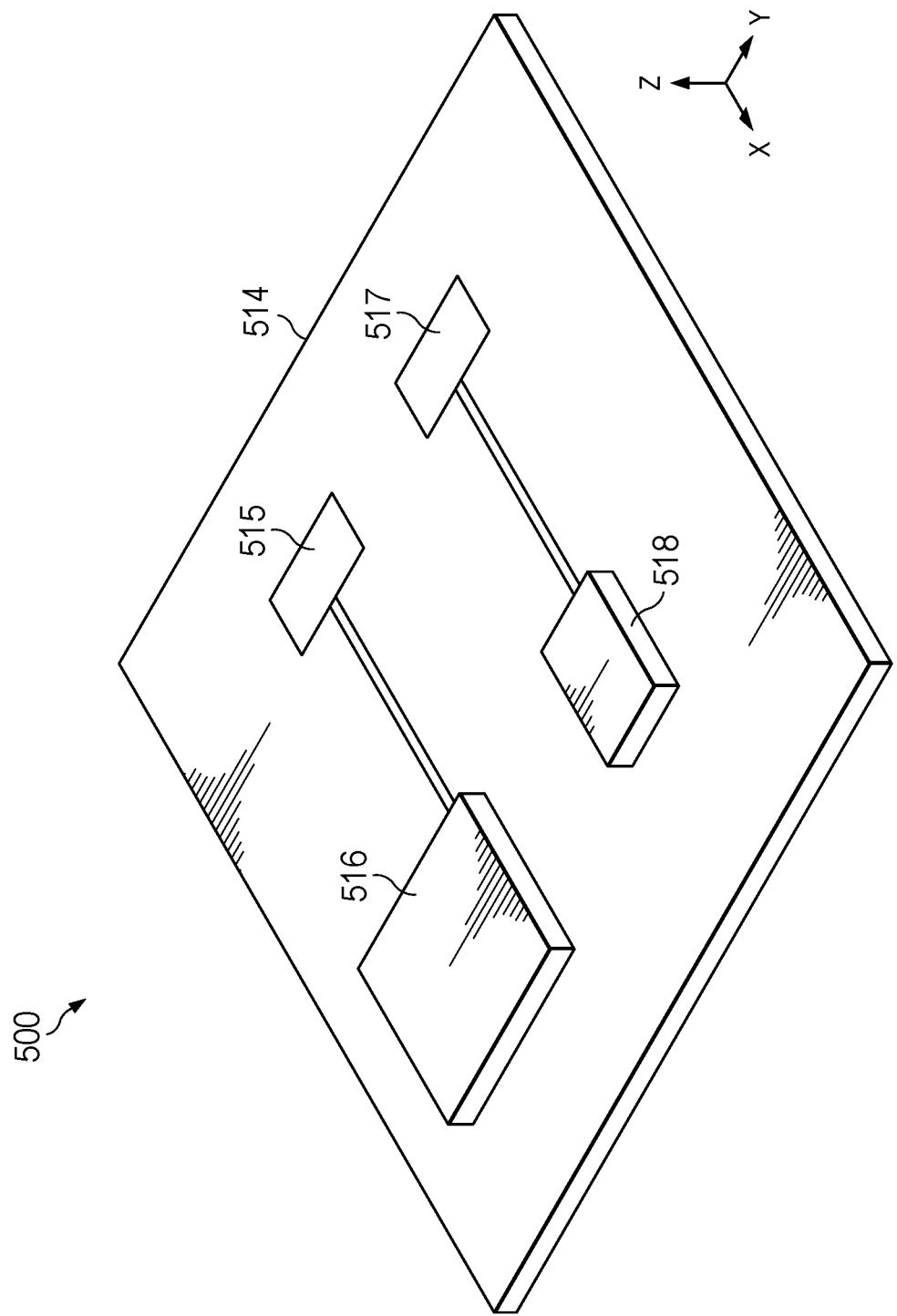

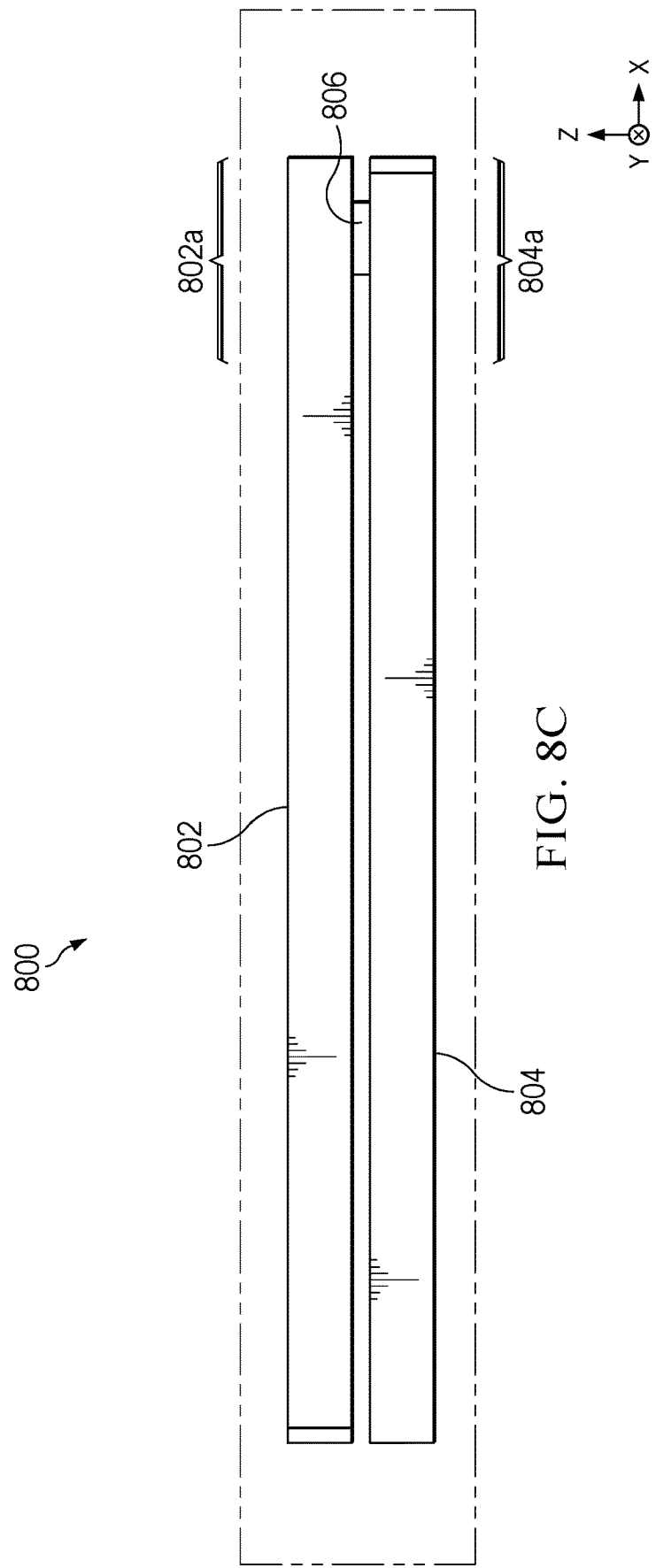

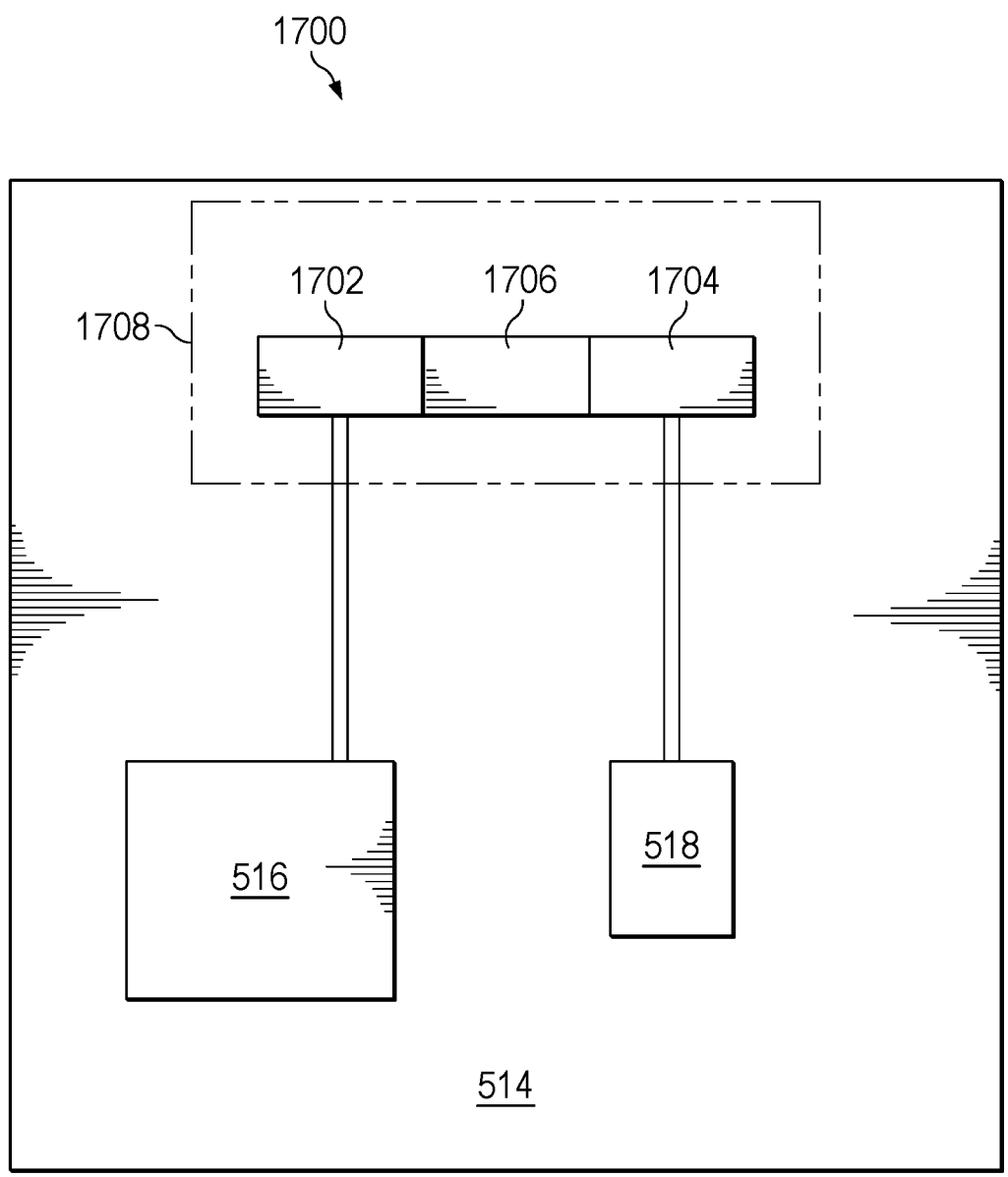
FIG. 17B
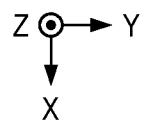

QUANTUM-BASED DEVICE INCLUDING VAPOR CELL

RELATED APPLICATION

The present application is related to U.S. Provisional Patent Application No. 63/419,375, titled "Quantum Sensor and Integration with Microelectronic Devices", filed on Oct. 26, 2022, and U.S. Provisional Patent Application No. 63/383,971, titled "Quantum Sensor and Integration with Microelectronic Devices", filed on Nov. 15, 2022, which are hereby incorporated herein by reference in their entireties.

BACKGROUND

A vapor cell (or a physics cell) can include a hermetically sealed container containing a gas. A vapor cell may be useful in numerous applications, including as part of a chip-scale millimeter-wave atomic clock. The gas within a vapor cell can contain dipolar molecules at a relatively low pressure that can be chosen to provide a narrow signal absorption frequency peak indicative of the quantum transition molecules as detected at an output of the cavity. An electromagnetic (EM) signal can be launched into the cavity through an aperture in the cavity that is electromagnetically translucent or substantially transparent. Closed-loop control can dynamically adjust the frequency of the signal to match the molecular quantum rotational transition. The frequency of the quantum rotational transition of the selected dipolar molecules may vary less due to aging of the chip-scale millimeter-wave atomic clock and with temperature or other environmental factors, which makes the system useful to provide an accurate clock source that also has long-term stability. It is advantageous to increase the absorption of the EM signal by the dipolar gas, which can increase the signal-to-noise ratio (SNR) and improve the accuracy of the closed-loop control and the determination of the transition frequency. One way to increase the signal absorption by the gas is to increase the propagation distance of the EM signal within the cavity.

SUMMARY

In one example, a system includes a first sealed container, a second sealed container, a signal coupler, a container enclosure, and an electromagnetic (EM) reflective coating. The first sealed container encloses a first dipolar gas. The second sealed container encloses a second dipolar gas. The signal coupler is communicatively coupled between the first and second sealed containers. The signal coupler includes a solid material or a hollow sealed tube. The container enclosure encloses the first and second sealed containers and the signal coupler. The EM reflective coating is inside the container enclosure and covers at least part of the first container, at least part of the second container, and at least part of the signal coupler.

In another example, a system includes a substrate, a first sealed container, a second sealed container, a signal coupler, a container enclosure, and an EM reflective coating. The substrate includes a transmitter and a receiver. The first sealed container encloses a first dipolar gas. The first sealed container has a first end communicatively coupled to the transmitter. The second sealed container encloses a second dipolar gas. The second sealed container has a second end communicatively coupled to the receiver. The signal coupler is communicatively coupled between the first and second sealed containers. The signal coupler includes a solid material or a hollow sealed tube. The container enclosure encloses the first and second sealed containers and the coupler. The EM reflective coating is inside the container enclosure and covers at least part of the first sealed container, at least part of the second sealed container, and at least part of the signal coupler.

BRIEF DESCRIPTION OF THE DRAWINGS

FIGS. 5A, 5B, 5C, 5D, 5E, 5F, and 5G show various perspective views of dipolar-gas-confining containers communicatively coupled by a signal coupler, in which the containers are held parallel to each other in a container enclosure.

FIGS. 8A, 8B, 8C, and 8D show various perspective views of another arrangement of dipolar-gas-confining containers and a signal coupler, in which a first portion of one container is on a second portion of another container, and the signal coupler is positioned between and communicatively couples together respective opposing surfaces of the containers.

FIGS. 17A, 17B, and 17C show angled and top views, respectively, of an example quantum transition frequency detector having two dipolar-gas-confining containers and communicatively coupled together by a signal coupler, in which the containers are arranged perpendicular to (or angled from) a PCB containing transmit and receive antennas and circuitries.

The same reference numbers or other reference designators are used in the drawings to designate the same or similar (functionally and/or structurally) features. The figures are not necessarily drawn to scale.

DETAILED DESCRIPTION

Figure 1:
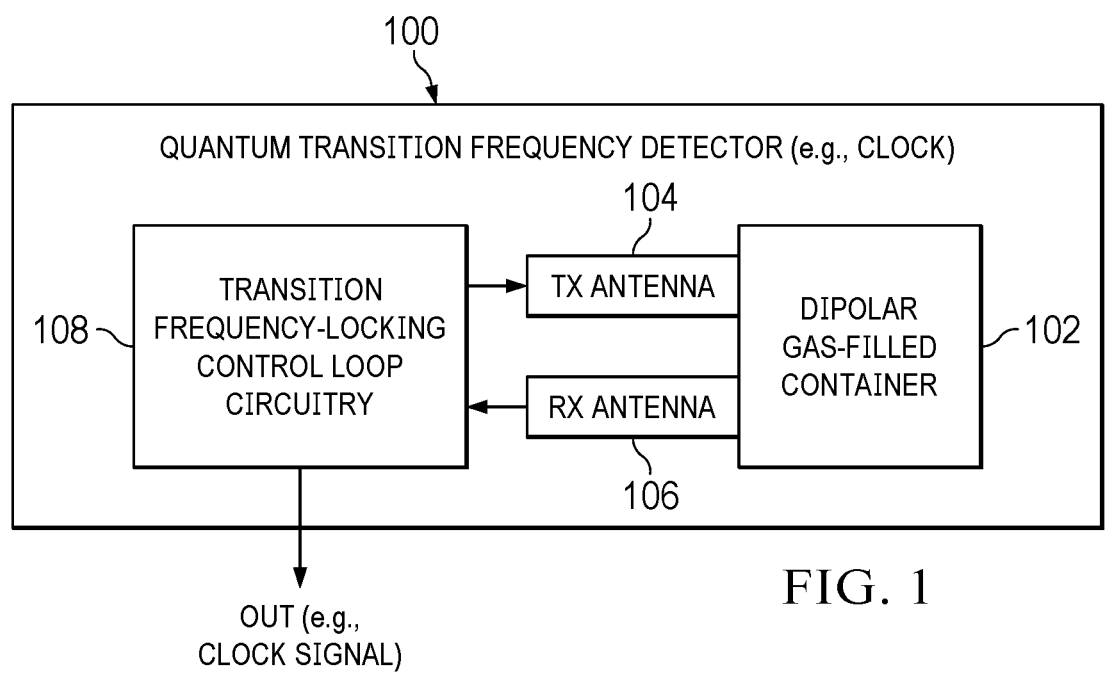
FIG. 1 is a block diagram of an example quantum transition frequency detector.

FIG. 1 is a block diagram of an example quantum transition frequency detector 100 that can be integrated to provide, for example, a clock that is accurate to within one second in several hundred years. In other examples, the frequency detector 100 is useful to create a magnetic field sensor (magnetometer), an electric field sensor, or a pressure sensor. Detector 100 includes a container 102, or an assembly that includes multiple such containers. The container 102 is hermetically sealed to contain a dipolar gas at a relatively low pressure, the precise pressure depending on which dipolar gas is used, among other factors. In some examples, the pressure is less than the atmospheric pressure at sea level. In some examples, the pressure is less than one one-hundredth of atmospheric pressure at sea level. In some examples, the pressure is less than one one-thousandth of atmospheric pressure at sea level. In some examples, the pressure is less than one ten-thousandth of atmospheric pressure at sea level. Suitable dipolar gases can include water vapor ($H_2O$), acetonitrile ($CH_3CN$), cyanoacetylene ($HC_3N$), ammonia ($NH_3$), carbonyl sulfide (OCS), hydrogen cyanide (HCN), and hydrogen sulfide ($H_2S$). In some examples, container 102 may be a glass (e.g., borosilicate) tube, as described further with reference to FIG. 2.

The container 102 (or each container in an assembly) can be coated on the outside with an electromagnetically reflective (e.g., electrically conductive) material (e.g., a metal), or the container 102 (or each container in an assembly) can be placed in an enclosure that is made of or coated with an electromagnetically reflective material such that exterior walls of the container adjoin (e.g., are substantially in contact with) the electromagnetically reflective material of the enclosure. As examples, the enclosure can be metal or metal-coated plastic. As examples, metallization of the container 102 or the enclosure can be done by sputtering or by evaporation. A single container, or multiple containers assembled in an enclosure, can form a vapor cell. Transmitter (TX) and receiver (RX) antennas (104, 106) are coupled to the container 102 at electromagnetically translucent or substantially transparent windows or container-end access points to respectively launch into the container(s) 102 and receive from the container(s) 102 millimeter-wave electromagnetic radiation that courses through the container(s) 102.

Circuitry 108 coupled to the antennas (104, 106) provides a closed loop that can sweep the frequency of millimeter-wavelength electromagnetic waves (e.g., between about 20 GHz and about 400 GHz, e.g., between about 70 GHz and about 180 GHz) radiated to the dipolar gas molecules confined in the containers 102. An absorption at the particular frequency of a quantum transition of the dipolar gas molecules can be observed as a decrease in the power transmitted between transmitter and receiver, and specifically, as a dip in transmitted power at a particular frequency (or a set of frequencies) within the swept frequency range. Iteratively locking to the bottom of the dip provides the quantum transition frequency of the molecules of the confined gas, of which the transition frequency can be relatively stable with respect to the age of the hermetic container, the temperature, and other environmental factors. The stability permits detector 100 to be used for creating accurate quantum references and clocks, the accuracy of which is not substantially reduced with device age or changes in operating environment. Circuitry 108 can include, for example, a voltage-controlled oscillator (VCO) or a digital controlled oscillator (DCO) to generate millimeter waves at a particular frequency that is adjusted until the frequency matches the reference peak absorption frequency (the frequency location of the transmitted power dip).

Linear dipolar molecules have rotational quantum absorption at regular frequencies. As an example, OCS exhibits a transition approximately every 12.16 GHz. A vapor cell as described herein thus can make use of any of the many available quantum transitions in the millimeter-wave frequency range. Circuitry 108 can further include, for example, a divider to divide down the matched frequency, which can be in the tens or hundreds of gigahertz, to a lower output clock frequency, e.g., about 100 MHz. The use of millimeter waves can eliminate (or reduce) the need for a laser as a quantum transition interrogation mechanism, reducing cost and complexity of detector 100 over devices requiring lasers. Operation within the aforementioned frequency ranges permits the transmitter and receiver antennas (104, 106) to be of lengths less than, for example, 10 millimeters, 5 millimeters, or 1 millimeter, depending on the quantum transition frequency of the dipolar gas selected. The container 102 (or each container used in an assembly of containers) can each measure between, for example, about 1 centimeter and about 20 centimeters in length, or about 2 centimeters and about 10 centimeters in length. The container 102 (or each container used in an assembly of containers) can each measure less than about 1 centimeter in dimensions of width and height. In a case where the container 102 is shaped as a circular, elliptical, or rectangular cross-section tube, it can also have a diameter of less than about 1 centimeter. Because quantum absorption increases with container length, with longer container lengths providing for a better-defined observed quantum transition, the length of the container 102 can be limited by fabrication limitations and system package size limitations. Meandering or serpentine-shaped vapor cells can provide longer effective container length within a more compact system package size either by using a bent (e.g., U-shaped) container or by coupling together multiple containers.

Figure 2:
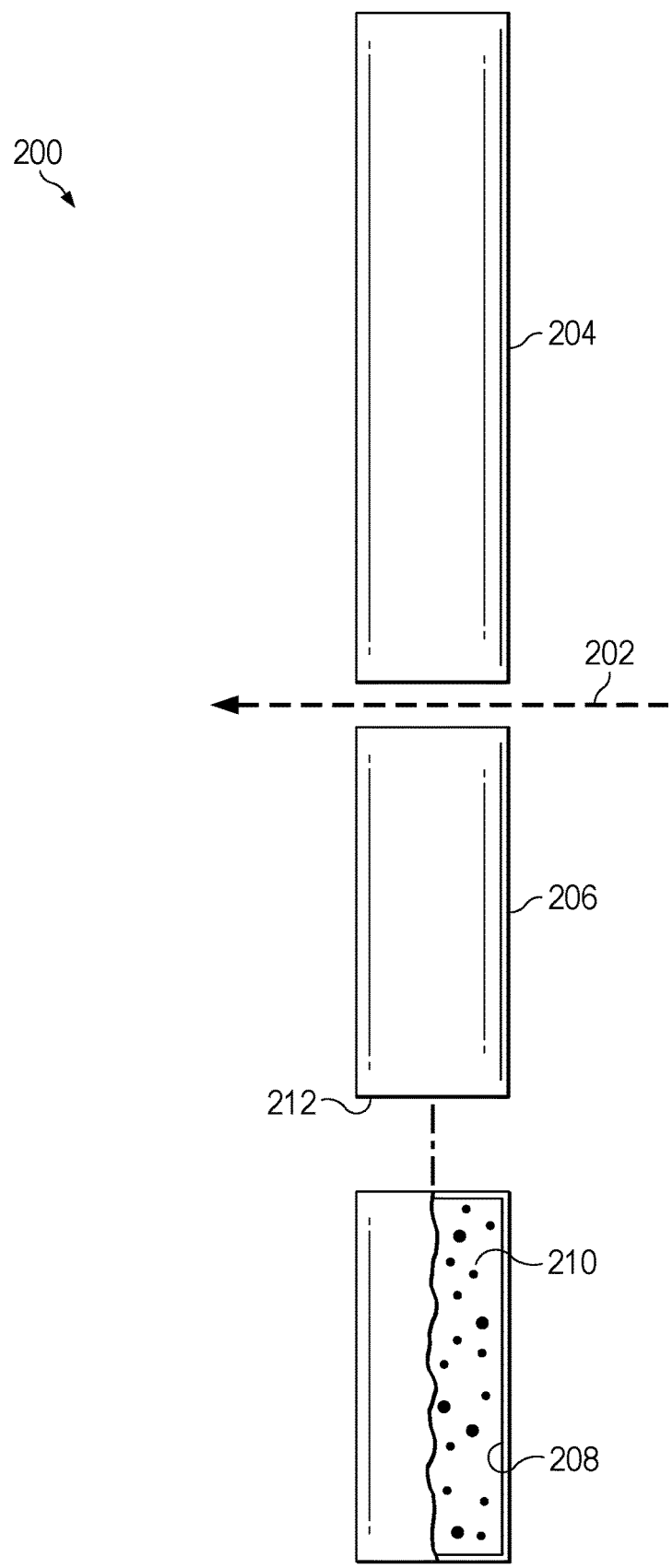
FIG. 2 is a diagram of an example laser cutting and sealing process for sealing gas-filled glass vials.

FIG. 2 is an illustration of an example laser cutting and sealing process 200 for sealing gas-filled glass vials, as may be used in detector 100 of FIG. 1. Prior to the cutting and sealing process 200 illustrated in FIG. 2, a glass (e.g., borosilicate) tube can be fabricated using, as examples, an extrusion process, a Danner process, a Vello process, a down-draw, or any suitable process. The tube may then be filled with a dipolar gas at low pressure to a purity. To achieve a desired gas purity, a successive vacuum approach can be used to purge air from inside the tube and to eliminate molecules coating the walls of the tube by chemisorption or physisorption. A baking process can also be used prior to cutting and sealing process 200 to eliminate molecules that are absorbed to the internal surface of the tube. Process 200 achieves hermeticity by completely sealing each gas-containing glass vial as it is cut from the tube, and preserves gas purity in part by using a laser cutting process that ensures only local heating, so as to avoid denaturing the contained gas.

In the illustrated example 200, a directed laser beam 202 cuts and seals a continuous glass (e.g., borosilicate) tube, which can have been manufactured, e.g., by extrusion, into smaller hermetically sealed glass vials each filled with gas at low pressure. The vials can be circular in cross-section, as illustrated in FIG. 2, or, or in other examples, can be square, rectangular, rounded rectangular, oval, ellipsoid, or other shapes in cross-section. Laser beam 202 is illustrated as separating vial 206 from tube portion 204. Previously in process 200, the laser beam 202 separated vial 208 from a glass tube that included tube portion 204 as well as then not-yet-sealed-and-separated vial 206. Subsequently in process 200, the laser beam 202 can separate tube portion 204 into additional separate sealed dipolar gas containing glass vials (not shown). Vial 208 is shown in cut-away in FIG. 2 to show trapped gas molecules 210 inside vial 208. Vial 208 can, for example, be cut from the tube that included tube portion 204 and vial 206 at a thinned portion 212 of the tube. Alternatively, vials can be sealed and cut by locally heating and softening the tube (e.g., using a laser) and then pinching the softened portion of the tube using a mechanical clamp. The same clamp may also cut the vial, or the vial can be cut using a separate tool.

Vials cut from the tube in process 200, e.g., vials 208 and 206, can undergo further manufacturing steps, such as exterior metallic coating, and photolithographic etching or laser ablating into the coating of launch and receive windows. In some examples, no metallization of the vials is performed, but instead, each vial is, in a subsequent part of the manufacturing process, placed into an enclosure that is either made of an electromagnetically reflective material (e.g., metal) or is interiorly coated with an electromagnetically reflective material (e.g., metallized) such that when a vial is seated in the enclosure, metal adjoins (e.g., is substantially in contact with) the outside of the glass walls of the vial.

Because the interior of the tube from which each vial is cut is filled with dipolar gas at low pressure, once the glass of the tube melts from the laser energy, the outside pressure compresses and sinks the tube at the point of cutting, which heals sealed subsequent to the removal of the laser beam 202. The laser beam 202 may heat the glass to temperatures of more than 650° C. in the cutting process, which temperatures may be enough to decompose the contained dipolar gas. Such decomposition can be a non-reversible process that can cause loss of the ability to obtain a quantum absorption at the expected frequency. However, the heating is local, and does not propagate more than a few millimeters during the short time that laser energy is applied. Because the contained gas is low-pressure, it is not very thermally conductive. Only a small amount of the gas in the vicinity of the laser cutting can be denatured by the heating incurred by the laser cutting and sealing process. Each vial cut and sealed during the process may be a centimeter long or more, so the majority of the gas inside each vial maintains its chemical integrity during the cutting and sealing process. The thermal insulation of the glass, as well as that of the low-pressure gas itself, protects the bulk of the gas from thermal denaturing.

Figure 3:
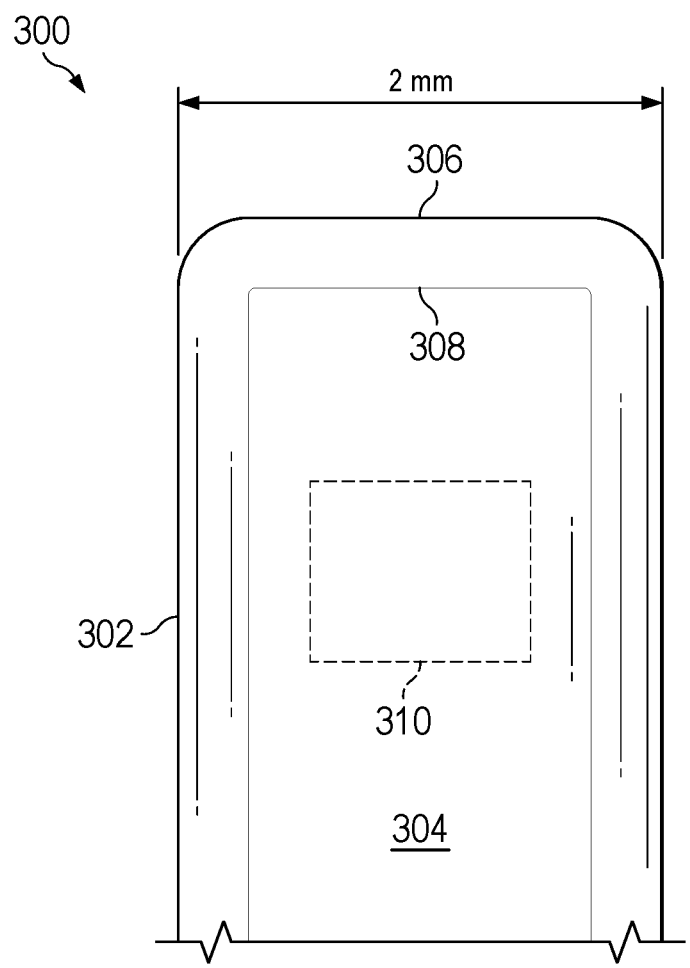
FIG. 3 is a cross-sectional top-down view of one end of an example vial.

FIG. 3 is a view 300 of one end of an example 2 mm wide vial 302 after having been cut and sealed using a laser cutting and sealing method to confine a dipolar gas at the interior 304 of the vial 302. In this example, the illustrated end of vial 302 is blunt or flat and has an outer surface 306 and an inner surface 308. In the example shown in FIG. 3, the outer surface 306 and the inner surface 308 are flat. In some other examples, the outer surface 306 may be concave, and the inner surface 308 may be convex. The illustrated end of vial 302 also has or is proximate to a window region 310, which representatively shows an electromagnetically translucent or substantially transparent access point that may be used to respectively launch into the vial 302 or receive from the vial 302. As explained with reference to FIGS. 1 and 2, in some examples, the window region 310 may correspond to an opening within an exterior metallic coating applied directly on the vial 302. In some examples, the window region 310 may correspond to an opening within an electromagnetically reflective material (e.g., metallized) coating applied to the inner surfaces of an enclosure into which vial 302 is placed, such that when vial 302 is seated in the enclosure, metal adjoins (e.g., is substantially in contact with) the outside of the glass walls of the vial 302 and window region 310 is proximate to the illustrate end of vial 302.

Figure 4:
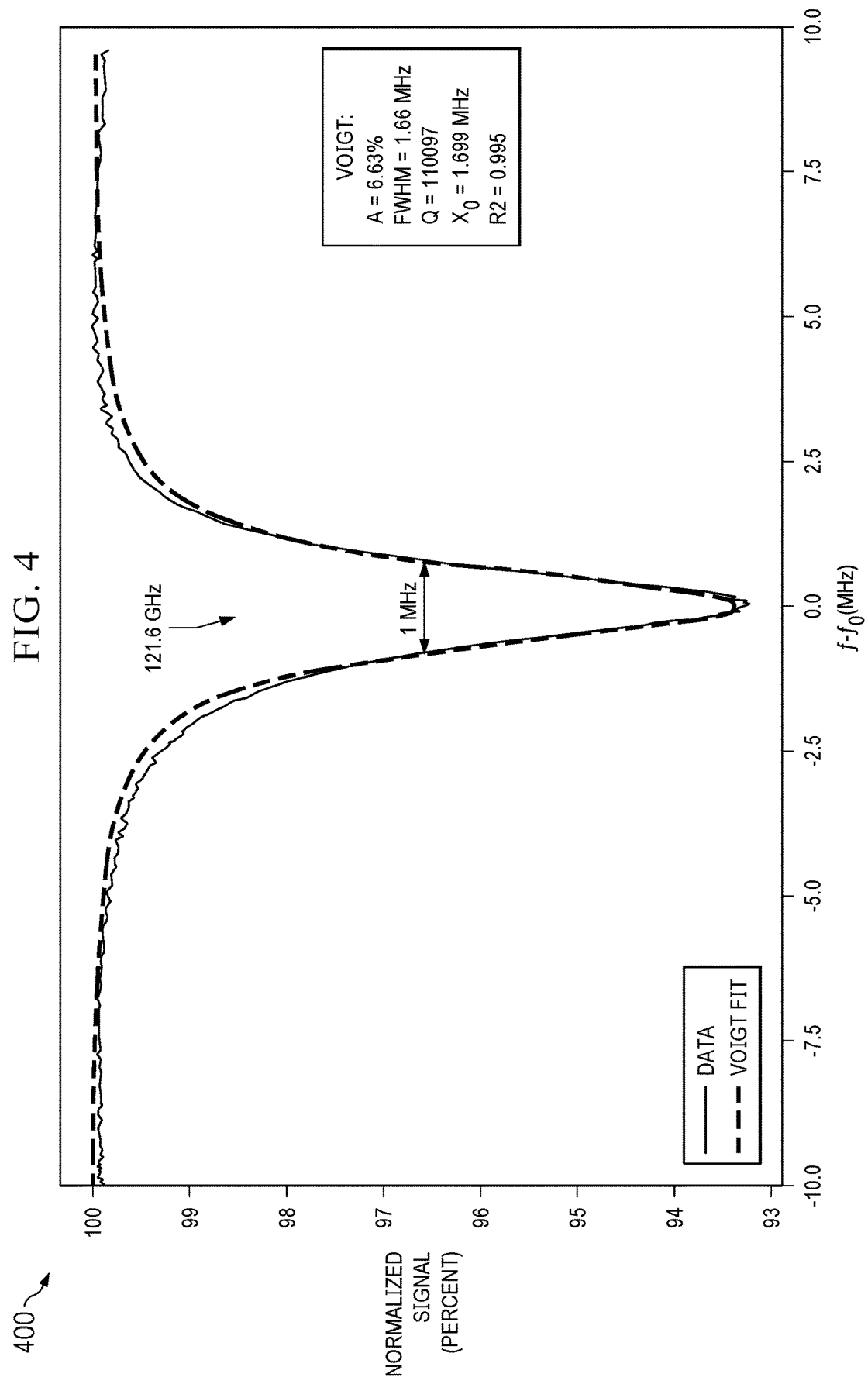
FIG. 4 is a scattering parameter (S-parameter) graph that illustrates example variation of transmitted EM signal power with respect to frequency in the example quantum transition frequency detector of FIG. 1.

FIG. 4 is a graph 400 that illustrates example variation of transmitted EM signal power with respect to frequency in quantum transition frequency detector 100. As described above with reference to FIG. 1, a millimeter-wavelength EM signal is transmitted by TX antenna 104 into dipolar gas-filled container 102, and the EM signal propagates through container 102 and reaches RX antenna 106. As the frequency of the EM signal is swept, at the particular frequency of a quantum transition of the dipolar gas molecules can be observed as a decrease in the power transmitted between transmitter and receiver, and specifically, as a dip in transmitted power at a particular frequency (or a set of frequencies) within the swept frequency range. Referring to graph 400, a dip in transmitted power from 100% to 94% can be observed at 121.6 GHz, which can be the quantum transition frequency. The bandwidth of the dip is about 1 MHz.

To improve the accuracy of the quantum transition frequency determination, it is advantageous to increase the absorption of the EM signal (and the dip) by the dipolar gas and reduces the transmitted power at the quantum transition frequency. Such arrangements can reduce the likelihood of mistaking dips caused by noise as dips caused by absorption of the EM signal, and increase the signal-to-noise (SNR) ratio.

One way to increase the absorption of the EM signal by the dipolar gas at the quantum transition frequency is by increasing the EM signal propagation distance within container 102 between TX antenna 104 and RX antenna 106. In a case where container 102 includes a straight sealed tube such as shown in FIG. 2, the length of the sealed tube can be increased to increase the signal propagation distance. But the target dimensions of quantum transition frequency detector 100 (or the target dimensions of the system that includes quantum transition frequency detector 100) may impose a limit on the maximum length of the sealed tube. Conversely, fitting a long sealed tube as container 102 into quantum transition frequency detector 100 may also lead to unreasonable/unsatisfactory aspect ratio of detector 100 (or the system that includes detector 100). The tube may be bent to fit into a particular area/aspect ratio, but the process of bending the tube may collapse the interior of the tube at the bent location(s) and compromise the structural integrity of the tube.

As to be described in the following examples, a dipolar gas can include multiple straight sealed vials that are mechanically coupled together by signal couplers. The signal coupler can include a dielectric material, or the same material as the vial (e.g., plastic, epoxy, glass, etc.). The signal coupler can also be filled with a solid material (e.g., dielectric material, or same material as the vial), or can be filled with a gas (e.g., air). The signal coupler can operate as a waveguide, in which the EM signal can propagate between two sealed glass vials via the dielectric signal coupler. With such arrangements, the straight sealed glass vials and the dielectric signal couplers can fit into a particular area/aspect ratio while providing elongated transmission path for the EM signal.

Figure 5A:
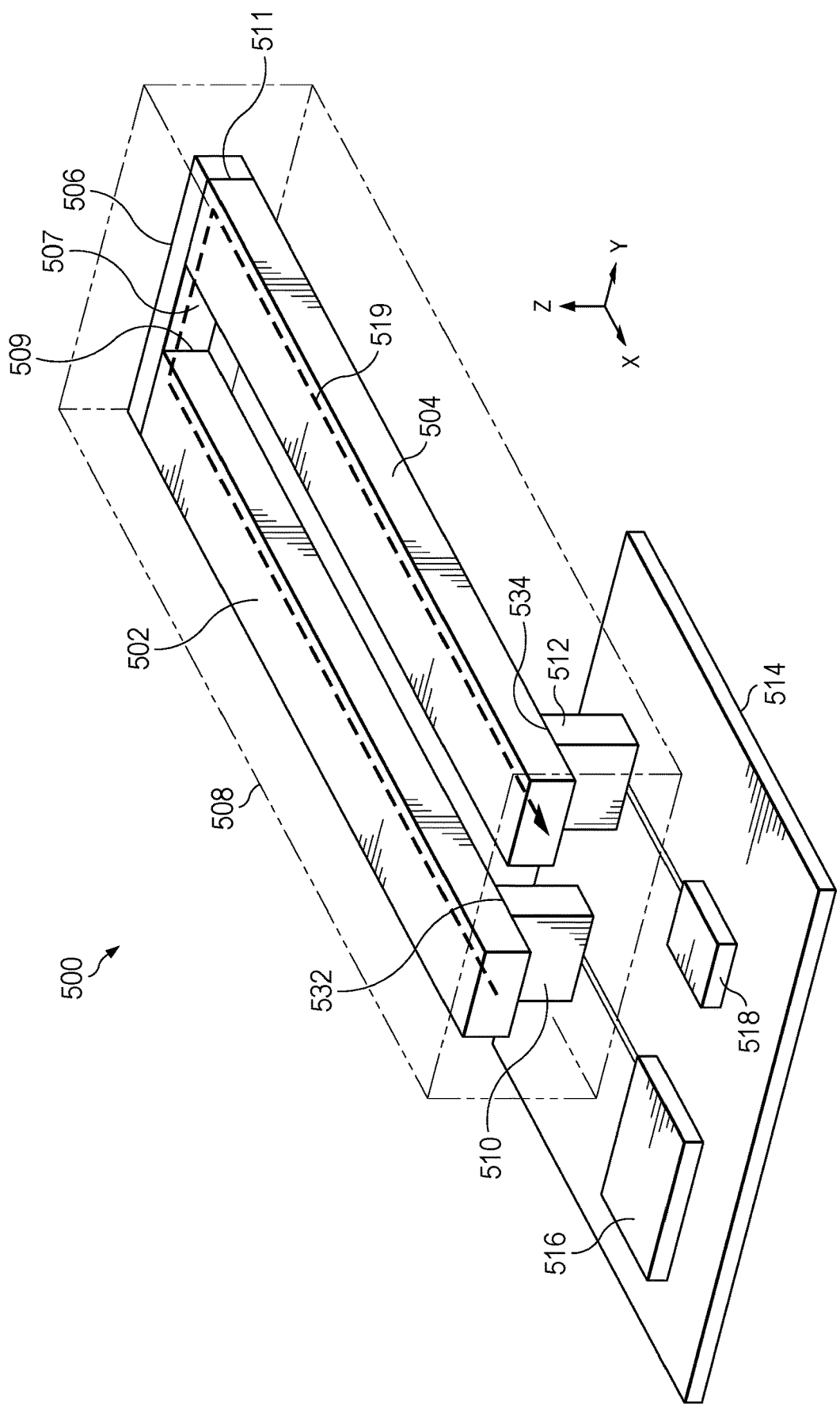
Figure 5B:
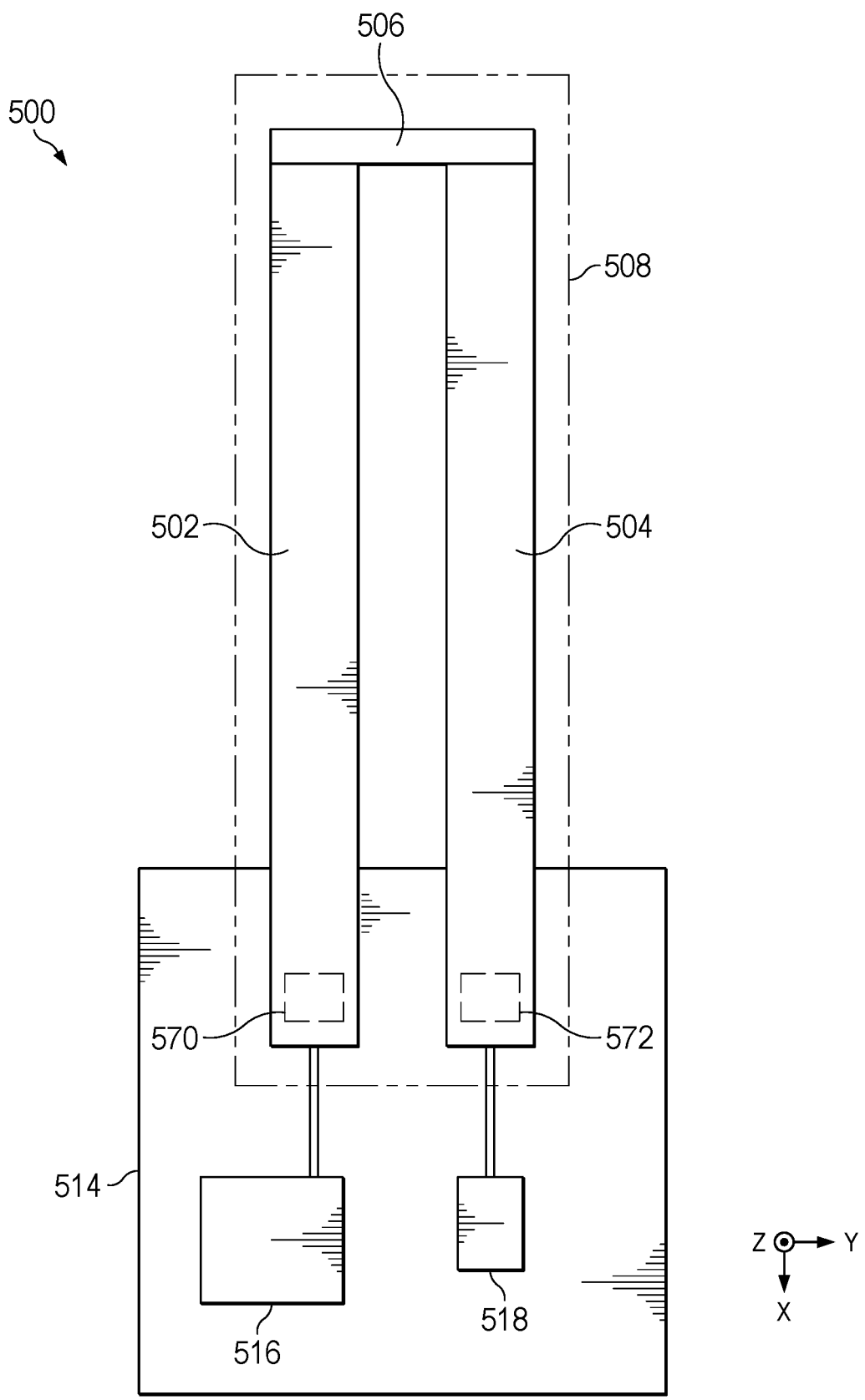
Figure 5C:
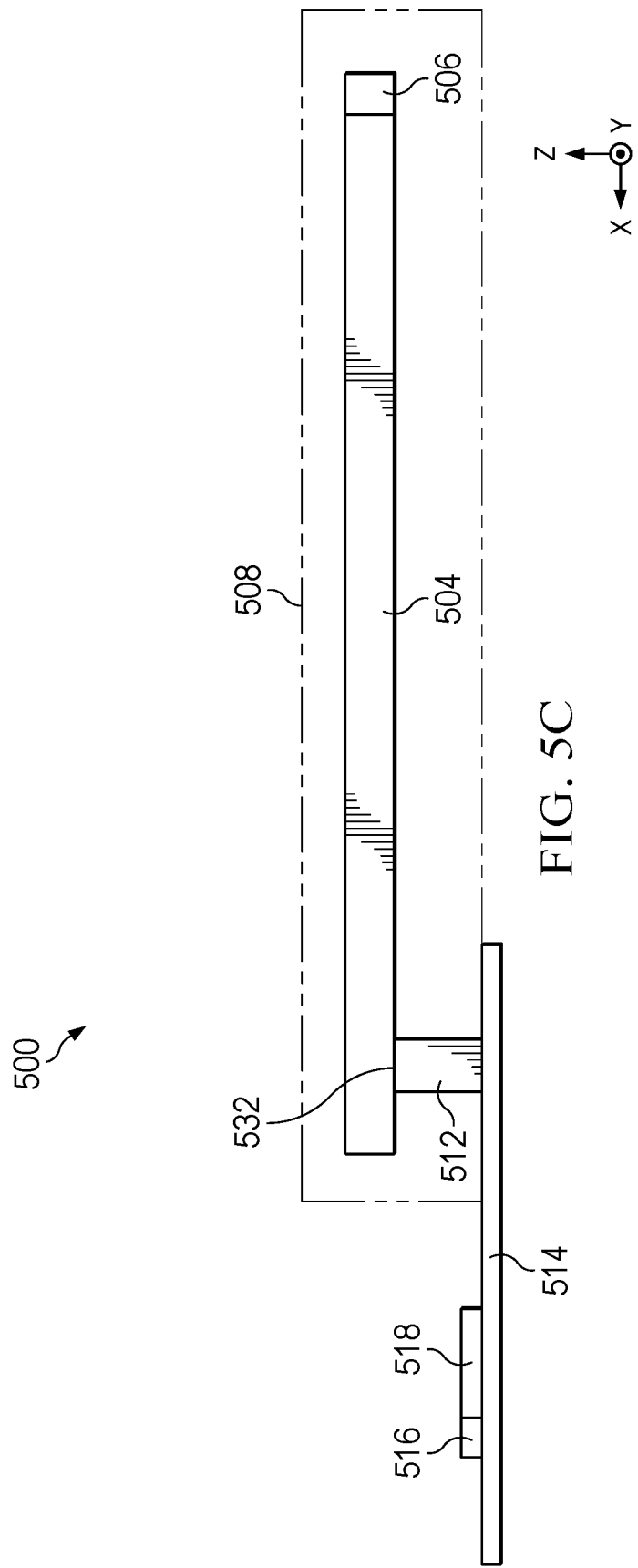

FIGS. 5A through 5G show various perspective views of respective portions of an example quantum transition frequency detector 500, similar in material respects to detector 100 of FIG. 1. For example, FIG. 5A is an oblique parallel projection view of detector 500 and FIGS. 5B and 5C are top views and side views, respectively, of detector 500.

Detector 500 incorporates at least two dipolar gas-confining containers 502, 504 communicatively coupled together via a signal coupler 506, all of which are enclosed within a container enclosure 508. In some examples, signal coupler 506 is in physical contact with containers 502, 504. In some examples, signal coupler 506 can be separated from containers 502, 504 by air gaps. Container enclosure 508 is mechanically coupled to a substrate, such as a printed circuit board (PCB) 514, or other package substrate having circuitry disposed thereon, including transmit circuitry 516 and receive circuitry 518. For example, container enclosure 508 can be mounted to PCB 514 by pin or screw (or other securing device) or can be glued thereon.

Gas-confining containers 502, 504 may each be similar in material respects to container 102 of FIG. 1, vials 206, 208 of FIG. 2, or vial 302 of FIG. 3. In this example, containers 502, 504 are parallel to each other and extend, together with signal coupler 506, on the same plane (e.g., x-y plane) within container enclosure 508. Signal coupler 506 has a surface 507 facing and proximate end surfaces 509 and 511 of, respectively, containers 502 and 504, in a U-shaped configuration. Signal coupler 506 can include a solid material or a hollow sealed tube. Signal coupler 506 can be made of a dielectric material (e.g., plastic, epoxy, air, a combination thereof, etc.), a glass material, etc., and can be made of a same or a different material from containers 502 and 504. An EM signal can propagate from transmit circuitry 516 through container 502, end surface 509, surface 507, signal coupler 506, surface 507, end surface 511, container 504, and reach receive circuitry 518, as indicated by dotted line 519.

Figure 5E:
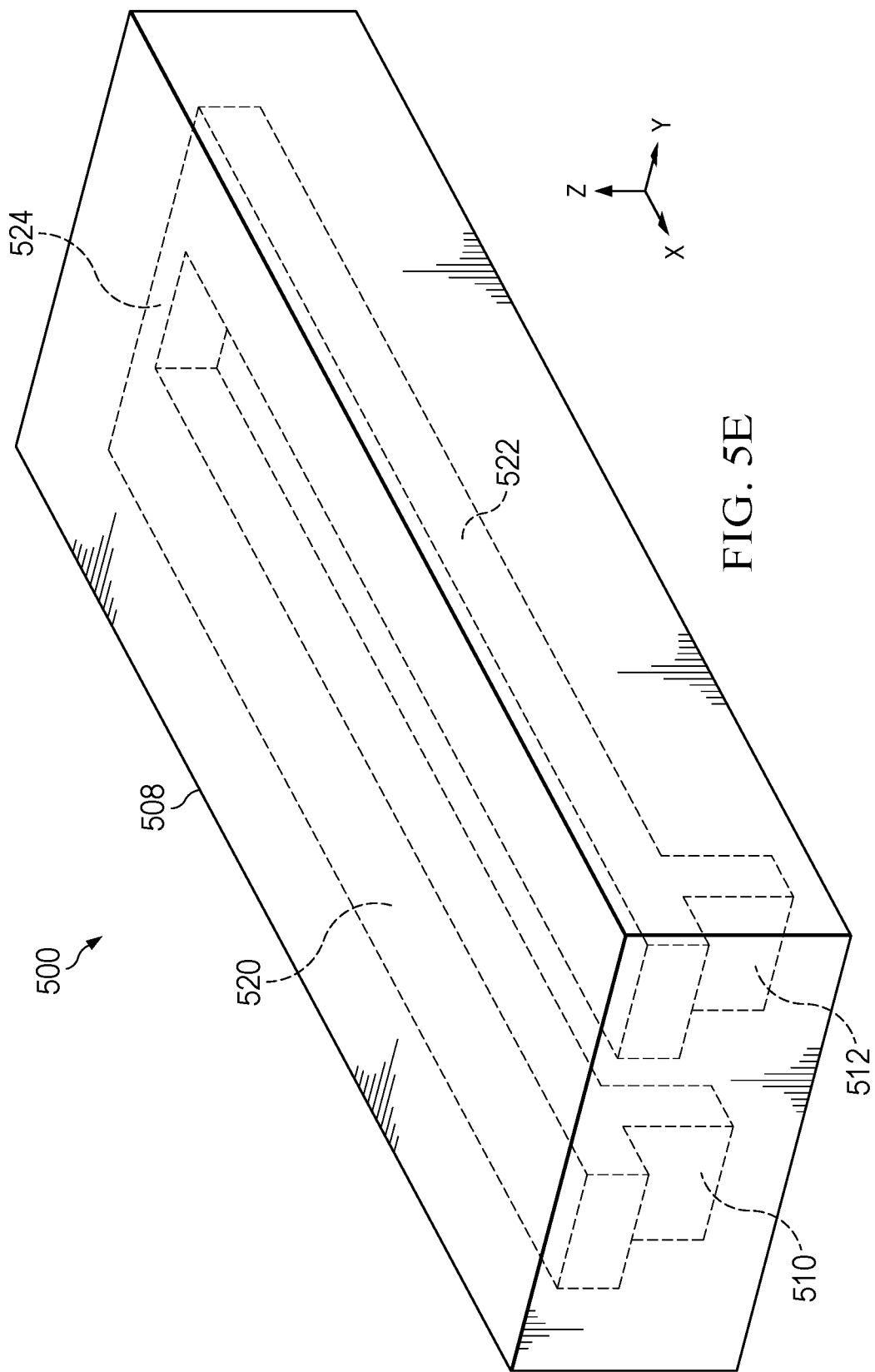
Figure 5F:
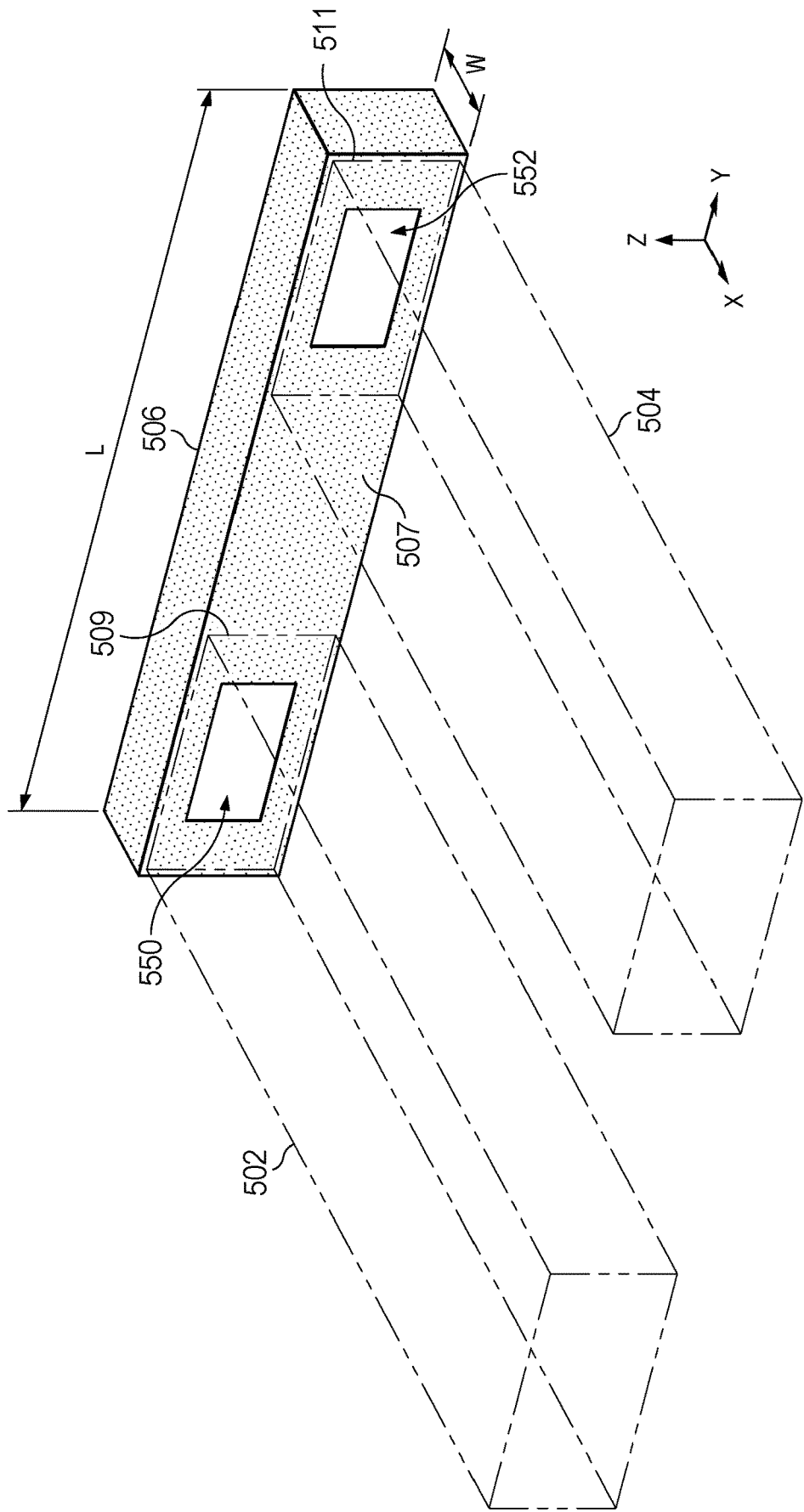
Figure 5G:
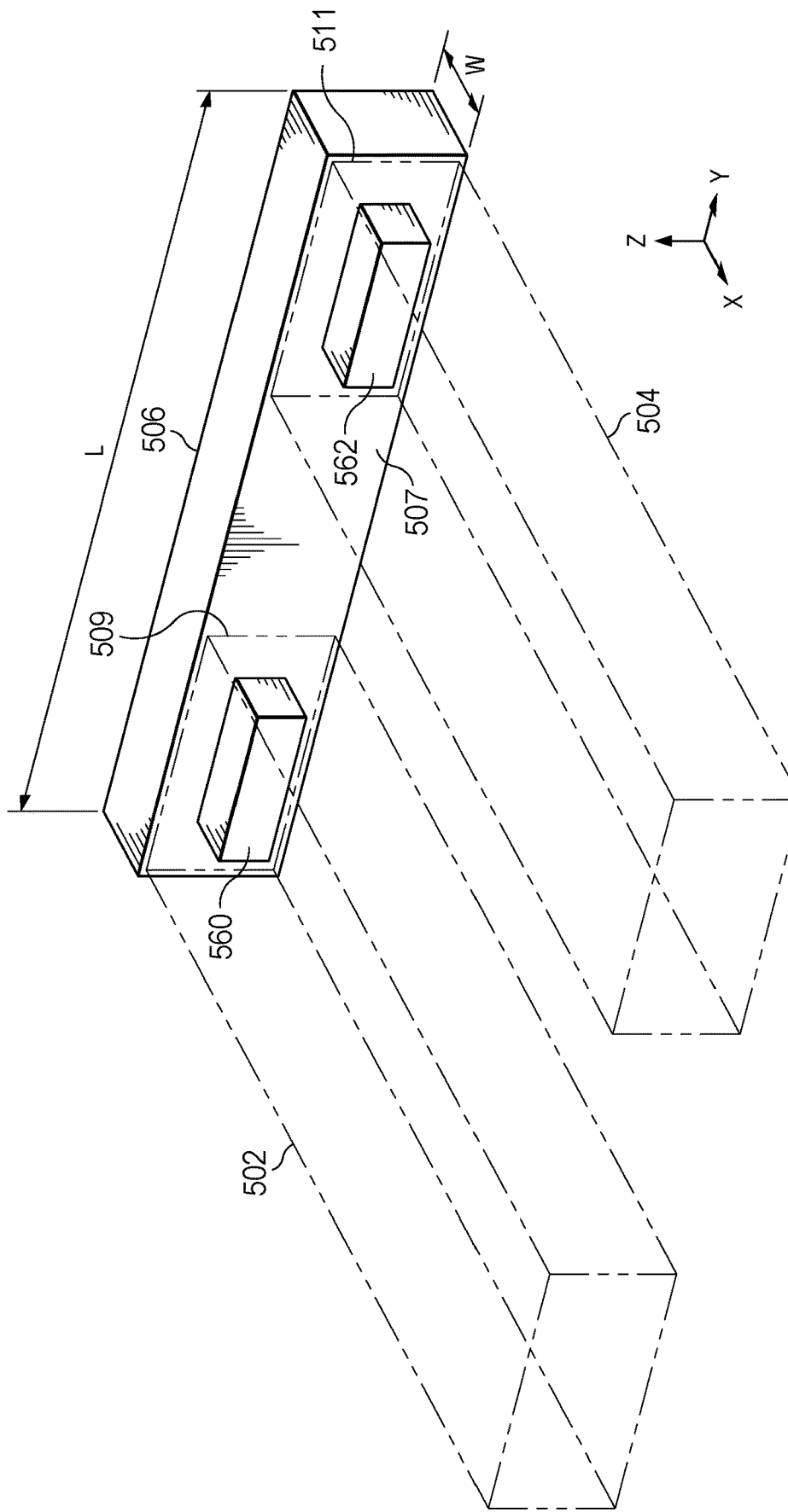

FIG. 5F and FIG. 5G illustrate alternative examples of signal coupler 506. In the example shown in FIG. 5F, the outer surfaces of signal coupler 506, together with the outer surfaces of containers 502 and 504, can be coated with an electromagnetically reflective material (e.g., metallized), which is represented in dotted shade in FIG. 5F, to confine the EM signal within containers 502, 504, and signal coupler 506. Signal coupler 506 can include openings 550 and 552 on surface 507. Opening 550 interfaces with (and may or may not be in physical contact with) end surface 509 of container 502, and opening 552 interfaces with end surface 511 of container 504. Openings 550 and 552, together with end surfaces 509 and 511, can be uncoated, or otherwise coated with an electromagnetically translucent or substantially transparent material, to allow EM signal to propagate through opening 550 and end surface 509 and through opening 552 and end surface 511.

FIG. 5G illustrates another example of signal coupler 506. In the example shown FIG. 5G, the outer surfaces of signal coupler 506, containers 502, and 504 may be uncoated, or otherwise coated with an electromagnetically translucent or substantially transparent material. Signal coupler 506 may include protrusion structures 560 and 562 to engage with, respectively, surfaces 509 and 511 of the respective containers 502 and 504, and to function as waveguides. Coupler 506, together with containers 502 and 504, can be enclosed within container enclosure 508 that has internal surfaces coated with electromagnetically reflective material (e.g., metallized).

The width of signal coupler 506 (labelled "w") is selected to allow the EM signal to propagate from along the width to along the length (labelled "l") after entering through opening 550, and to propagate from along the length to along the width to exit through opening 552. The dimensions of signal coupler 506 (e.g., length, width, and height) may depend on the dielectric constant(s) of the material(s) of signal coupler 506 (which may include a sealed container including a gas such as air). The dimensions and the dielectric constant(s) of signal coupler 506 may define the impedance of signal coupler 506. In some examples, signal coupler 506 may be configured (based on selection of dimensions and/or material) to have an impedance that matches with the containers 502 and 504 (and the impedance of container enclosure 508 if there is air gap between the container and signal coupler) to minimize reflection of the EM signal as the signal propagate from container 502 to coupler 506 and from coupler 506 to container 504. The length and width can be selected to enable a specific propagating mode in signal coupler 506. In some examples, the dimensions of coupler 506 can be determined using a 3D electromagnetic simulation tool.

In some examples, signal coupler 506 may be integrally formed as part of container enclosure 508. In some examples, container enclosure 508 may have a cavity configured to receive signal coupler 506, in which an interior surface of the cavity or an exterior surface of signal coupler 506 is at least partially coated with the electromagnetically reflective material. In some examples, signal coupler 506 is coupled between containers 502, 504.

FIG. 5D is an angled view of a portion of PCB 514. A transmitter (TX) antenna 515 is electrically coupled to transmitter circuitry 516 and a receiver (RX) antenna 517 is electrically coupled to receiver circuitry 518. Antennas 515, 517 may be similar in material respects to antennas 104, 106, respectively, of FIG. 1. Circuitry 516, 518 may be included within circuitry 108 of FIG. 1.

In some examples, antennas 515, 517 can include flat metal layers that are on a single plane, which plane can be the plane of PCB on which circuitry 516, 518 is mounted, such that antennas 515, 516 can be printed on PCB 514 and electrically coupled to respective circuitry 516, 517 via wiring printed on PCB 514. The millimeter electromagnetic waves used to interrogate the dipolar gas contained in containers 502, 504 can be launched directly from the PCB 514 to which container enclosure 508 is coupled. Circuitry 516, 518 can be encapsulated over the PCB 514 with a molded enclosure. In some examples, PCB 514 can measure about 5 mm by 5 mm in length and width. However, PCB 514 can have any suitable dimensions.

In some examples, PCB 514 can be electrically and mechanically coupled to a larger system board (not explicitly shown). For example, a larger system board can be a motherboard of a computer system or main system board of a mobile device, such as a smartphone. PCB 514 can be electrically and mechanically coupled to a larger system board by bump bonds, for example, through which output signals can be provided from the quantum transition frequency detector 500 to the larger system board, and/or input signals can be provided to the quantum transition frequency detector system 500 from the larger system board.

Container enclosure 508 also has cavities forming (or accommodating) multiple signal couplers 510, 512. Signal coupler 510 is coupled between surface 532 of container 502 and antenna 515, and signal coupler 512 is coupled between surface 534 of container 504 and antenna 517. Surfaces 532 and 534 can be parallel with the axis of extension of containers 502 and 504 (e.g., the x-y plane) and PCB 514. Signal couplers 510, 512 can support vertical launch, where EM signal travel vertically (e.g., along the z-axis) between antenna 515 and container 502 and between antenna 517 and container 504. In some examples, signal couplers 510, 512 are each a hollow cavity interiorly coated with an electromagnetically reflective material (e.g., metallized), and with electromagnetically translucent or substantially transparent window regions (e.g., window 310) located at the top and bottom thereof. In some examples, signal couplers 510, 512 may each incorporate solid dielectric material (e.g., plastic) that is enclosed within electromagnetically reflective material (e.g., metallized), with electromagnetically translucent or substantially transparent window regions (e.g., window 310) located at the top and bottom thereof. In some examples, signal couplers 510, 512 can also have same material and solid/hollow configuration as signal coupler 506. Regardless of whether a hollow or solid configuration is used, including a combination thereof, signal couplers 510, 512 can operate as waveguides by guiding the propagation of EM signals therethrough.

The TX and RX antennas 515, 517 are communicatively coupled to signal couplers 510, 512 through respective window regions 570, 572 of containers 502, 504 to respectively launch into and receive from container enclosure 508 the millimeter-wave electromagnetic radiation that courses through the containers 502, 504. More specifically, an EM signal received from transmit circuitry 516 may propagate from TX antenna 515, through signal coupler 510, through container 502, through solid dielectric signal coupler 506, through container 504, and through signal coupler 512 to RX antenna 517, which electrically communicates the received signal to receive circuitry 518.

FIG. 5E is an oblique parallel projection view of container enclosure 508. As shown in FIG. 5E, container enclosure 508 has internal cavities 520, 522, 524 configured to hold in place containers 502, 504 and signal coupler 506, respectively. In some examples, cavities 520, 522, 524 are each interiorly coated with an electromagnetically reflective material (e.g., metallized), and with electromagnetically translucent or substantially transparent window regions over window 570 and 572. The electromagnetically reflective material (e.g., metal) can adjoin (or is substantially in contact with) the outer surfaces of each container and coupler. In some examples, container enclosure 508 is formed by 3D printing, molding, etc. In some examples, container enclosure 508 can be formed in pieces (e.g., in two halves), metallization can be selectively applied to internal cavities 520, 522, 524 in a manner that leaves unmetallized the aforementioned window regions (e.g., windows regions 570, 572), and the internally-metallized pieces can then be sealed together.

Figure 6A:
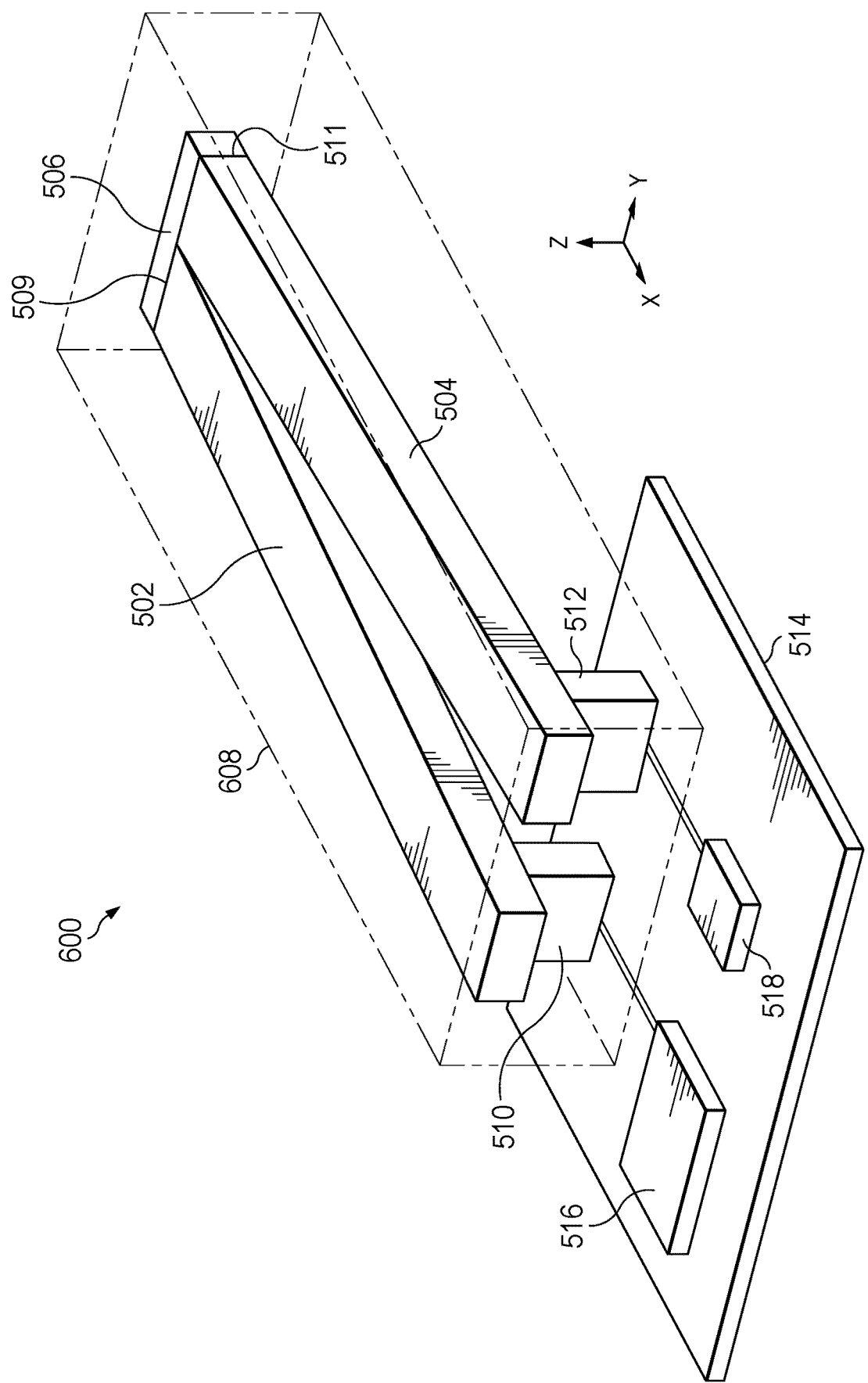
FIGS. 6A, 6B, 6C, and 6D show various perspective views of dipolar-gas-confining containers communicatively coupled by a signal coupler, in which the containers are held angled from each other in a container enclosure.
Figure 6B:
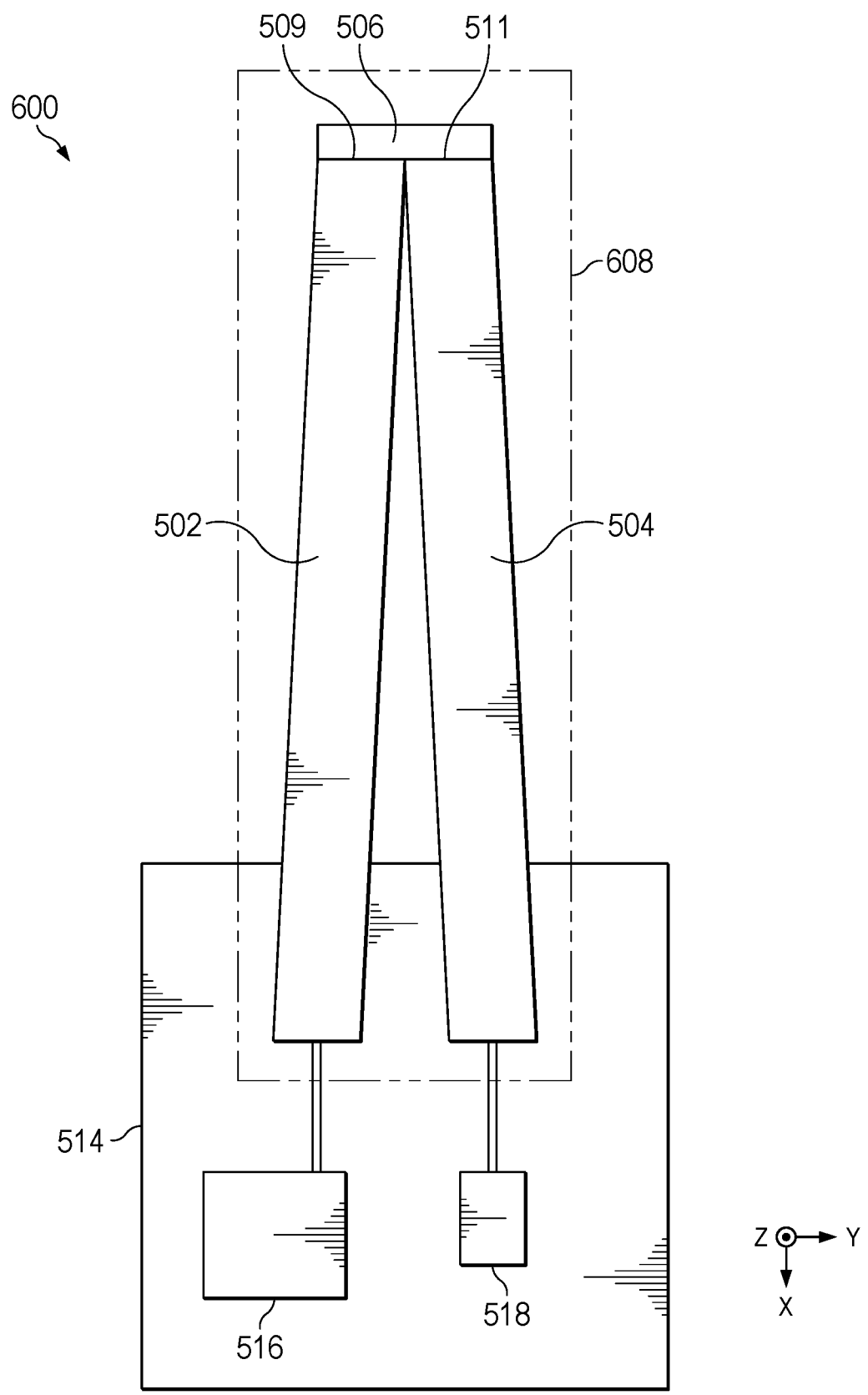
Figure 6C:
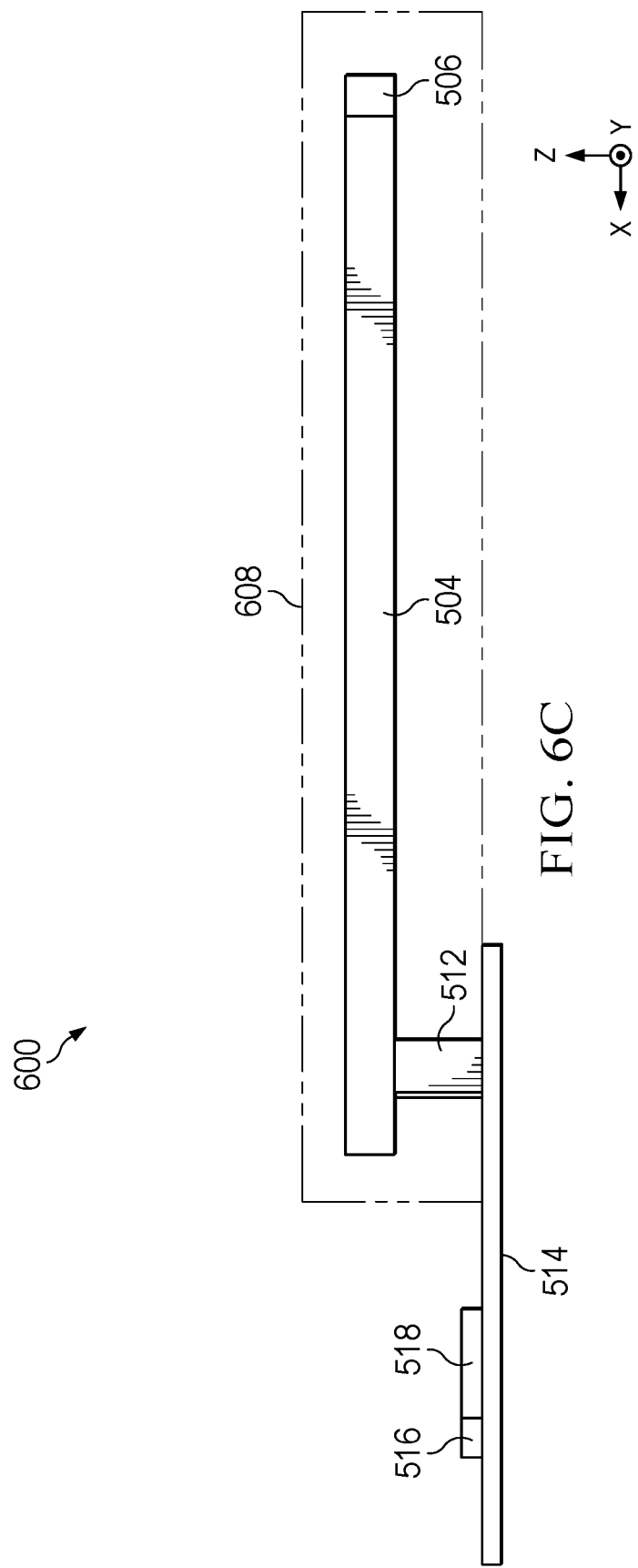

FIGS. 6A through 6DE show various perspective views of respective portions of an example quantum transition frequency detector 600, similar in material respects to detector 100 of FIG. 1. FIG. 6A is an oblique parallel projection view of detector 600 and FIGS. 6B and 6C are top views and side views, respectively of the same.

Detector 600 is similar in certain material respects to detector 500, including that detector 600 incorporates at least two dipolar gas-confining containers 502, 504 communicatively coupled together via signal coupler 506 at ends 509, 511, all of which are enclosed within a container enclosure 608. In detector 600, container 502 is angled from container 504. In this example, containers 502, 504 extend, together with signal coupler 506, on the same plane within container enclosure 608. Each container can be communicatively coupled to an antenna via a signal coupler, such as one of signal couplers 520 or 522.

Figure 6D:
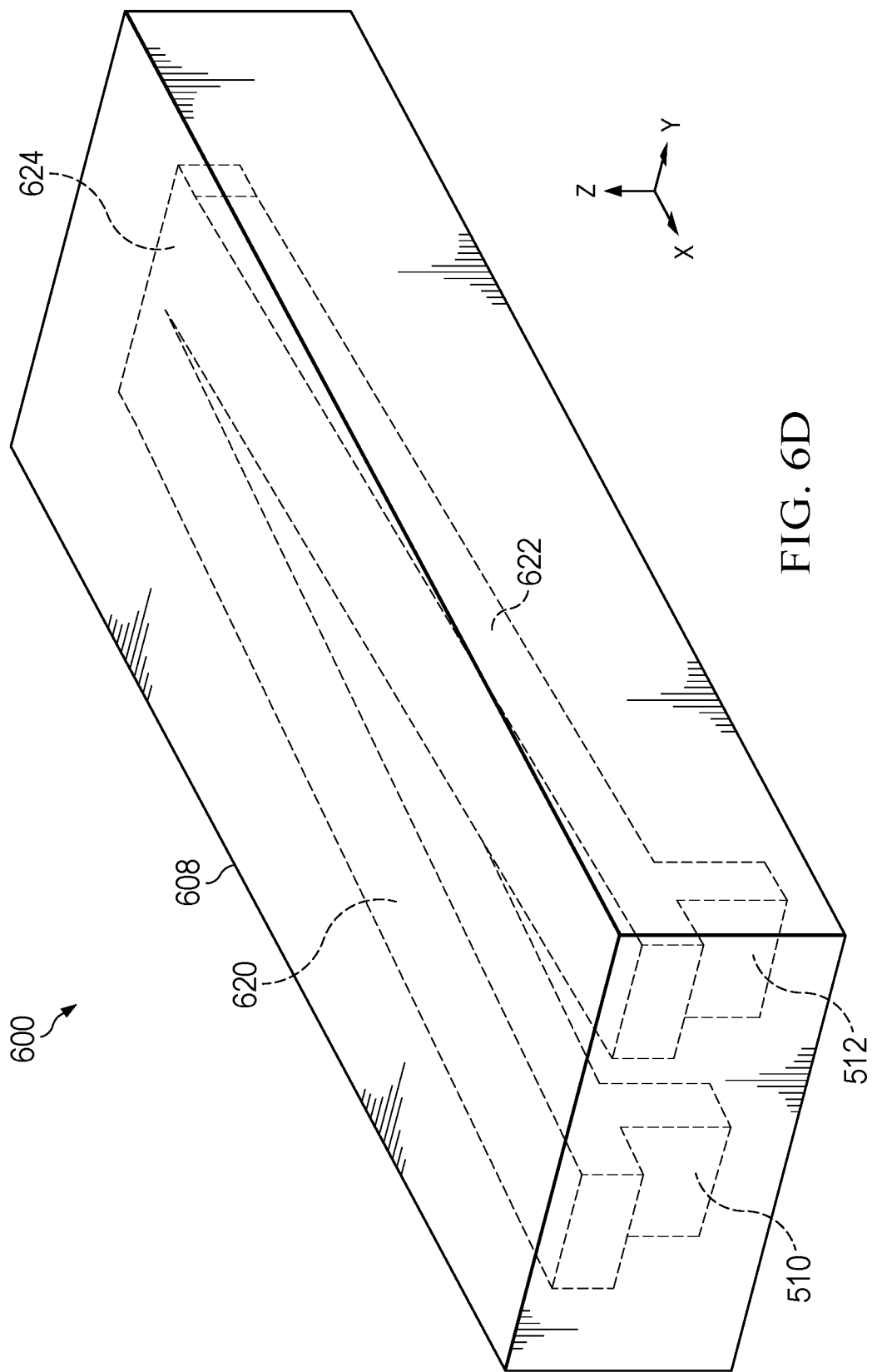

FIG. 6D is an oblique parallel projection view of container enclosure 608, which is similar in certain material respects to container enclosure 508. Container enclosure 608 has internal cavities 620, 622, 624 configured to hold containers 502, 504 and signal coupler 506, such that container 502 is held at an angle from container 504 (e.g., in a V-shape configuration).

Figure 7A:
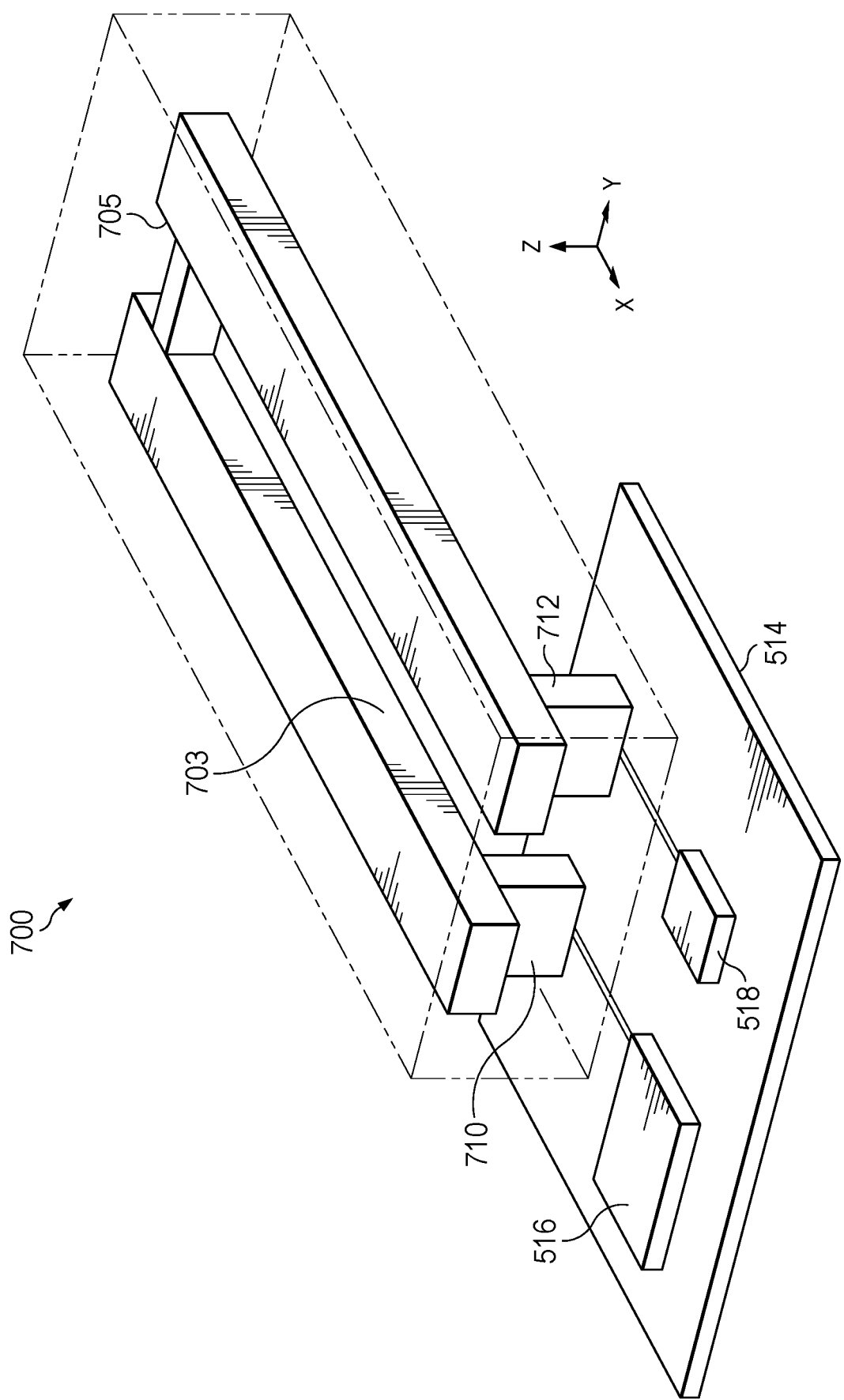
FIGS. 7A, 7B, 7C, 7D, and 7E show various perspective views of other example arrangements of dipolar-gas-confining containers communicatively coupled together by a signal coupler.
Figure 7B:
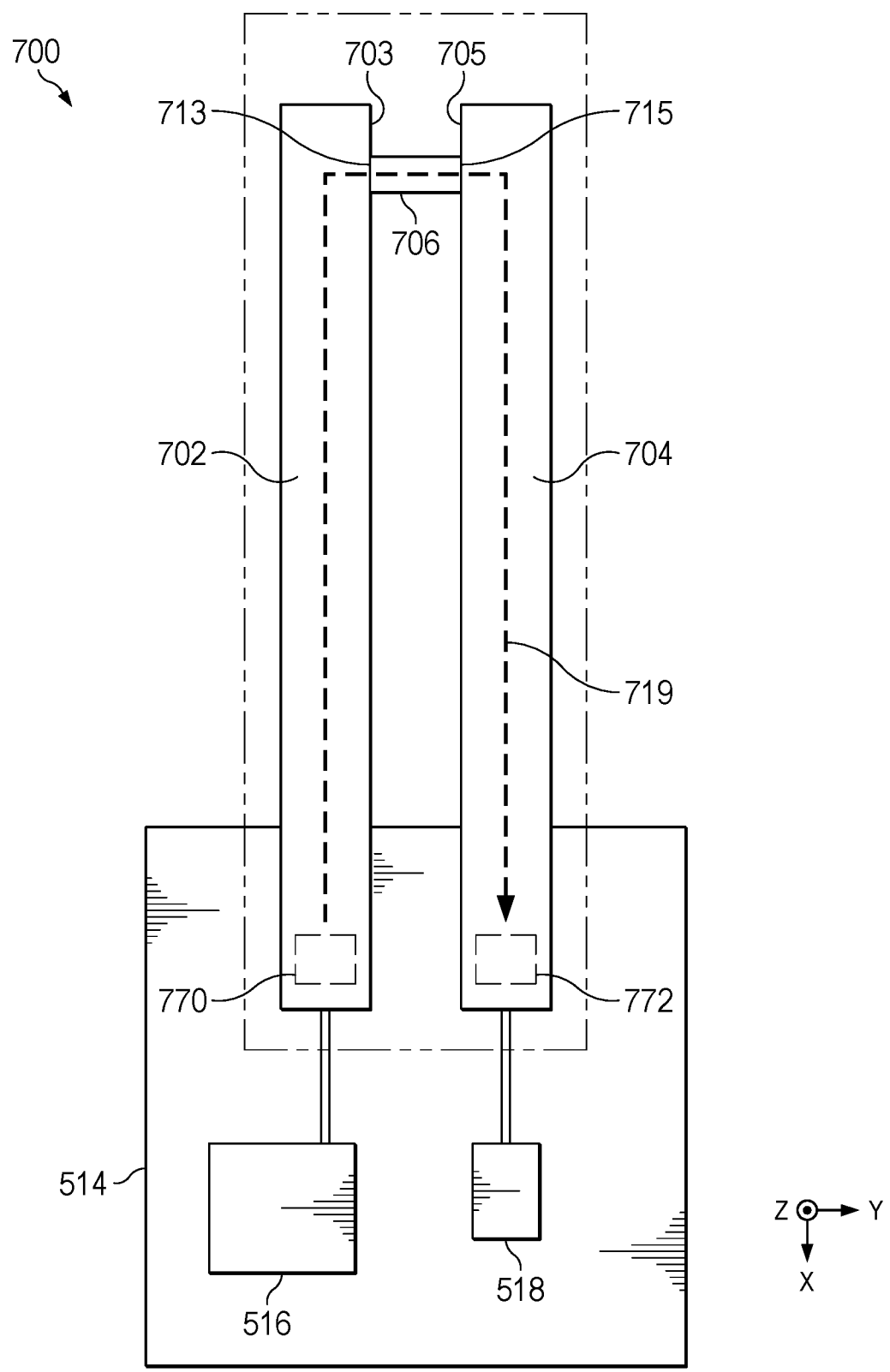
Figure 7C:
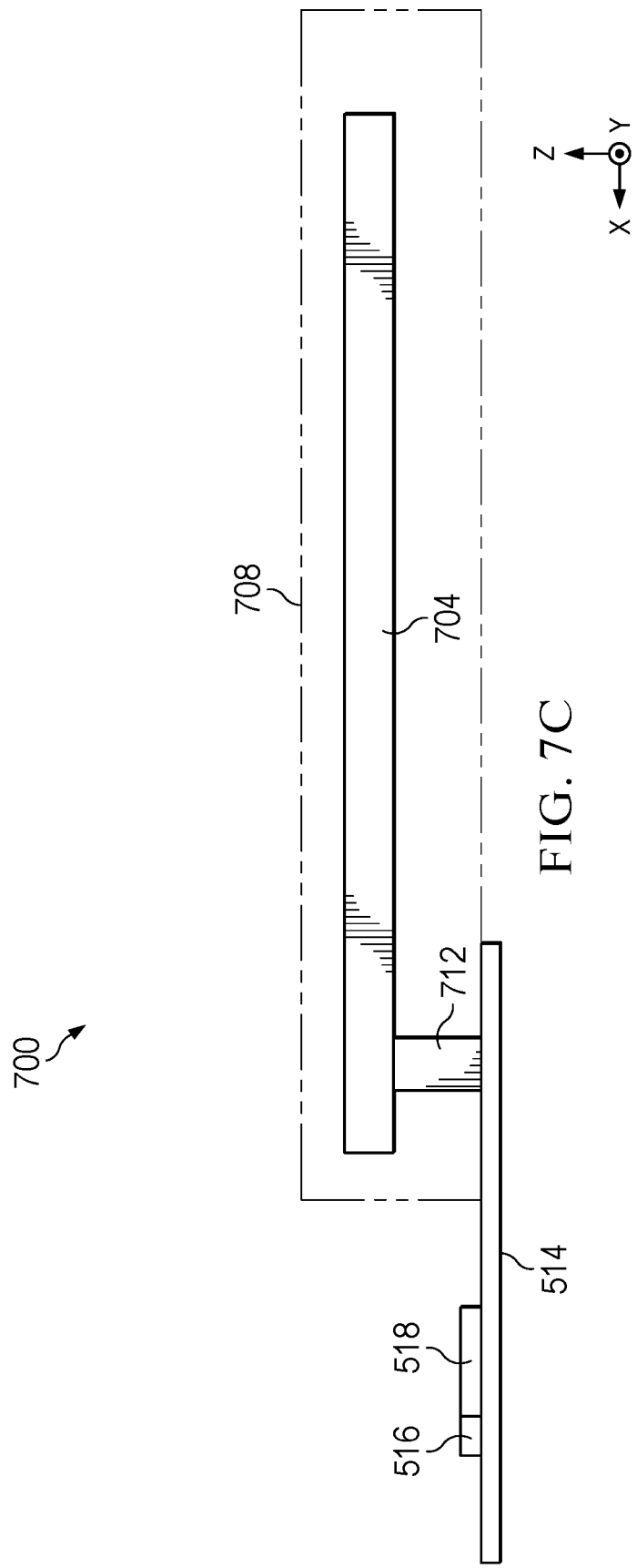

FIGS. 7A through 7E show various perspective views of respective portions of an example quantum transition frequency detector 700, similar in material respects to detector 100 of FIG. 1. FIG. 7A is an oblique parallel projection view of detector 700 and FIGS. 7B and 7C are top views and side views, respectively of the same.

Detector 700 is similar in certain material respects to detector 500, including that detector 700 incorporates at least two dipolar gas-confining containers 702, 704 communicatively coupled together via a signal coupler 706, all of which are enclosed within a container enclosure 708. Signal coupler 706 can include a solid material or a hollow sealed tube. Signal coupler 706 can be made of a dielectric material (e.g., plastic, epoxy, air, a combination thereof, etc.), a glass material, etc., and can be made of a same of a different material from containers 702 and 704. In detector 700, container 702 has a first side surface 703, container 704 has a second side surface 705 facing the first surface, and signal coupler 706 has opposing end surfaces 713 and 715. End surface 713 of signal coupler 704 faces/opposes side surface 703, and end surface 715 of signal coupler 706 faces/opposes side surface 705, so that containers 702, 704, and signal coupler 706 can form an H-shape configuration. Side surface 703 can be in physical contact with end surface 713 or can be separated by an air gap. Side surface 705 can be in physical contact with end surface 715 or can be separated by an air gap.

An EM signal can propagate from transmit circuitry 516 through container 702, side surface 703, end surface 713, signal coupler 706, end surface 715, side surface 705, container 704, and reach receive circuitry 518, as indicated by dotted line 719. The dimensions and the dielectric constant(s) of signal coupler 706 can be configured to minimize the reflection of the EM signal at side surface 703/end surface 713 and at end surface 715 and side surface 705. Opposing first and second side surfaces 703, 705, and opposing end surfaces 713, 715, are perpendicular to the plane of extension of containers 702, 704, and signal coupler 706. For example, containers 702, 704, and signal coupler 706 extend along the x-y plane, and first and second side surfaces 703, 705, and end surfaces 713, 715 are on the x-z plane. In this example, containers 702, 704 are parallel to each other. Each container has a respective window region 770/772 communicatively coupled to an antenna via signal couplers 710/712.

Figure 7D:
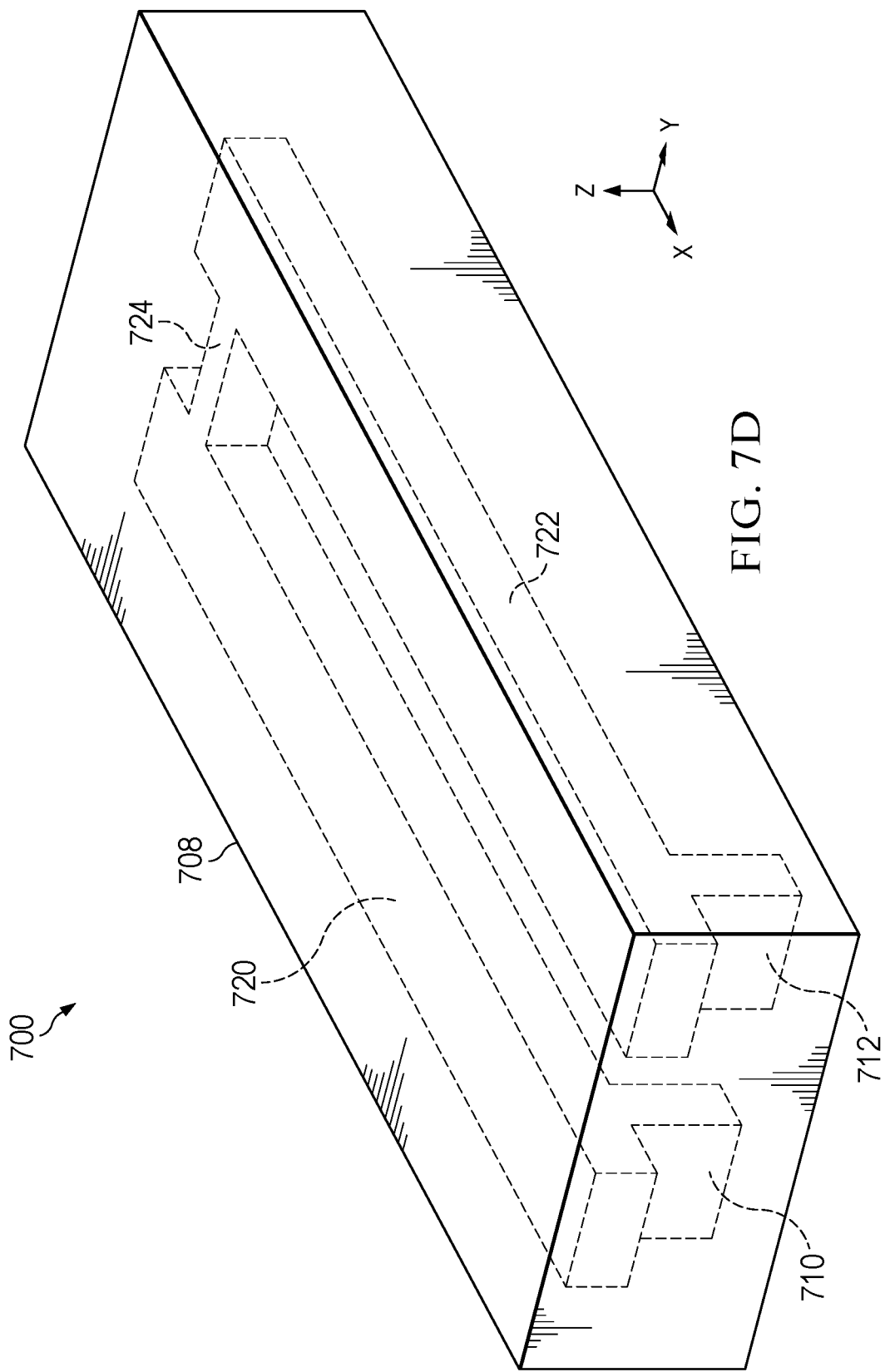

Also, FIG. 7D is an oblique parallel projection view of container enclosure 708, which is similar in certain material respects to container enclosure 708. Container enclosure 708 has internal cavities 720, 722, 724 configured to hold containers 702, 704 and signal coupler 706, such that signal coupler 706 couples together respective opposing surfaces of containers 702, 704 (e.g., in an H-shaped configuration). Container enclosure 708 also has cavities forming (or accommodating) multiple signal couplers 710, 712.

Figure 7E:
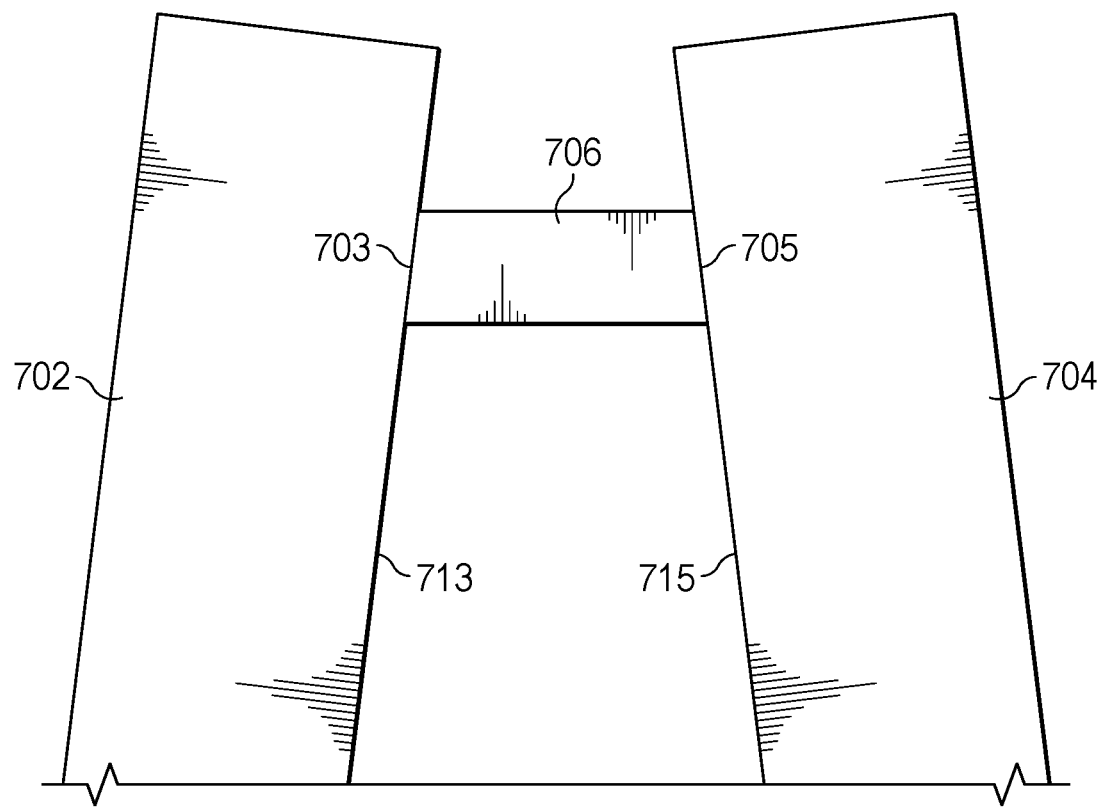

FIG. 7E shows an alternative configuration for the containers 702, 704 used for detector 700, in which container 702 is angled from container 704, while signal coupler 706 is positioned between and couples together respective opposing surfaces of containers 702, 704. In some examples in which container 702 is angled from container 704, signal coupler 706 may have a trapezoidal shape (e.g., as shown in FIG. 7E) to facilitate interfacing with planar opposing surfaces of containers 702, 704.

In some examples, the outer surfaces of signal coupler 706, together with the outer surfaces of containers 702 and 704, can be coated with an electromagnetically reflective material (e.g., metallized). Signal coupler 706 can include openings (similar to openings 550 and 552) on end surfaces 703 and 705. Container 702 can also include an opening on side surface 713 aligned with the opening on end surface 703 of signal coupler 706, and container 704 can include an opening on side surface 715 aligned with the opening on end surface 705 of signal coupler 706. The openings can be uncoated, or otherwise coated with an electromagnetically translucent or substantially transparent material, to allow EM signal to propagate through. In some examples, the outer surfaces of signal coupler 706, together with the outer surfaces of containers 702 and 704, are not coated with an electromagnetically reflective material. The internal surfaces of cavities 720, 722, and 724 of container enclosure 708 can be coated with an electromagnetically reflective material to keep the EM signal within containers 702, 704, and signal coupler 706. The electromagnetically reflective material (e.g., metal) can adjoin (or is substantially in contact with) the outer surfaces of each container and coupler.

Figure 8A:
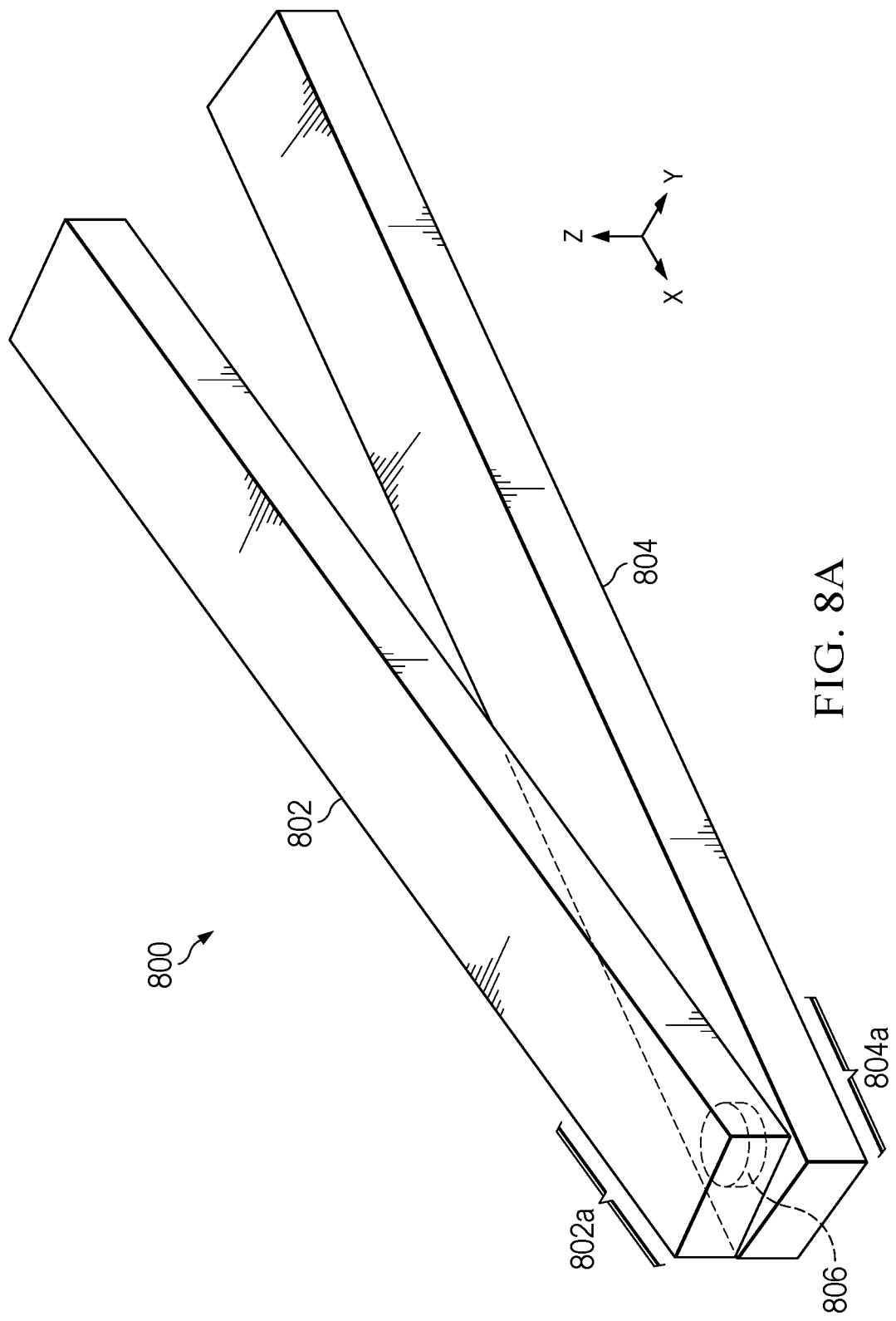
Figure 8B:
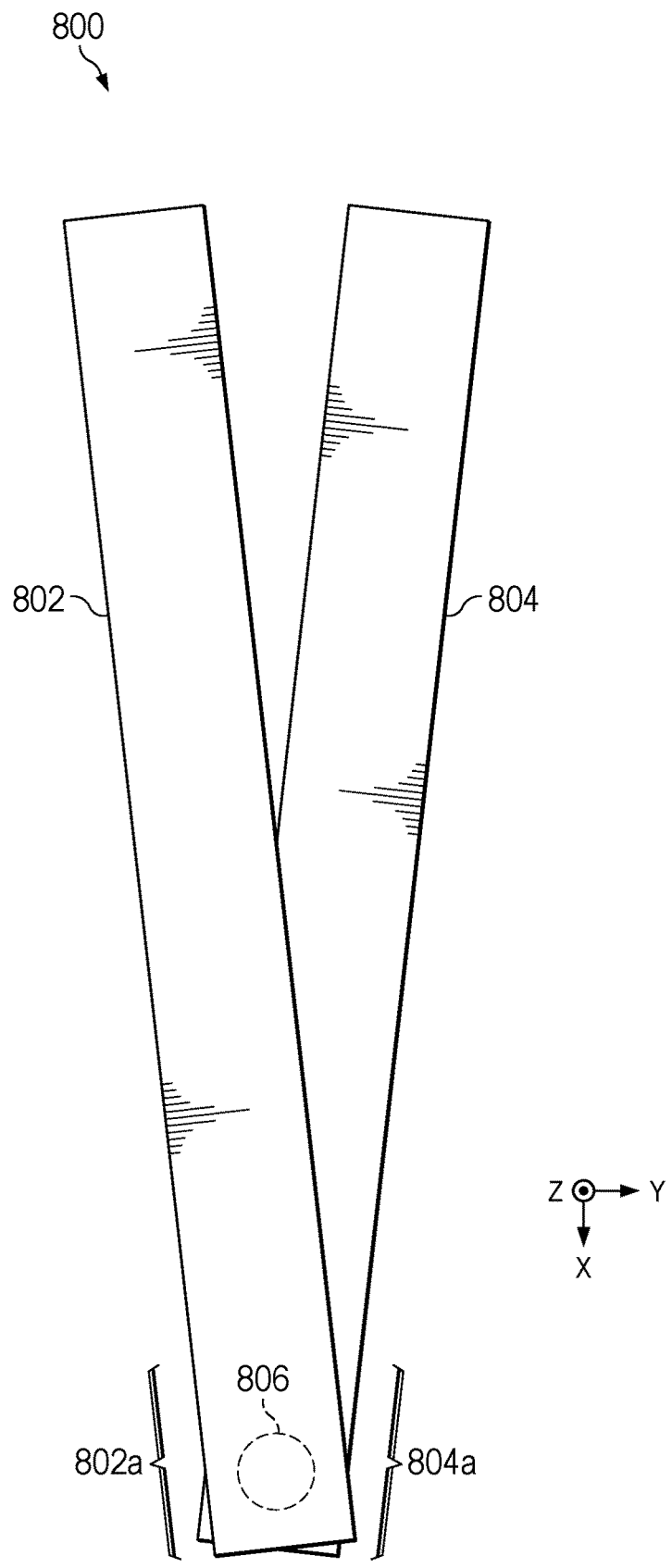

FIGS. 8A through 8D show various perspective views of another example arrangement of dipolar gas containers and signal coupler. Referring to FIGS. 8A through 8D, a quantum transition frequency detector 800 includes containers 802, 804, in which a first portion 802a of container 802 covers a second portion 804a of container 804, and a signal coupler 806 is positioned between and couples together respective opposing surfaces 806 and 808 of containers 802, 804. In FIG. 8A, containers 802 and 804 may extend along an x-y plane, first portion 802a, signal coupler 806, and second portion 804b form a stack along an axis perpendicular to the extension axis/plane of containers 802 and 804 (e.g., z-axis). Signal coupler 806 can include a solid material or a hollow sealed tube. Signal coupler 806 can be made of a dielectric material (e.g., plastic, epoxy, air, a combination thereof, etc.), a glass material, etc., and can be made of a same of a different material from containers 802 and 804. Signal coupler 806 can be in physical contact with containers 802 and 804 or can be separated by air gaps. The dimensions and the dielectric constant(s) of signal coupler 806 can be configured to minimize the reflection of the EM signal between container 802 and signal coupler 806, and between signal coupler 806 and container 804.

Figure 8D:
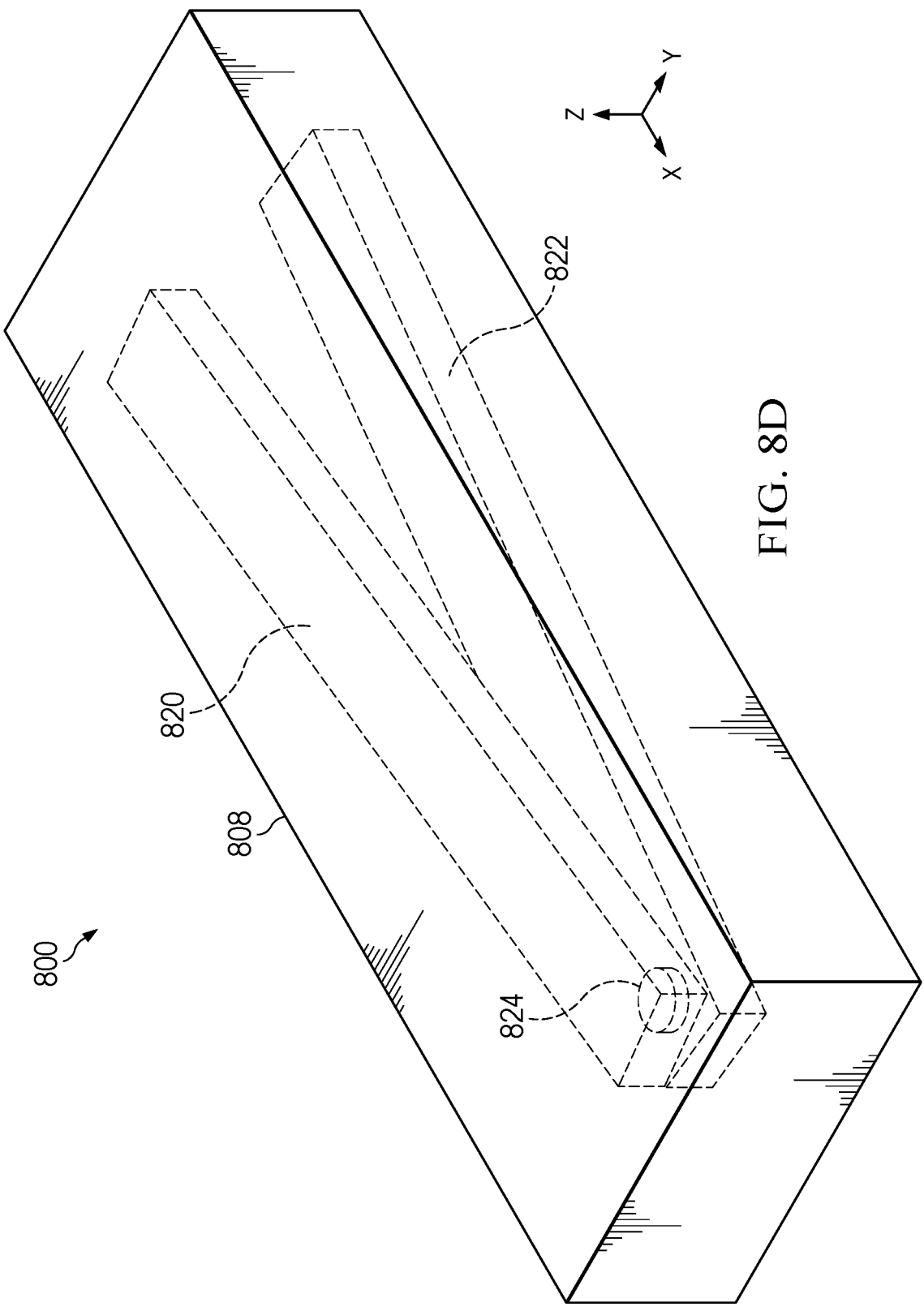

FIG. 8D is an oblique parallel projection view of a container enclosure 808, which is similar in certain material respects to container enclosure 508, with the exception that container enclosure 808 has internal cavities 820, 822, 824 configured to position portion 802a of container 802 to cover portion 804a of container 804, and to position signal coupler 806 between portions 802a and 804a. Each container can be communicatively coupled to an antenna via a signal coupler (not shown in FIGS. 8A-8D). In some examples, containers 802, 804, and signal coupler 806 can be coated with an electromagnetically reflective material, with interfacing windows (between container 802 and signal coupler 806, between container 804 and signal coupler 806, and between containers 802 and 804 and the signal couplers to the antennas) uncoated with coated with an electromagnetically translucent or substantially transparent material. In some examples, internal surfaces of cavities 820, 822, and 824 can be coated with an electromagnetically reflective material. The electromagnetically reflective material (e.g., metal) can adjoin (or is substantially in contact with) the outer surfaces of each container and coupler.

FIGS. 9A through 9D show various perspective views of another example arrangement of dipolar gas containers and signal coupler. Referring to FIGS. 9A through 9D, a quantum transition frequency detector 900 includes two dipolar gas-confining containers 902, 904, in which a first portion 902a of container 902 covers a second portion 902b of container 904 and forms a stack along a direction (e.g., z-axis) perpendicular to direction of extension of containers 902 and 904 (e.g., along the x-y plane). Also, a signal coupler 906 joins end 910 of container 902 and end 914 of container 904. Signal coupler 906 can include a solid material or a hollow sealed tube. Signal coupler 906 can be made of a dielectric material (e.g., plastic, epoxy, air, a combination thereof, etc.), a glass material, etc., and can be made of a same of a different material from containers 902 and 904. Signal coupler 906 can have similar features and structures as signal 506, such as shown in FIG. 5F and FIG. 5G. Signal coupler 806 can be in physical contact with containers 902 and 904 or can be separated by air gaps. The dimensions and the dielectric constant(s) of signal coupler 906 can be configured to minimize the reflection of the EM signal between container 902 and signal coupler 906, and between signal coupler 906 and container 904.

Figure 9A:
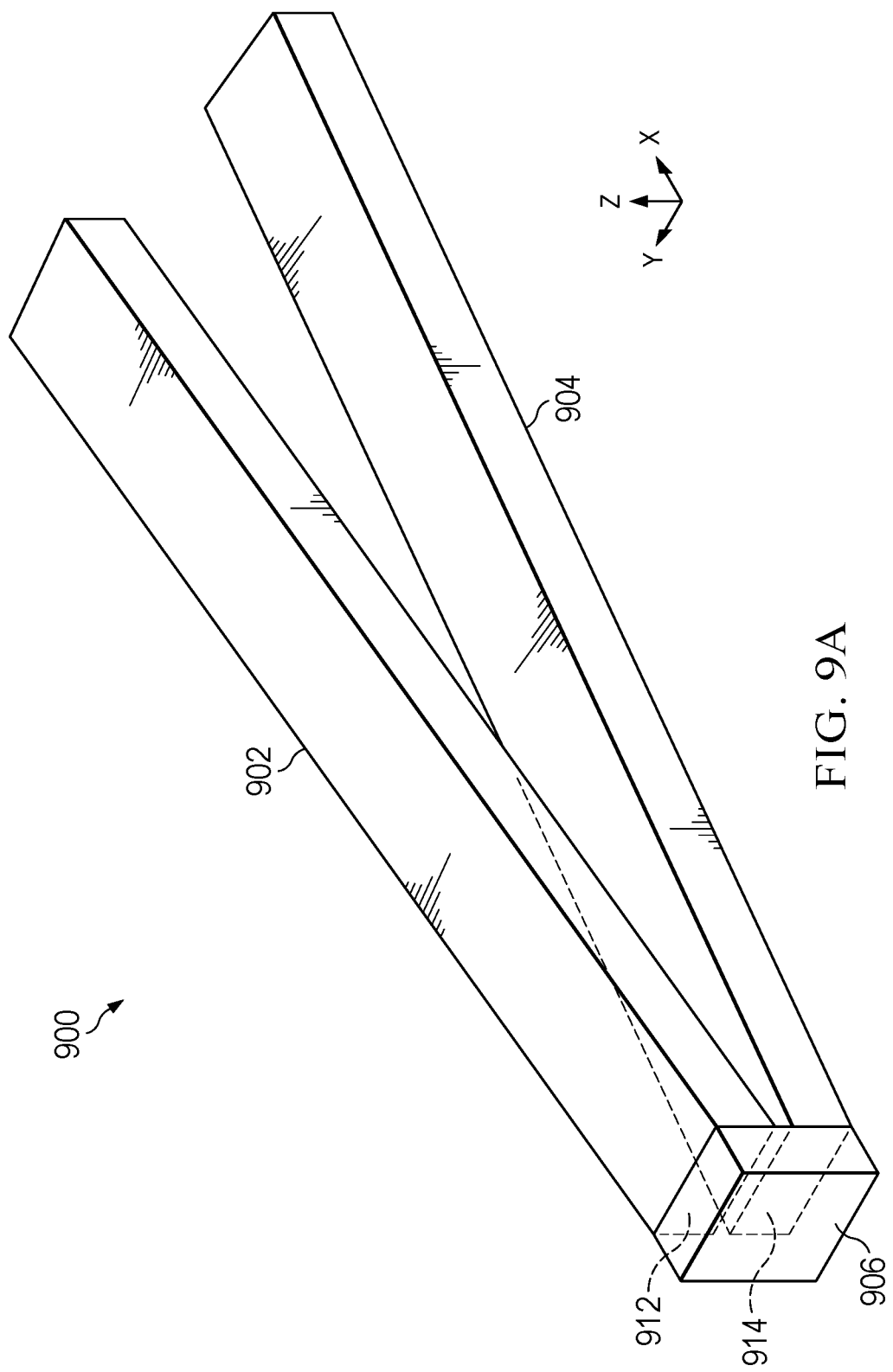
FIGS. 9A, 9B, 9C, and 9D show various perspective views of another arrangement of dipolar-gas-confining containers and a signal coupler, in which a first portion of one container is on a second portion of another container, and the signal coupler is positioned between and couples together respective non-opposing surfaces of the containers.
Figure 9B:
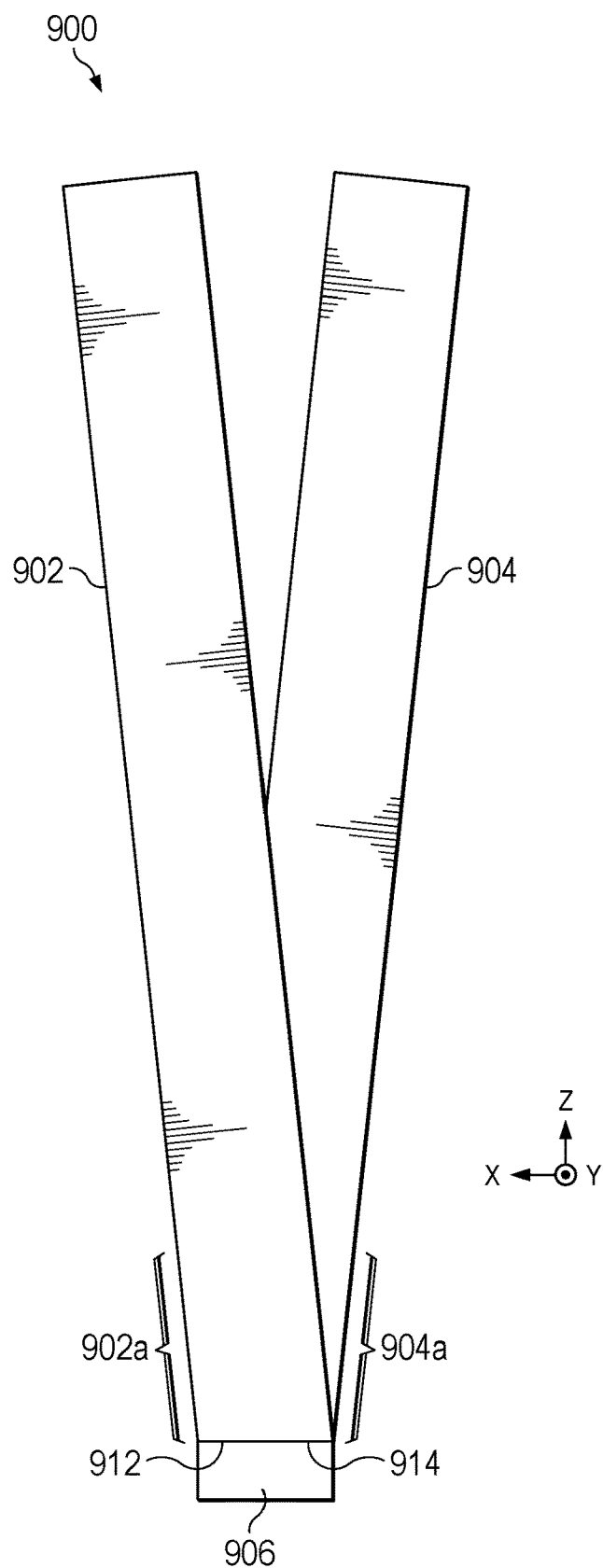
Figure 9C:
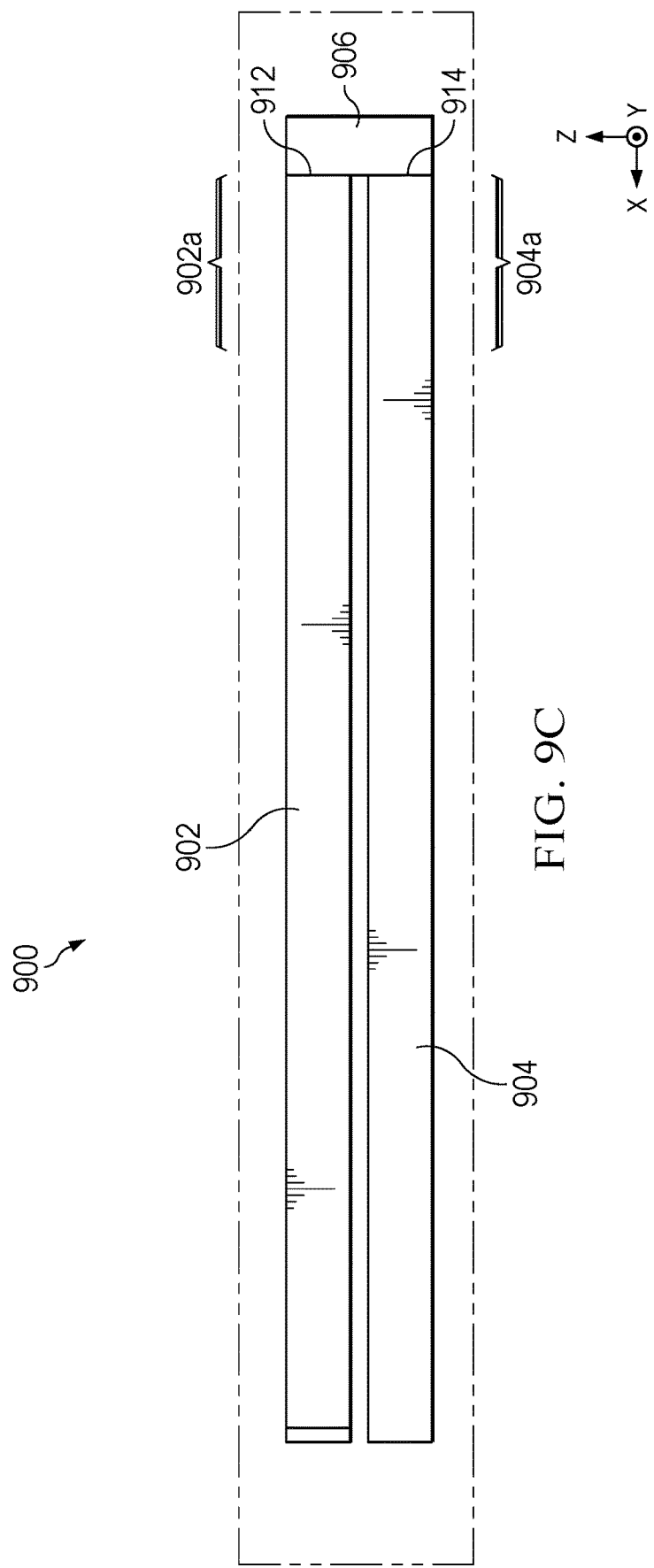
Figure 9D:
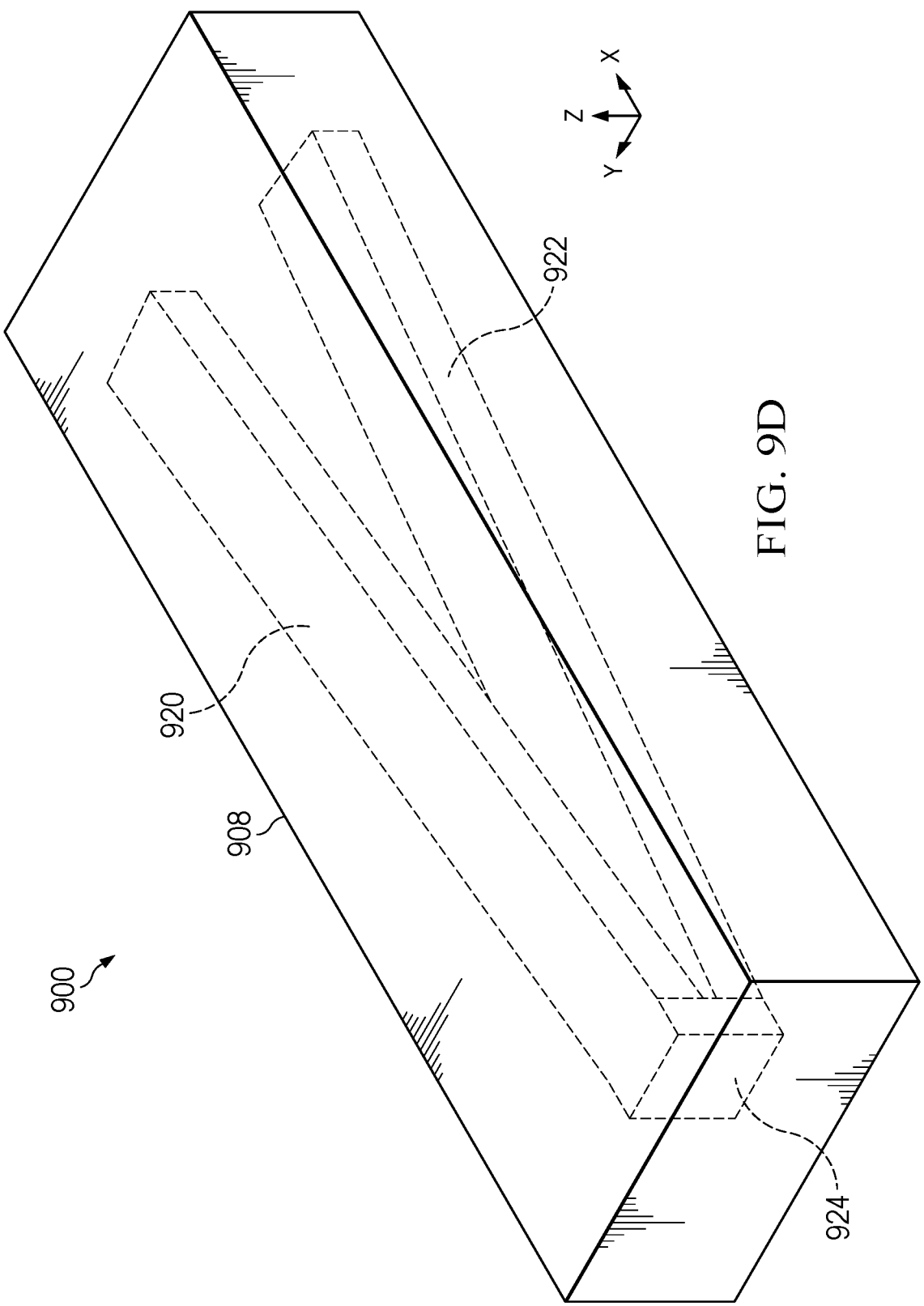

FIG. 9D is an oblique parallel projection view of a container enclosure 908, which is similar in certain material respects to container enclosure 508, where container enclosure 908 has internal cavities 920, 922, 924 configured to position a first portion of container 902 on a second portion of container 904, and to position signal coupler 906 proximate to and to overlap respective ends of containers 902, 904. Each container can be communicatively coupled to an antenna via a signal coupler (not shown in FIGS. 9A-9D).

Figure 10A:
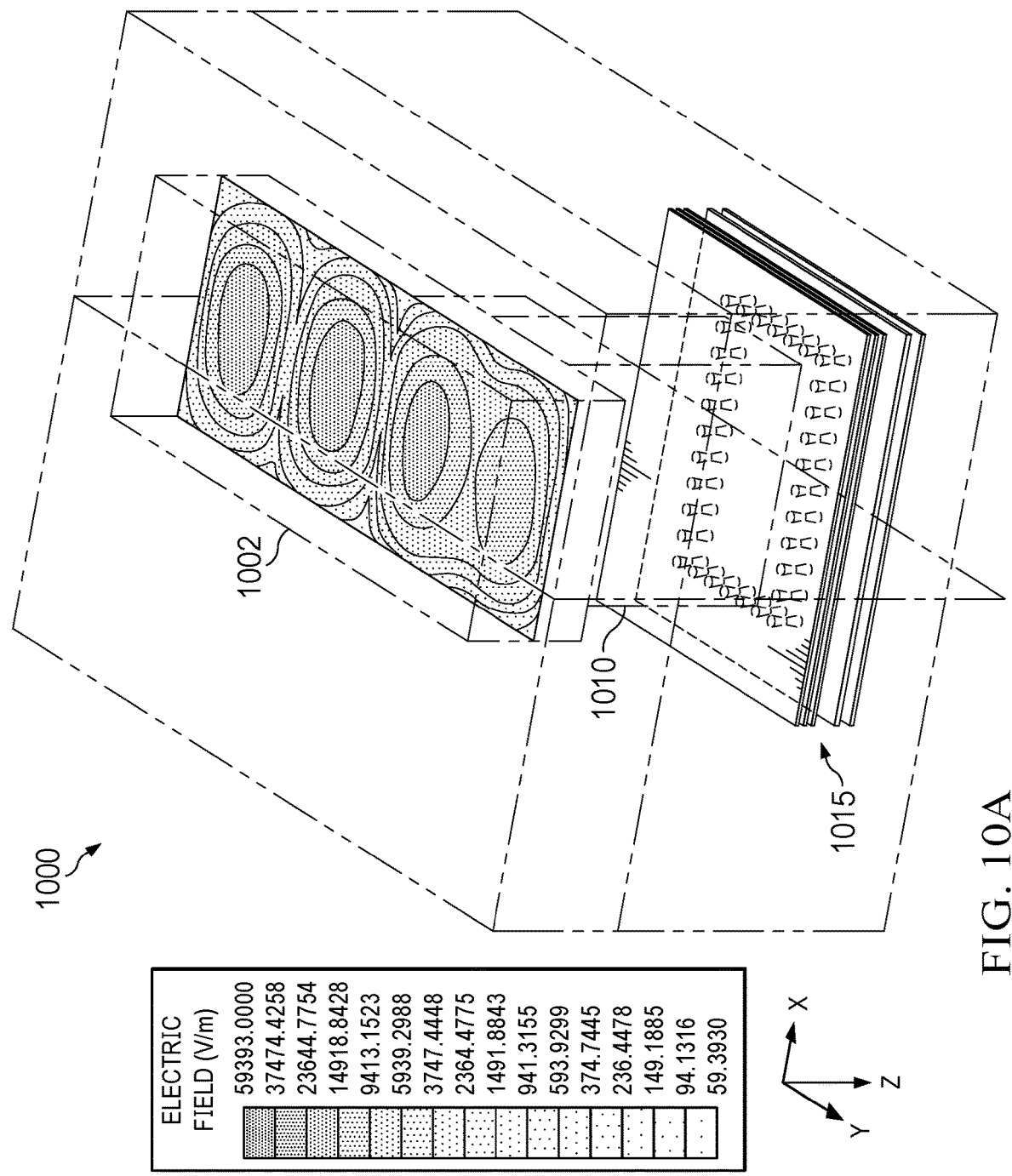
FIGS. 10A and 10B show an oblique parallel projection and side views, respectively, of a portion of an example quantum transition frequency detector, with shading representative of an electric field that is perpendicular to the direction of propagation.
Figure 10B:
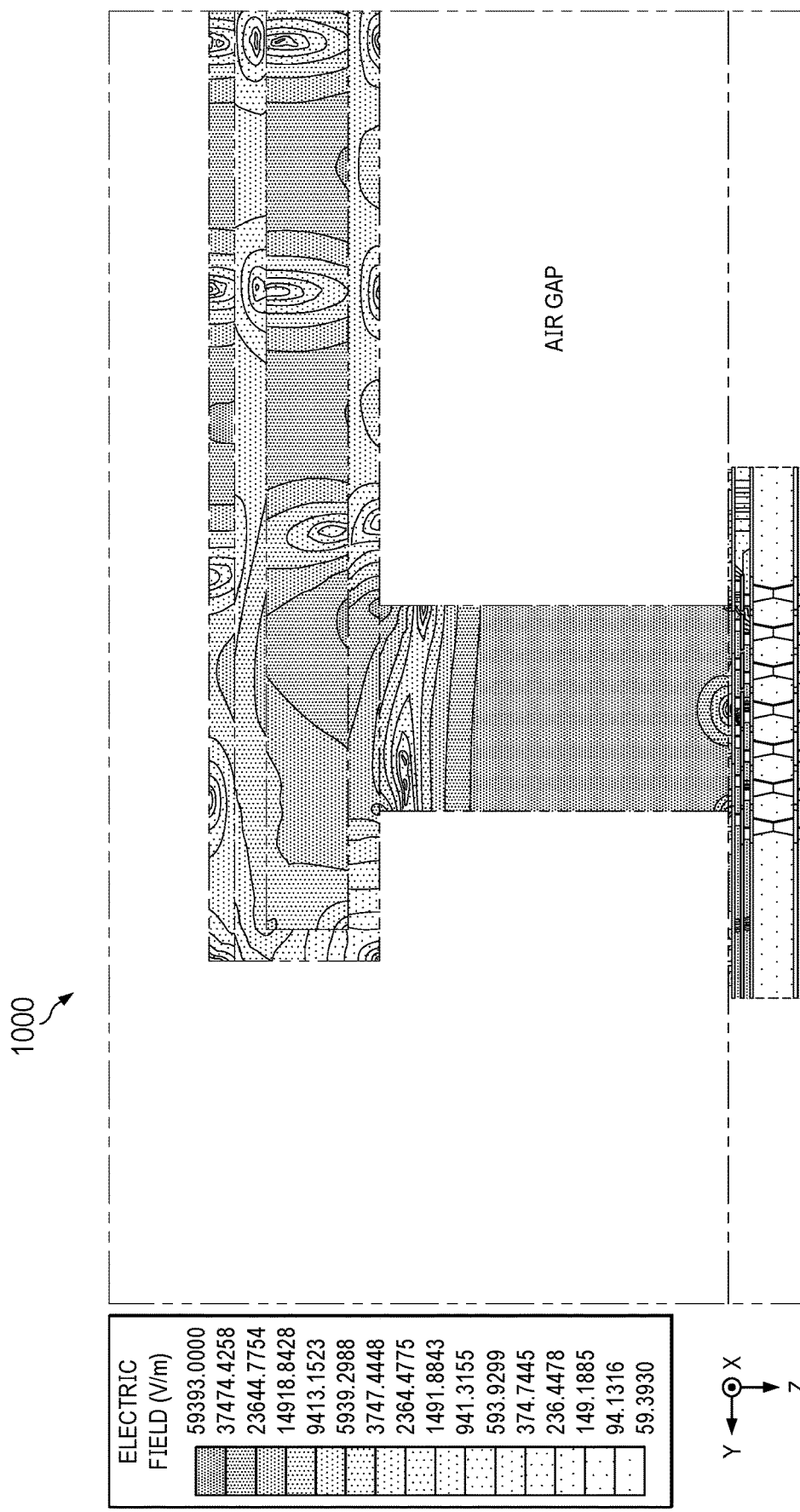

FIGS. 10A and 10B show an oblique parallel projection and side views, respectively, of a portion of an example quantum transition frequency detector 1000 with shading representative of an electric field that is perpendicular to the direction of propagation through a rectangular dipolar gas-confining container 1002 (e.g., a TE10 mode, where "TE" refers to transverse electric). The container 1002, a signal coupler 1010, and a TX antenna 1015 may be similar in material respects to corresponding components 502, 510, and 515, respectively, of detector 500. In some examples, container 1002 may have a rectangular cross section having a half wavelength ($\lambda/2$) dimension across the broad side and less than a half wave length ($\lambda/2$) of the magnetic field across the narrow side. As shown in FIGS. 10A and 10B (and FIGS. 5A-FIG. 9D), the broader side of the rectangular cross section of container 1002 is parallel to top surface of the underlying TX antenna 1015. In some examples, container 1002 may be rotated (e.g., within the range of 80 to 100 degrees, including 90 degrees) relative to what is shown in FIGS. 5A-10B, where the dipolar gas-confining containers can have a width (e.g., along the y-axis) longer than a height/thickness (e.g., along the axis).

FIGS. 11A through 11D show various views of an example quantum transition frequency detector 1100 having multiple dipolar gas-confining containers 1102, 1104 that have a width (labelled "w" in FIG. 11A, along the z-axis) shorter than a height (labelled "h" in FIG. 11A, along the y-axis) and are parallel to and coplanar with each other, so that the broader side of the containers are perpendicular to (or angled from) the antennas (not shown) and PCB 514. Frequency detector 1100 can have a similar structure and arrangement as quantum transition frequency detector 500. Frequency detector 1100 also includes a signal coupler 1106 communicatively coupled to ends of containers 1102 and 1104, and a container enclosure 1108 enclosing containers 1102, 1104, and signal coupler 1106. Signal coupler 1106 can have similar features/structures as signal coupler 506, such as shown in FIGS. 5F and 5G. Signal coupler 1106 can include a solid material or a hollow sealed tube. Signal coupler 1106 can be made of a dielectric material (e.g., plastic, epoxy, air, a combination thereof, etc.), a glass material, etc., and can be made of a same of a different material from containers 1102 and 1104. Signal coupler 1106 can be in physical contact with containers 1102 and 1104 or can be separated by air gaps. The dimensions and the dielectric constant(s) of signal coupler 1106 can be configured to minimize the reflection of the EM signal between container 1102 and signal coupler 1106, and between signal coupler 1106 and container 1104.

Quantum transition frequency detector 1100 can support different transmission mode from, for example, quantum transition frequency detectors 500-1000. For example, quantum transition frequency detectors 500-1000 may support TE10 propagation, and quantum transition frequency detector 1100 may support TE01 propagation. The narrower sides of the rectangular cross sections of containers 1102, 1104 are parallel to the x-y plane.

Figure 11A:
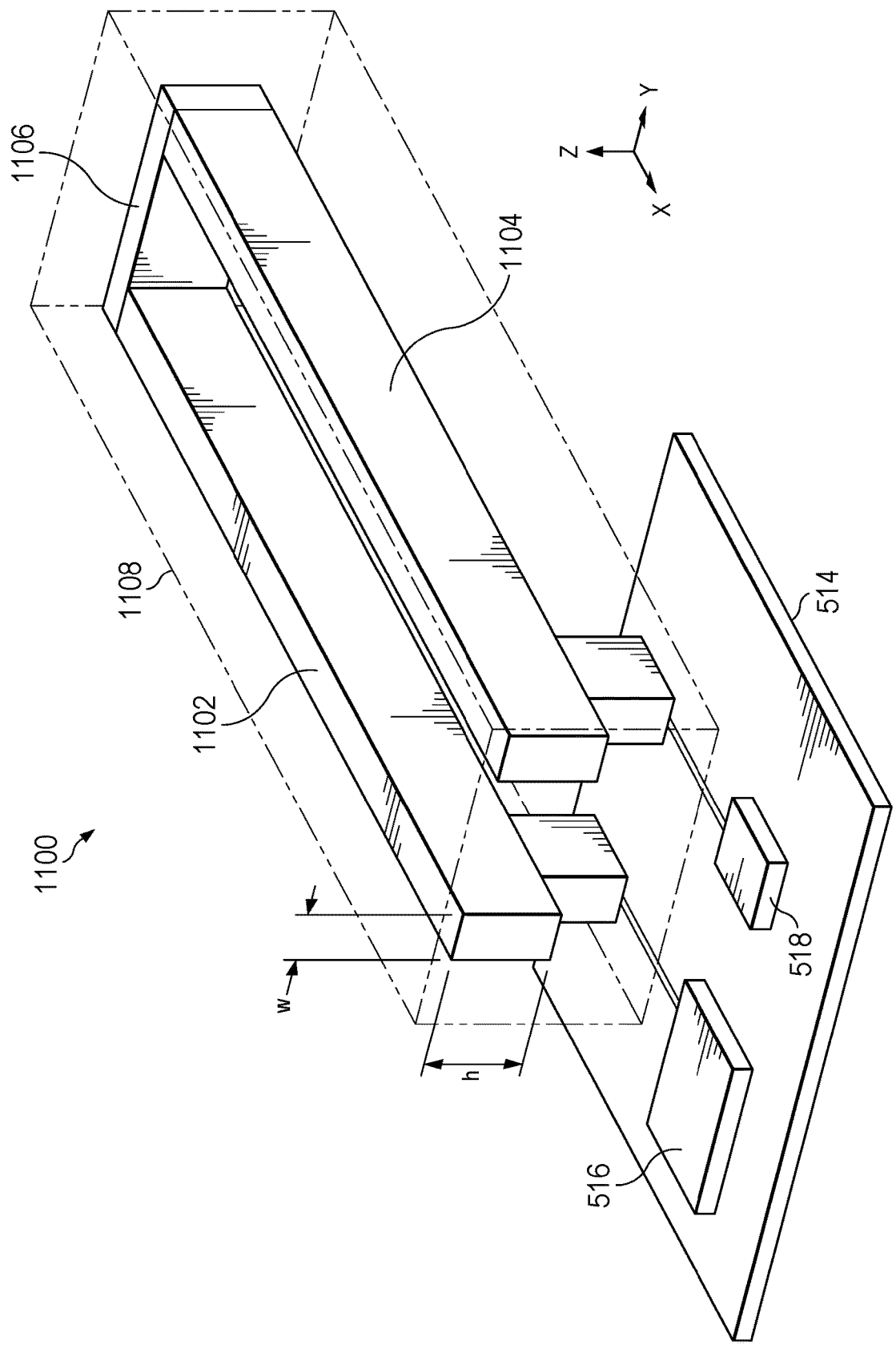
FIGS. 11A, 11B, 11C, and 11D show various views of an example quantum transition frequency detector having multiple dipolar-gas-confining containers that are parallel to each other and that have rectangular cross sections, in which the narrower sides are coplanar with each other.
Figure 11B:
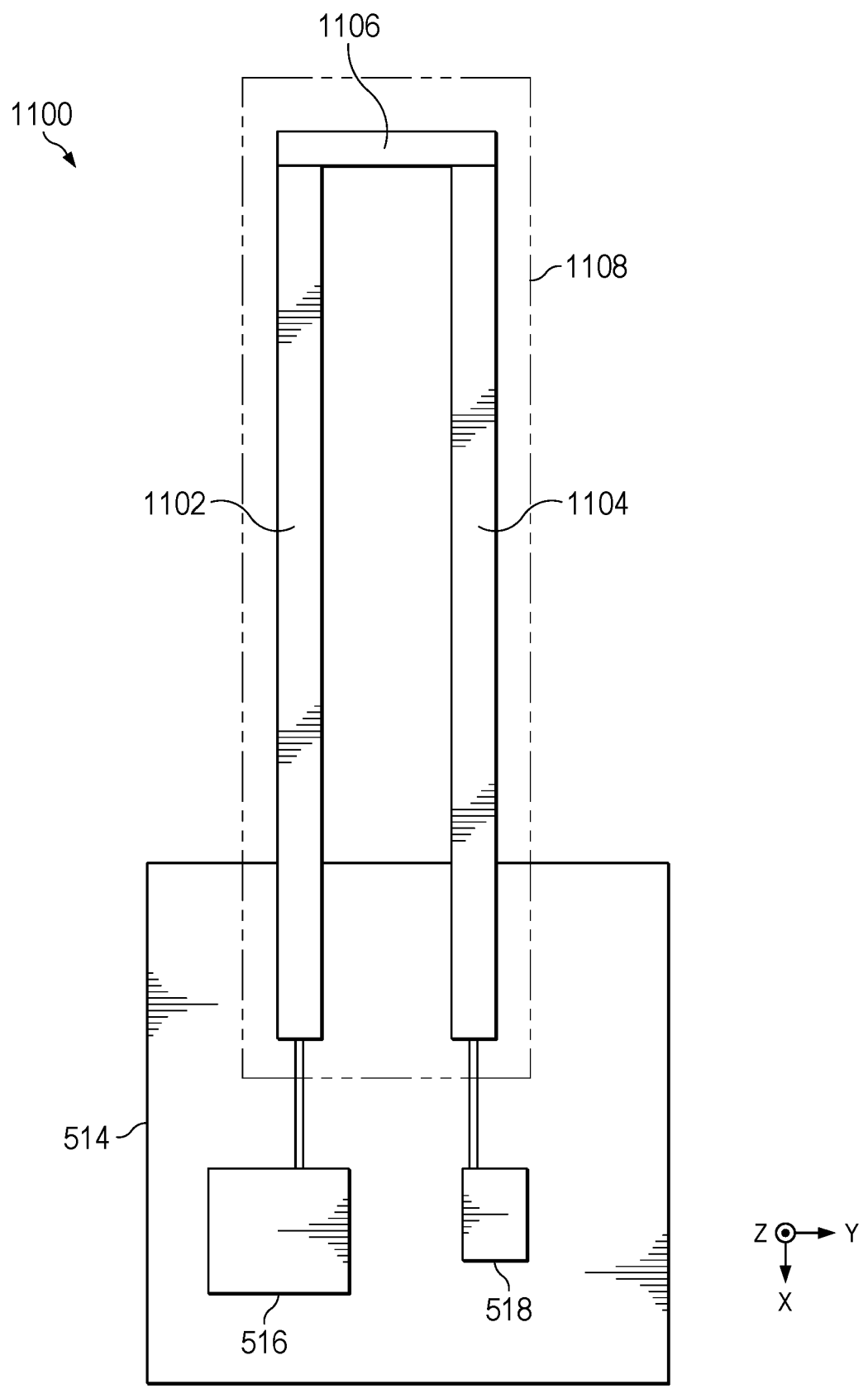
Figure 11C:
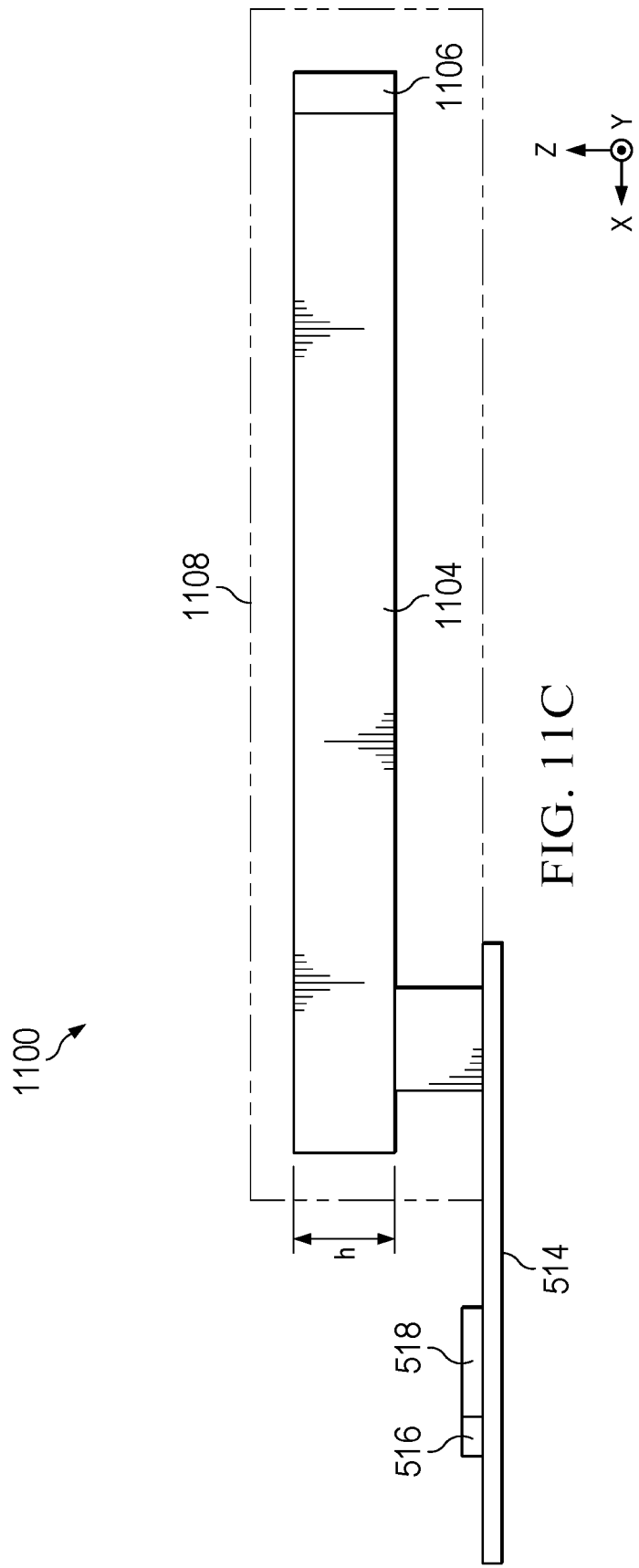
Figure 11D:
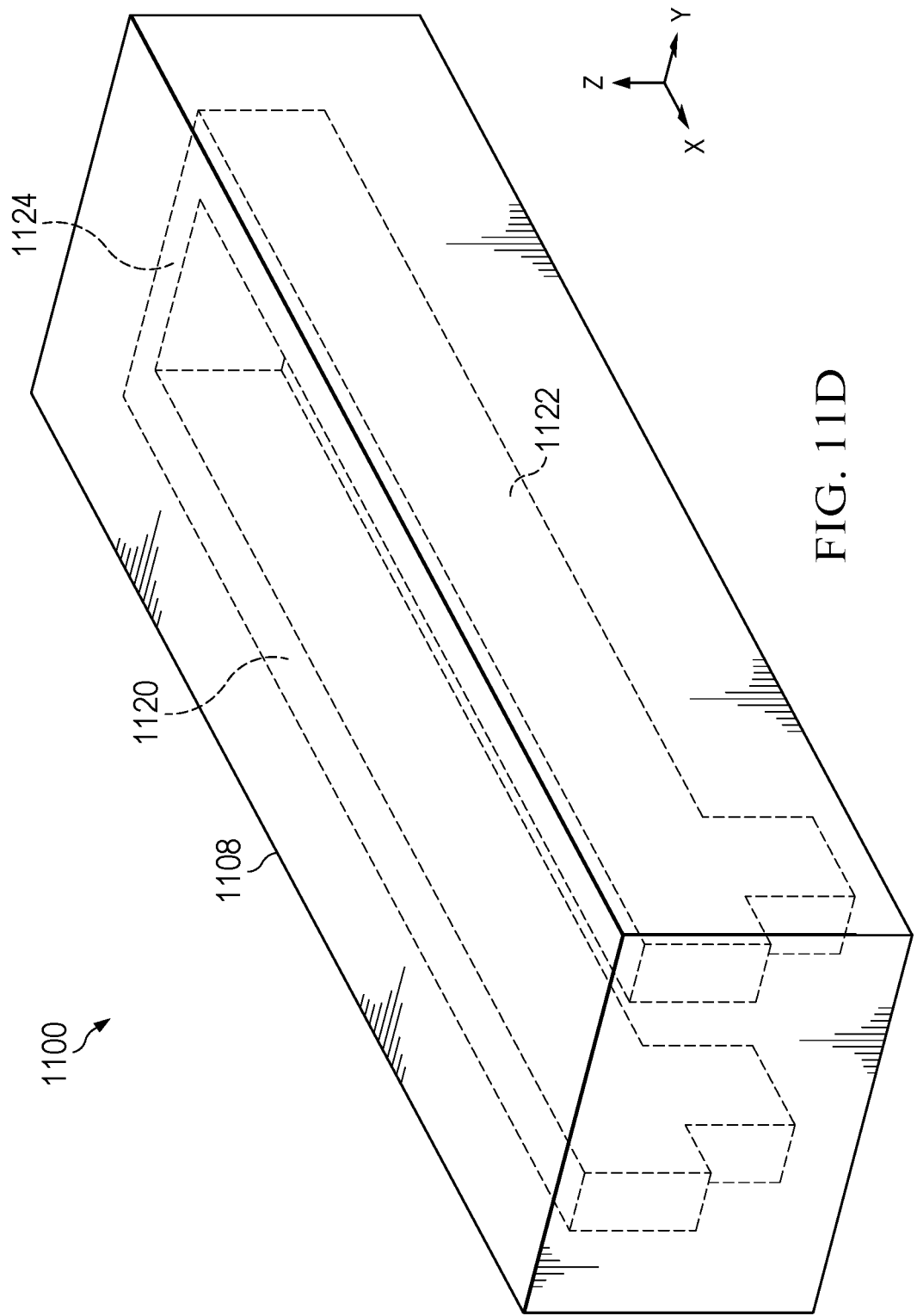

FIG. 11D is an oblique parallel projection view of container enclosure 1108. As shown in FIG. 11D, container enclosure 1108 has internal cavities 1120, 1122, 1124 configured to hold in place containers 1102, 1104 and signal coupler 1106, respectively. In some examples, cavities 1120, 1122, 1124 are each interiorly coated with an electromagnetically reflective material (e.g., metallized). In some examples, the outer surfaces of containers 1102, 1104 and signal coupler 1106 are coated with an electromagnetically reflective material (e.g., metallized), as described above. The electromagnetically reflective material (e.g., metal) can adjoin (or is substantially in contact with) the outer surfaces of each container and coupler.

FIGS. 12A through 12D show various views of a detector 1200 having a first dipolar gas-confining container 1202 that is angled from a second dipolar gas-confining container 1204 (e.g., in a V-shape configuration), and can have a similar structure and arrangement as quantum transition frequency detector 600. Each of containers 1202 and 1204 has a width (labelled "w" in FIG. 12A, along the z-axis) shorter than a height (labelled "h" in FIG. 12A, along the y-axis) and are coplanar with each other, so that the broader side of the containers are perpendicular to (or angled from) the antennas (not shown) and PCB 514, to support a different transmission mode from detector 600. Frequency detector 1200 also includes a signal coupler 1206 communicatively coupled to ends of containers 1202 and 1204, and a container enclosure 1208 enclosing containers 1202, 1204, and signal coupler 1206. Signal coupler 1206 can have similar features/structures as signal coupler 506, such as shown in FIGS. 5F and 5G. Signal coupler 1206 can include a solid material or a hollow sealed tube. Signal coupler 1206 can be made of a dielectric material (e.g., plastic, epoxy, air, a combination thereof, etc.), a glass material, etc., and can be made of a same of a different material from containers 1202 and 1204. Signal coupler 1206 can be in physical contact with containers 1202 and 1204 or can be separated by air gaps. The dimensions and the dielectric constant(s) of signal coupler 1206 can be configured to minimize the reflection of the EM signal between container 1202 and signal coupler 1206, and between signal coupler 1206 and container 1204.

Figure 12A:
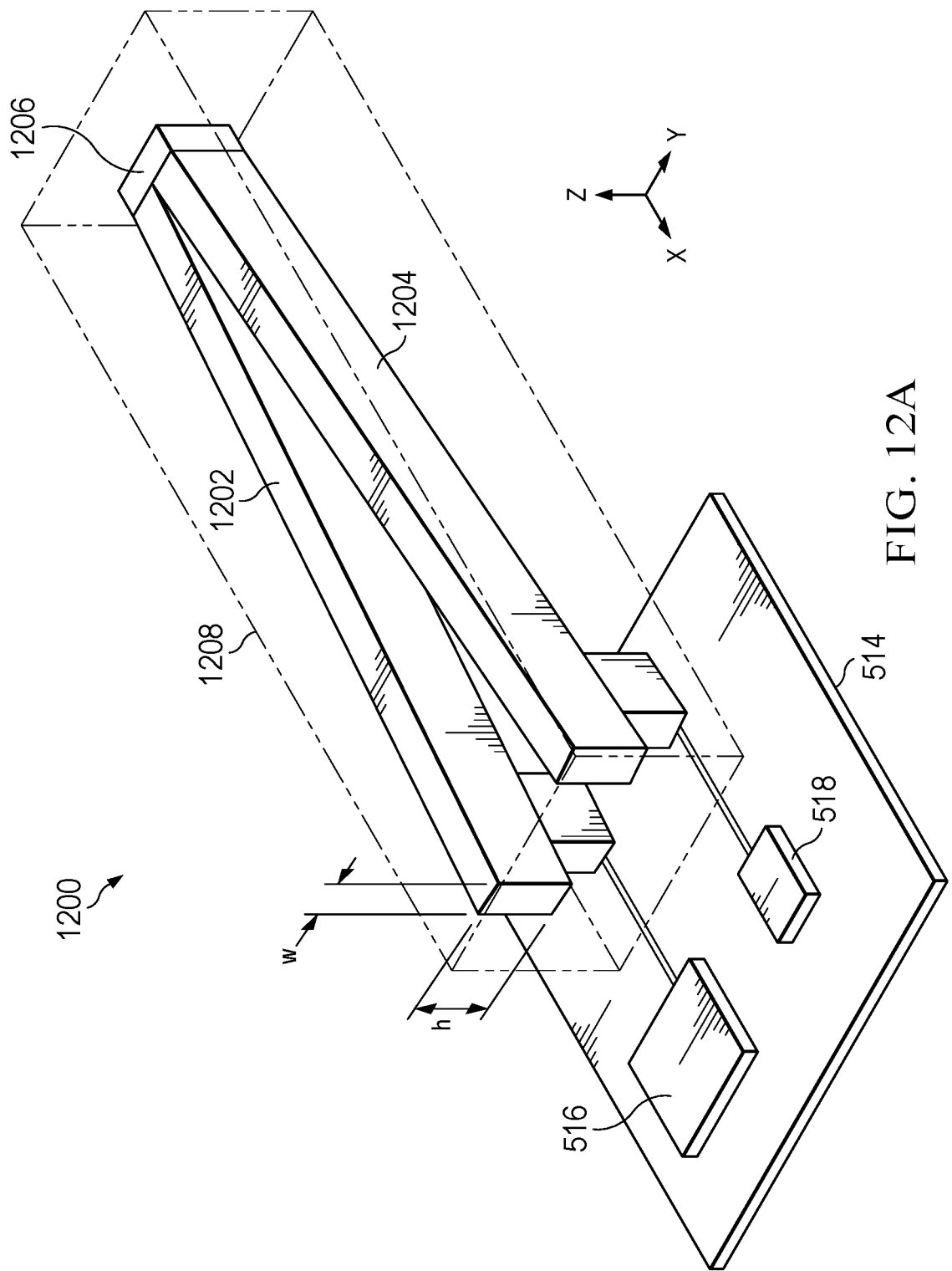
FIGS. 12A, 12B, 12C, and 12D show various views of an example quantum transition frequency detector having multiple dipolar-gas-confining containers that are angled from each other and that have rectangular cross sections, in which the narrower sides are coplanar with each other.
Figure 12B:
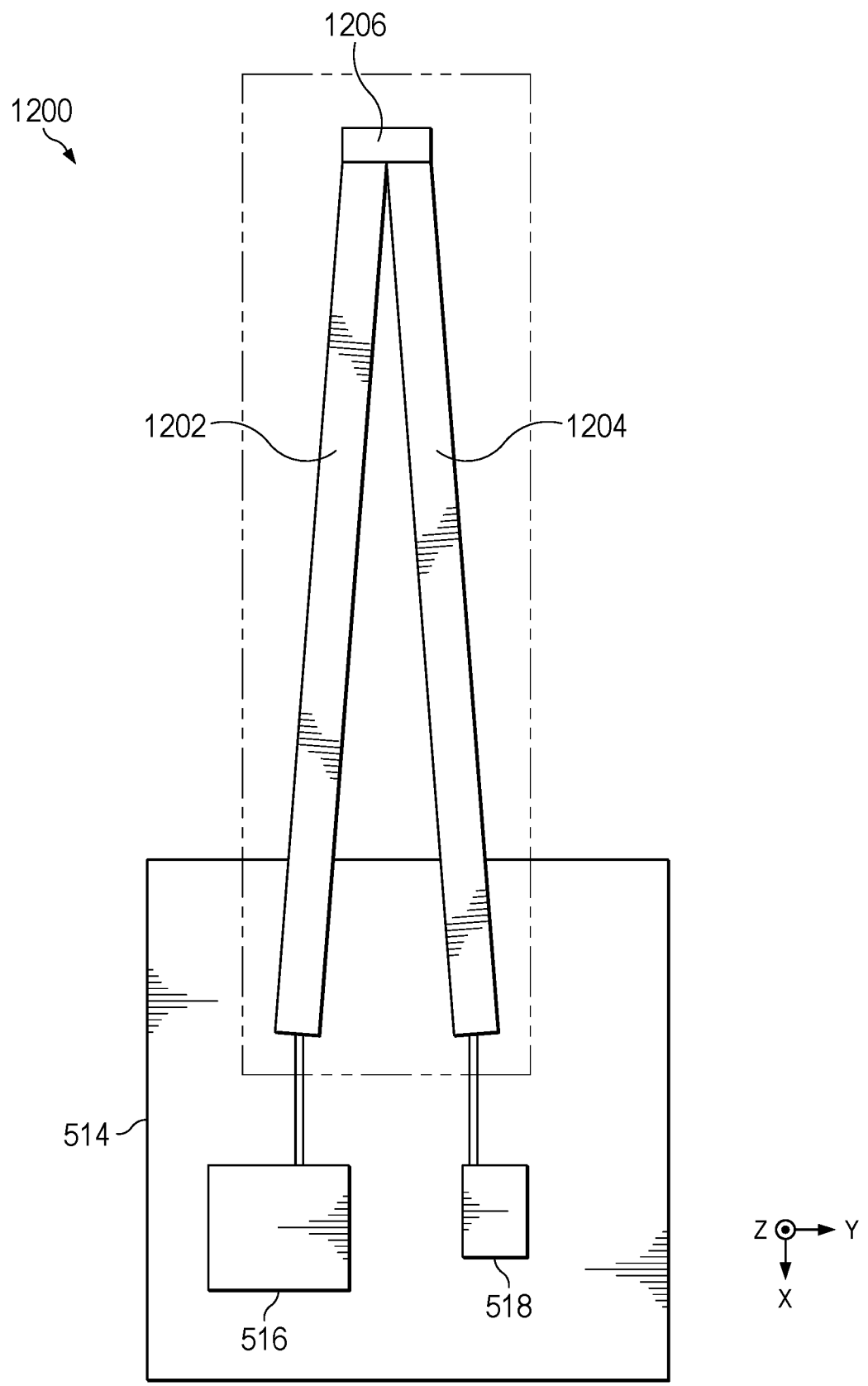
Figure 12C:
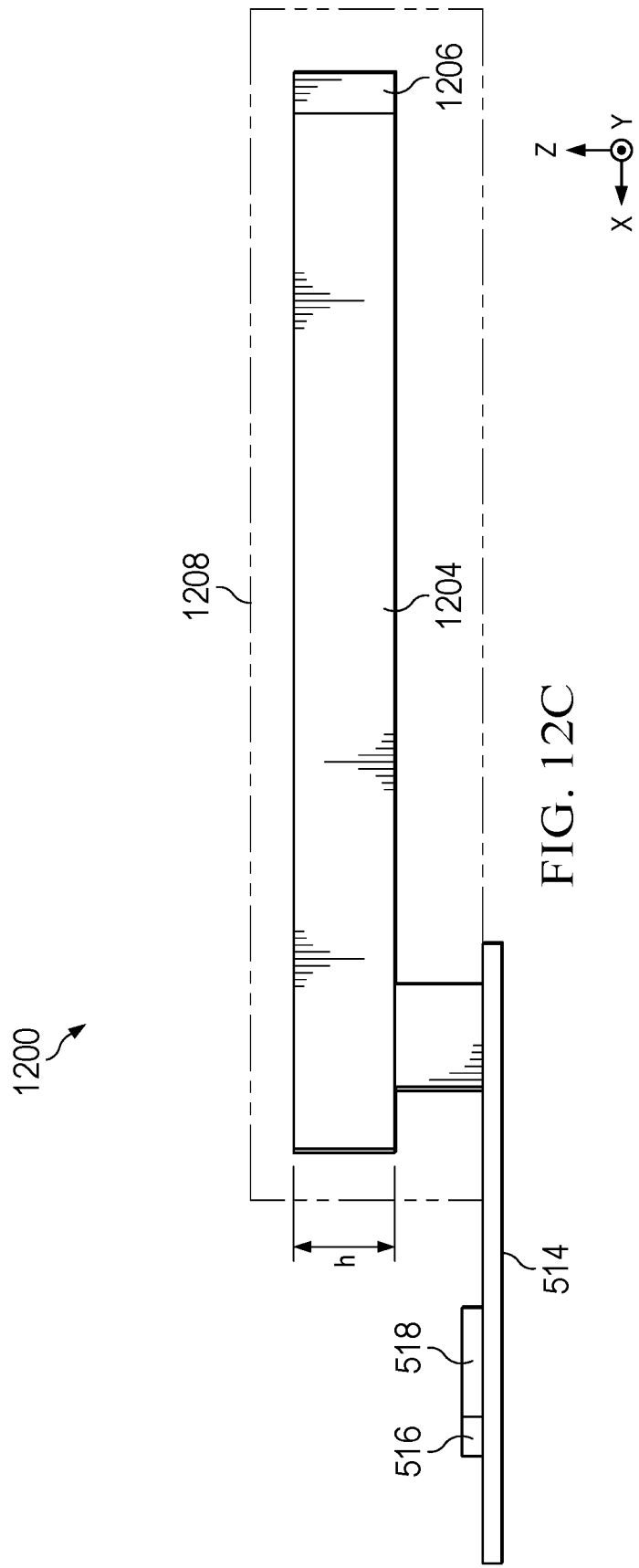
Figure 12D:
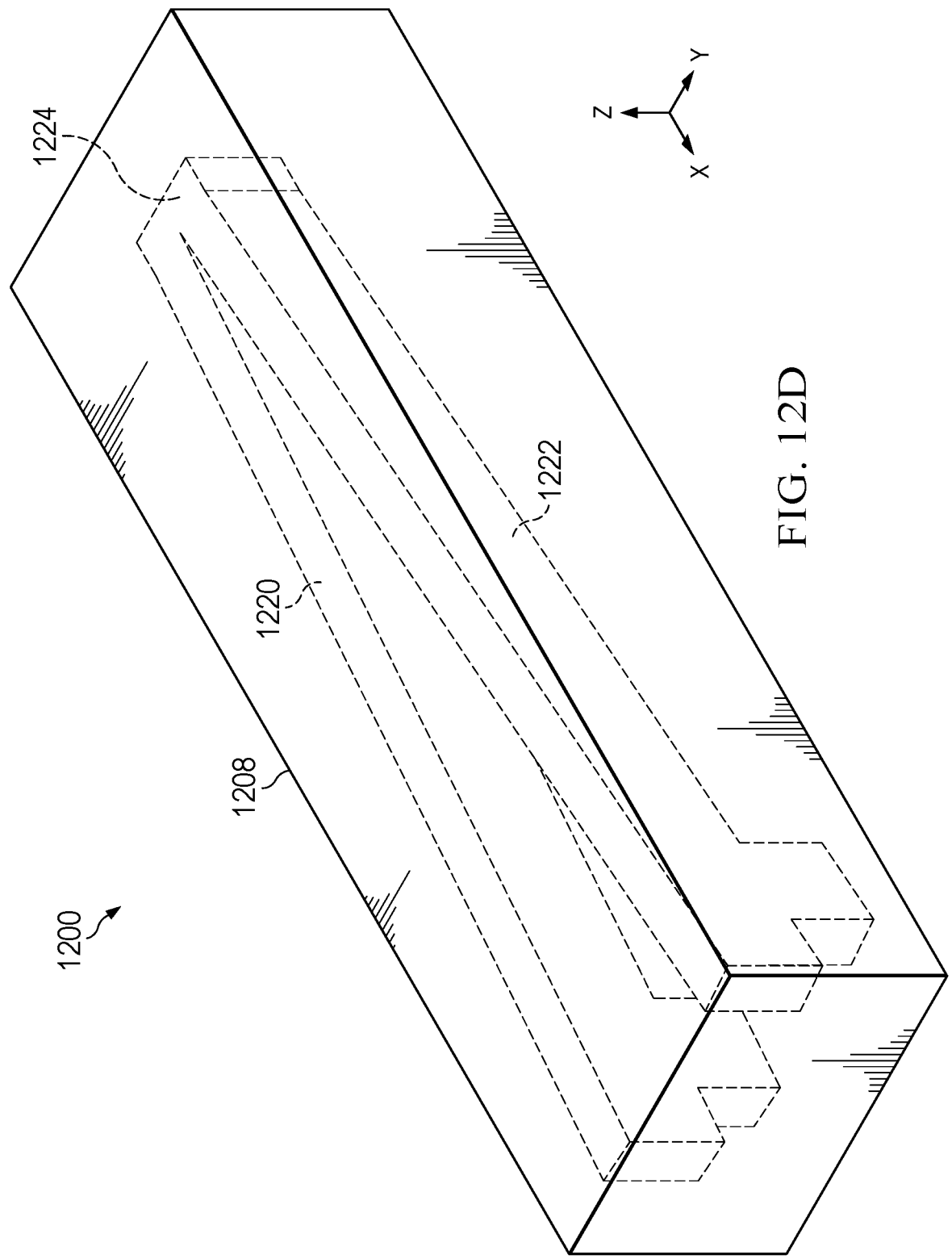

FIG. 12D is an oblique parallel projection view of container enclosure 1208. As shown in FIG. 12D, container enclosure 1208 has internal cavities 1220, 1222, 1224 configured to hold in place containers 1202, 1204 and signal coupler 1206, respectively. In some examples, cavities 1220, 1222, 1224 are each interiorly coated with an electromagnetically reflective material (e.g., metallized). In some examples, the outer surfaces of containers 1202, 1204 and signal coupler 1206 are coated with an electromagnetically reflective material (e.g., metallized), as described above. The electromagnetically reflective material (e.g., metal) can adjoin (or is substantially in contact with) the outer surfaces of each container and coupler.

Figure 13A:
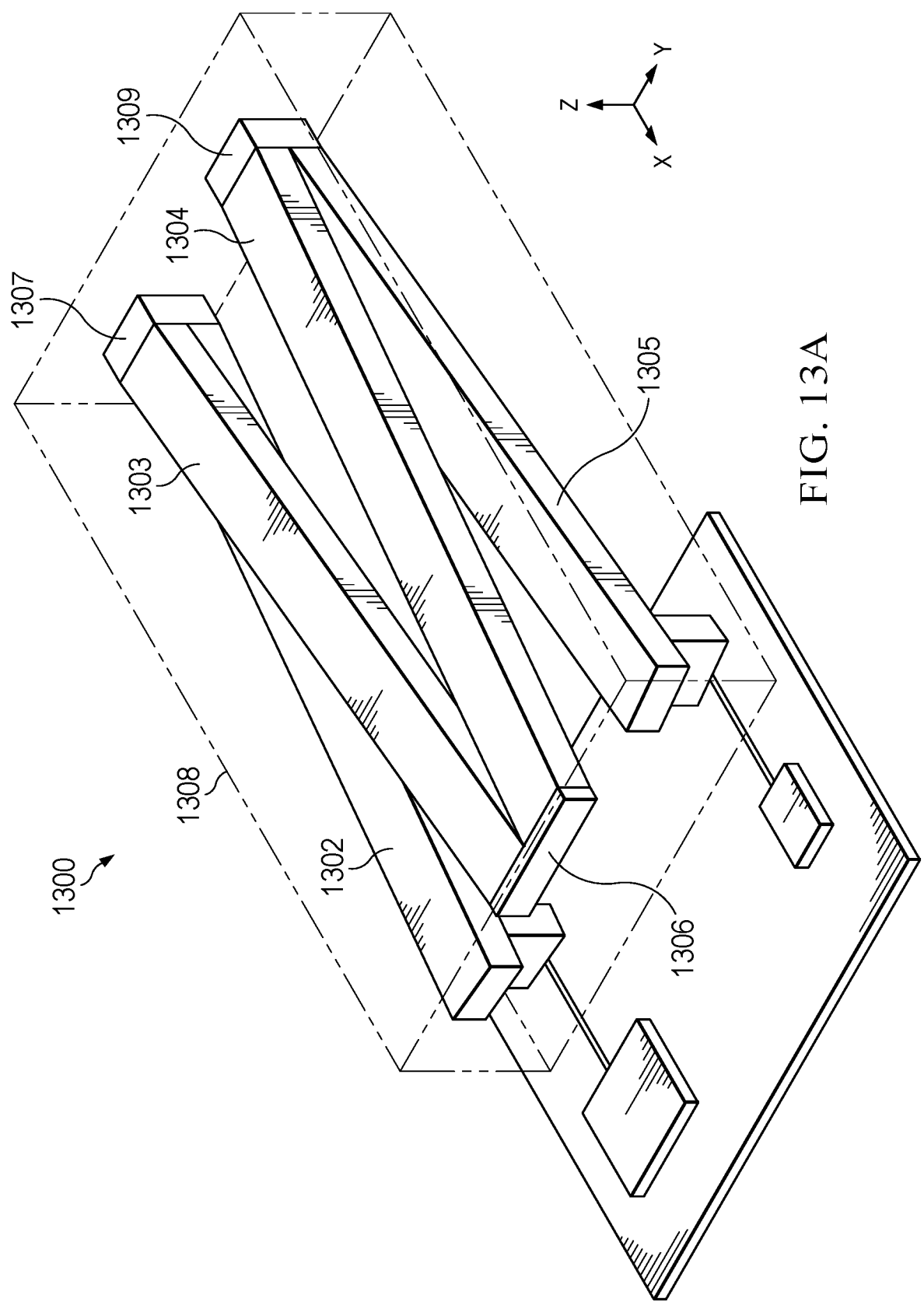
FIGS. 13A, 13B, 13C, 13D, and 13E show various perspective views of respective portions of an example quantum transition frequency detector incorporating at least four dipolar-gas-confining containers and at least three signal couplers collectively arranged in an M-shape or W-shaped configuration, depending on perspective.
Figure 13B:
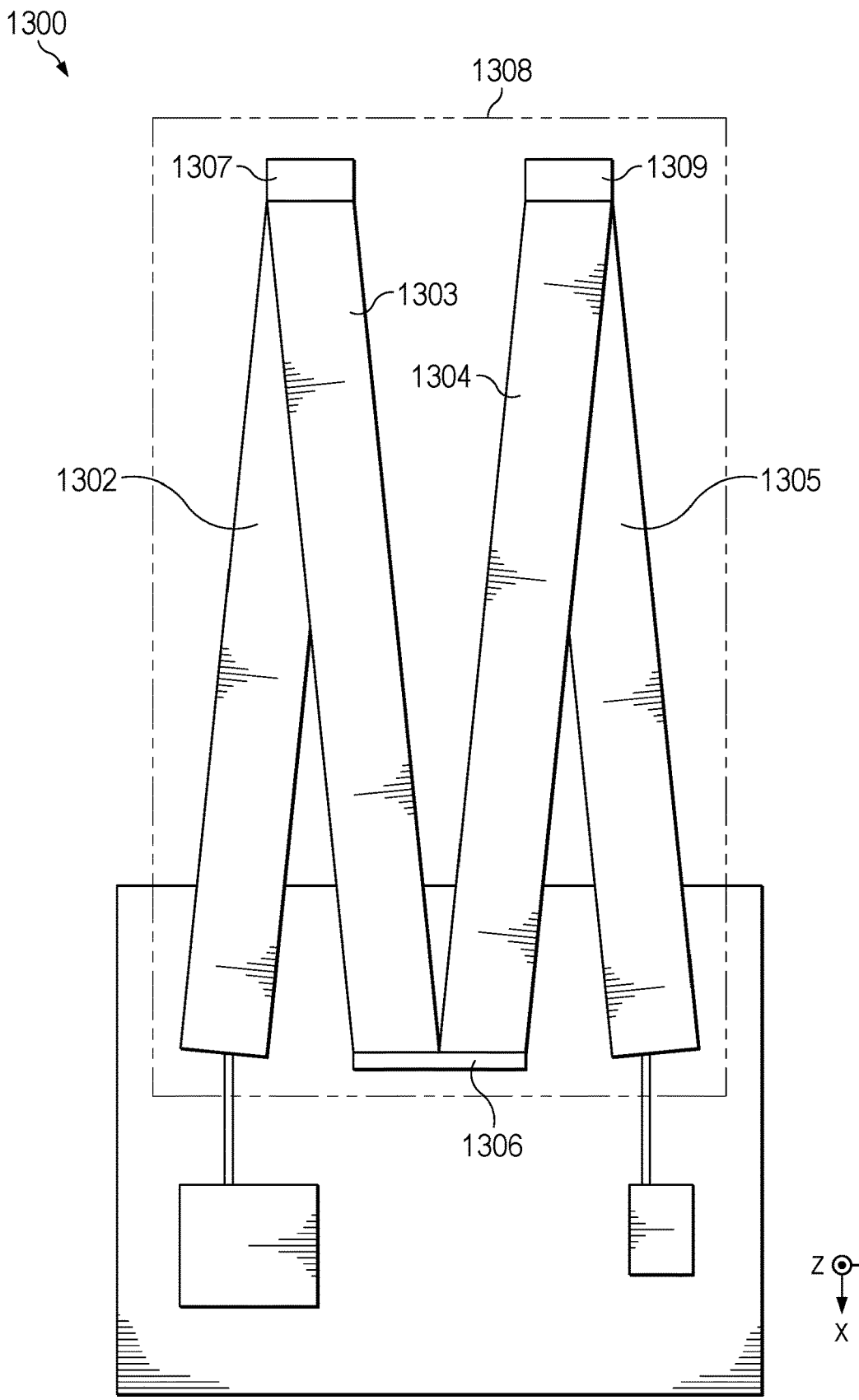
Figure 13C:
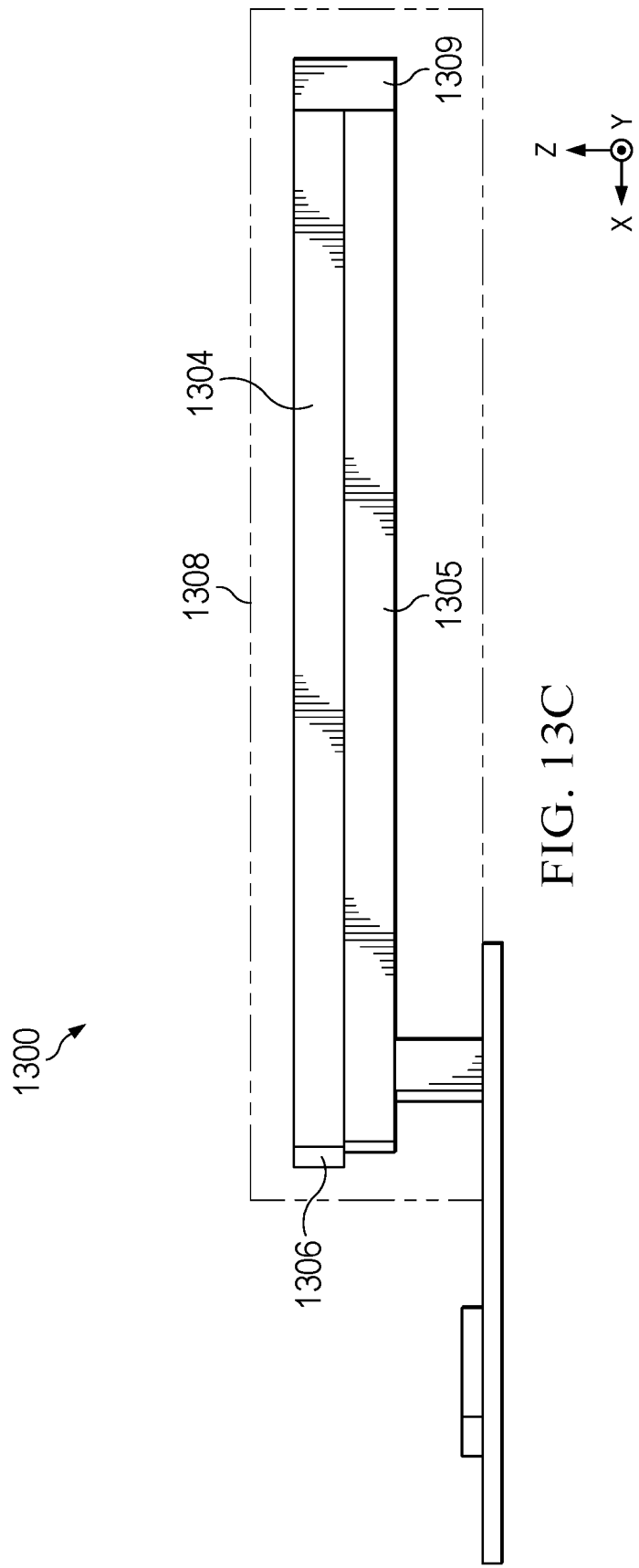

FIGS. 13A through 13E show various perspective views of respective portions of an example quantum transition frequency detector 1300, similar in material respects to detector 100 of FIG. 1. FIG. 13A is an oblique parallel projection view of detector 1300 and FIGS. 13B and 13C are top views and side views, respectively of the same. Detector 1300 incorporates at least four dipolar gas-confining containers 1302, 1303, 1304, 1305 and at least three signal couplers 1306, 1307, 1309, in which signal coupler 1306 communicatively couples together containers 1303, 1304, signal coupler 1307 communicatively couples together containers 1302, 1303, and signal coupler 1309 communicatively couples together containers 1304, 1305. In this example, containers 1302, 1304 are parallel to each other and are angled from containers 1303, 1305, respectively. Containers 1303, 1305 are parallel to each other. In this example, an end of container 1303 is on an end of container 1302 and an end of container 1304 is on an end of container 1305. Containers 1302, 1305 can be enclosed within a first level of container enclosure 1308 and containers 1303, 1304 can be enclosed within a second level of container enclosure, in which the first and second levels of container enclosure 1308 are parallel to each other and the second level is on the first level. Collectively, the arrangement of containers 1302, 1303, 1304, 1305 can be deemed W-shaped or M-shaped, depending on perspective.

In some examples, the intercoupling of containers 1303, 1304 and signal coupler 1306 may be similar what is described herein with reference to containers 620, 604 and signal coupler 606; and the intercoupling of containers 1302, 1303, and signal coupler 1307 may be similar to what is described herein with reference to containers 902, 904 and signal coupler 906. In some examples, signal coupler 1307 may be positioned between opposing faces of containers 1302, 1303, such that signal coupler 1307 communicatively couples container 1302 to container 1303 in a manner similar to what is described herein with reference to containers 802, 804 and signal coupler 806.

Figure 13D:
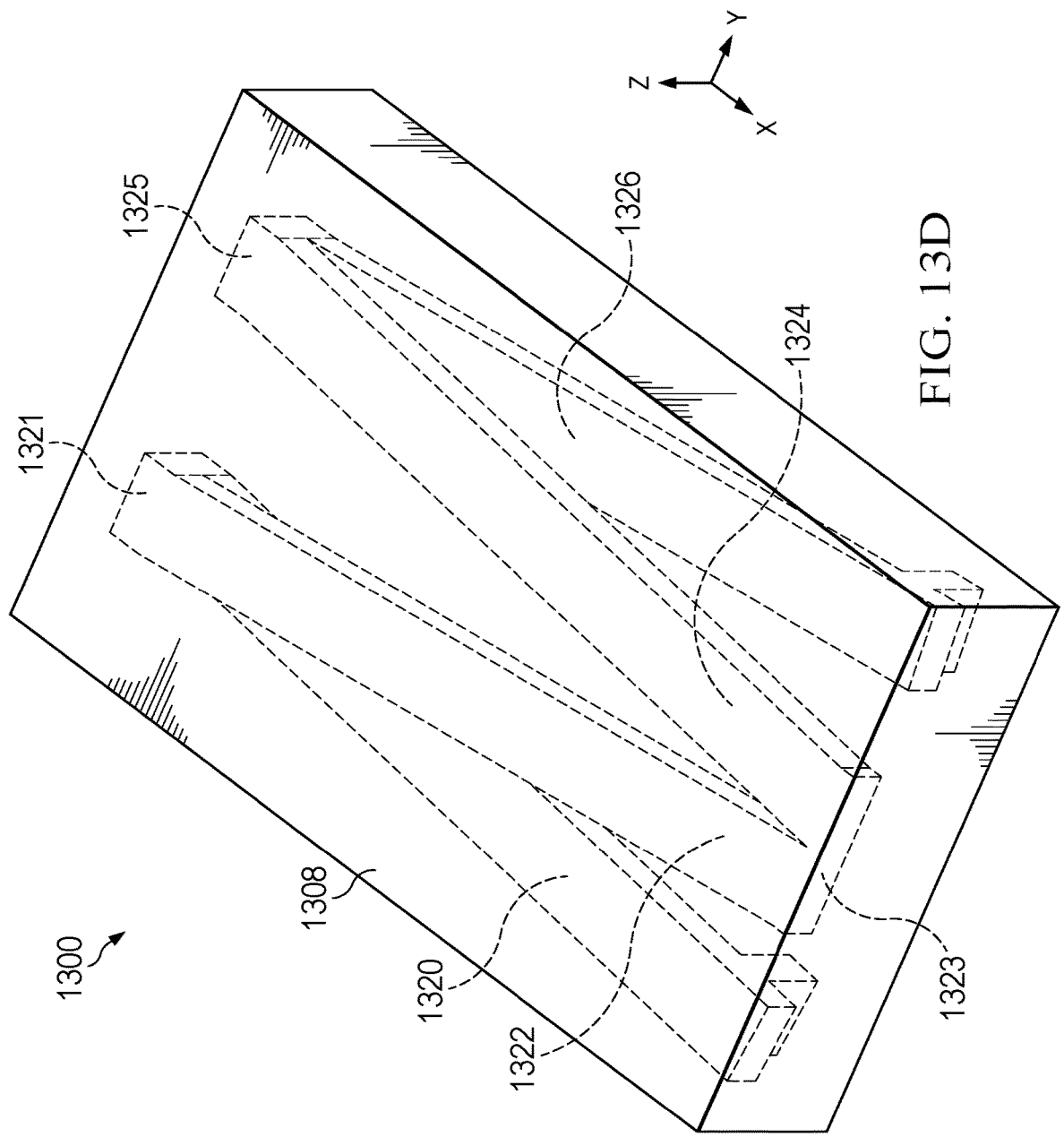

FIG. 13D is an oblique parallel projection view of container enclosure 1308, which has internal cavities 1320, 1322, 1324, 1326 configured to hold containers 1302, 1303, 1304, 1305, respectively, and internal cavities 1321, 1323, 1325 configured to hold solid dielectric signal couplers 1307, 1306, 1309 and signal coupler 706, respectively. In some examples, container enclosure 1308 is interiorly coated with an electromagnetically reflective material (e.g., metallized), such that when containers 1302, 1303, 1304, 1305 are seated in container enclosure 1308, where the material adjoins (or is substantially in contact with) the outer surfaces of each container 1302, 1303, 1304, 1305 and each signal coupler 1306, 1307, 1309.

Figure 13E:
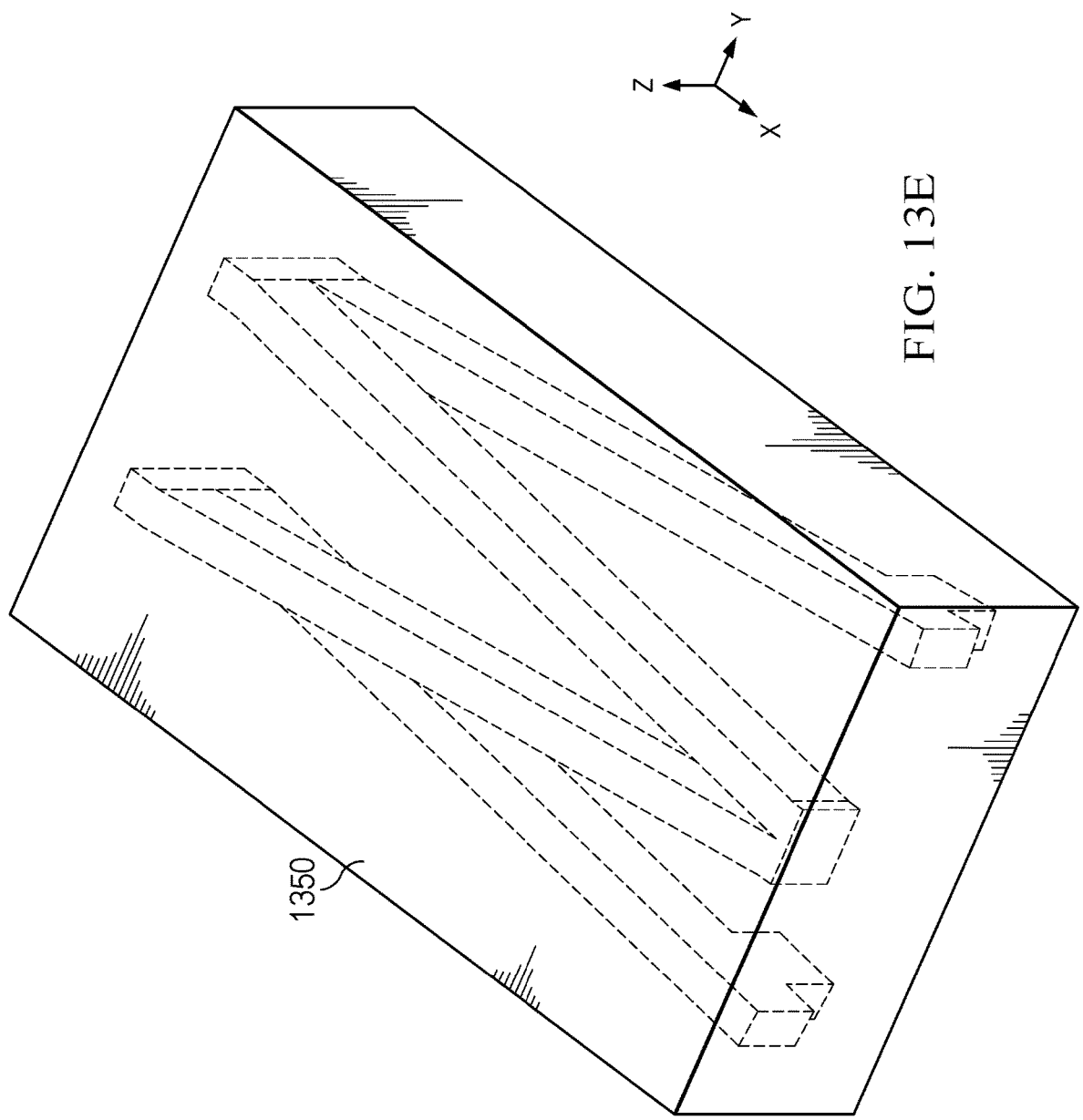

FIG. 13E is an oblique parallel projection view of an alternative container enclosure 1350, which has internal cavities configured to hold containers having a rectangular cross section, in which the containers are oriented within container enclosure 1350 such that the narrower sides are parallel to the x-y plane shown to support a different mode of transmission, as described in FIGS. 11 and 12. Container enclosure 1350 may be otherwise similar in material respects to container enclosure 1308.

Figure 14:
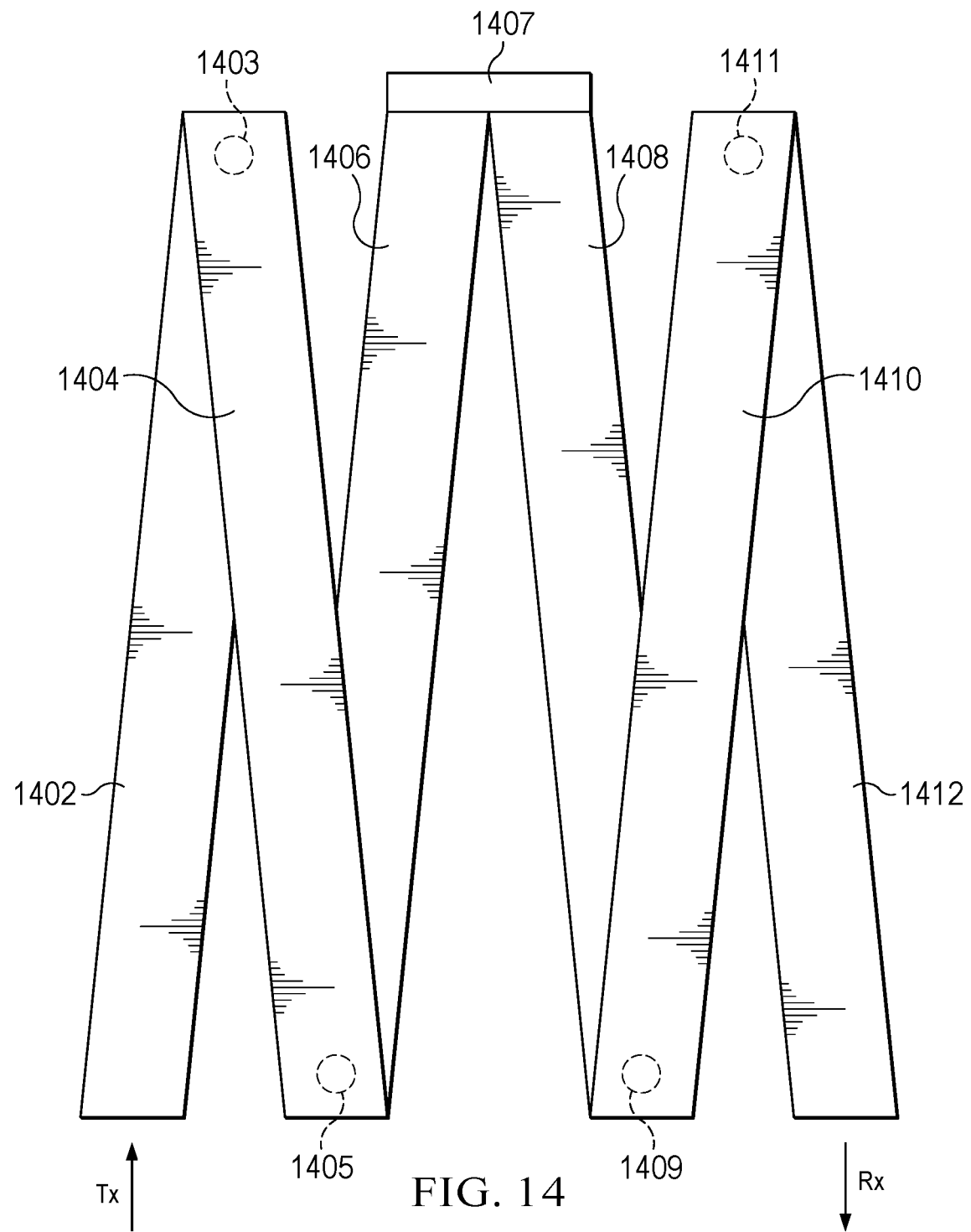
FIG. 14 is a top view of an arrangement of an example quantum transition frequency detector having at least six overlapping dipolar-gas-confining containers communicatively coupled together using at least five signal couplers.

FIG. 14 is a top view of an arrangement of an example quantum transition frequency detector 1400 having at least six overlapping dipolar gas-confining containers 1402, 1404, 1406, 1408, 1410, 1412 and at least five signal couplers 1403, 1405, 1407, 1209, 1411. Detector 1400 and containers 1402, 1404, 1406, 1408, 1410, 1412 can be similar in material respects to detector 100 and container 102 of FIG. 1, respectively. Container 1402 is at an angle from container 1404 and signal coupler 1403 communicatively couples container 1402 to container 1404 in a manner similar to what is described herein with reference to containers 802, 804 and signal coupler 806. Container 1404 is at an angle from container 1406 and signal coupler 1405 communicatively couples container 1404 to container 1406 in a manner similar to what is described herein with reference to containers 802, 804 and signal coupler 806. Container 1406 is at an angle from container 1408 and signal coupler 1475 communicatively couples container 1406 to container 1408 in a manner similar to what is described herein with reference to containers 902, 904 and signal coupler 906. Container 1408 is at an angle from container 1410 and signal coupler 1409 communicatively couples container 1408 to container 1410 in a manner similar to what is described herein with reference to containers 802, 804 and signal coupler 806. Container 1410 is at an angle from container 1412 and signal coupler 1411 communicatively couples container 1410 to container 1412 in a manner similar to what is described herein with reference to containers 802, 804 and signal coupler 806.

Containers 1402, 1406, 1408, 1412 can be enclosed within a first level of a container enclosure (not explicit shown) and containers 1404, 1410 can be enclosed within a second level of the same container enclosure, in which the first and second levels of the container enclosure are parallel to each other, and the second level is on the first level. A multi-level approach may facilitate using various different methods of communicatively coupling adjacent containers together, thereby minimizing the space required to achieve a certain end-to-end length for the containers collectively. For example, when communicatively coupling together two containers within the same level (e.g., signal coupler 1407 communicatively couples container 1406 to container 1408), a signal coupler can be used to couple together respective non-opposing surfaces of the containers, as described with reference to FIGS. 9A through 9D. When communicatively coupling together two containers within overlapping levels (e.g., signal coupler 1403 communicatively couples container 1402 within a first level to container 1404 within a second level on the first level), a signal coupler can be used to couple together respective opposing surfaces of the containers, as described with reference to FIGS. 8A through 8D. The communicative intercoupling of containers 1402, 1404, 1406, 1408, 1410, 1412 by signal couplers 1403, 1405, 1407, 1209, 1411 may be expended further with additional containers, signal couplers or levels, thereby even further increasing the collective end-to-end length of containers within a maximum volume for the detector 1400.

Figure 15A:
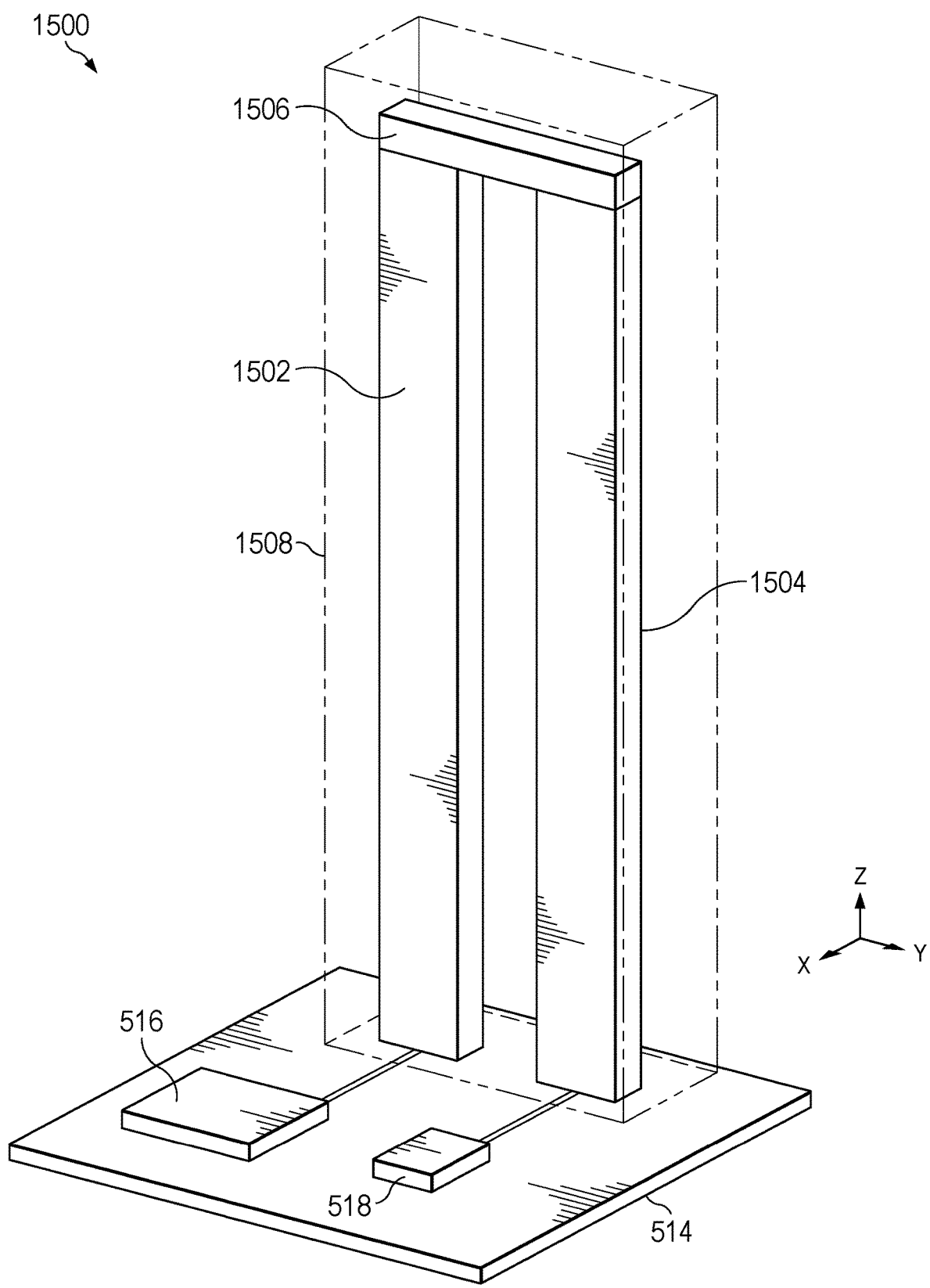
FIGS. 15A, 15B, and 15C show angled and side views, respectively, of an example quantum transition frequency detector having dipolar gas-confining containers communicatively coupled together by a signal coupler, in which the containers are arranged perpendicular to (or angled from) a PCB containing transmit and receive antennas and circuitries.
Figure 15B:
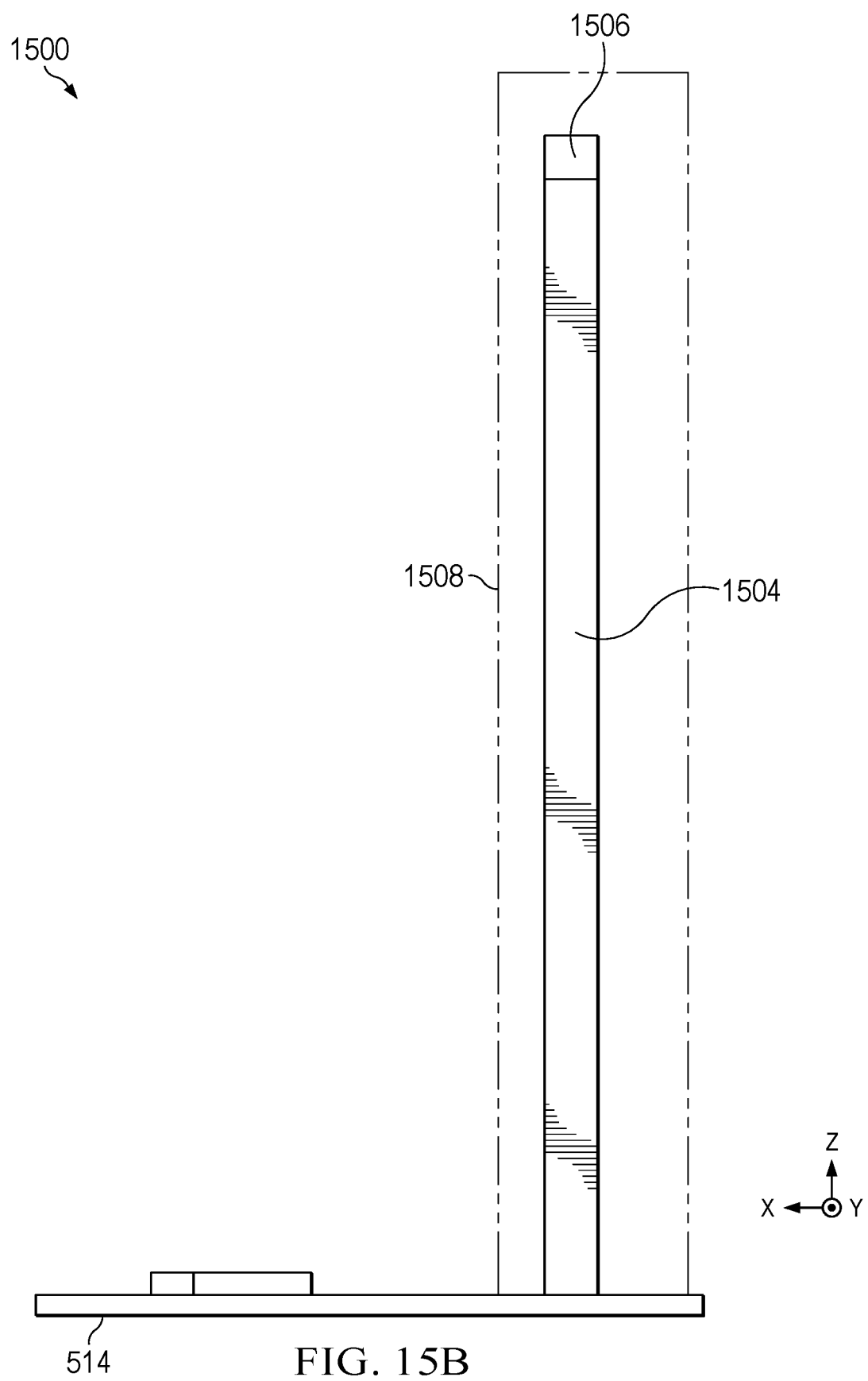
Figure 15C:
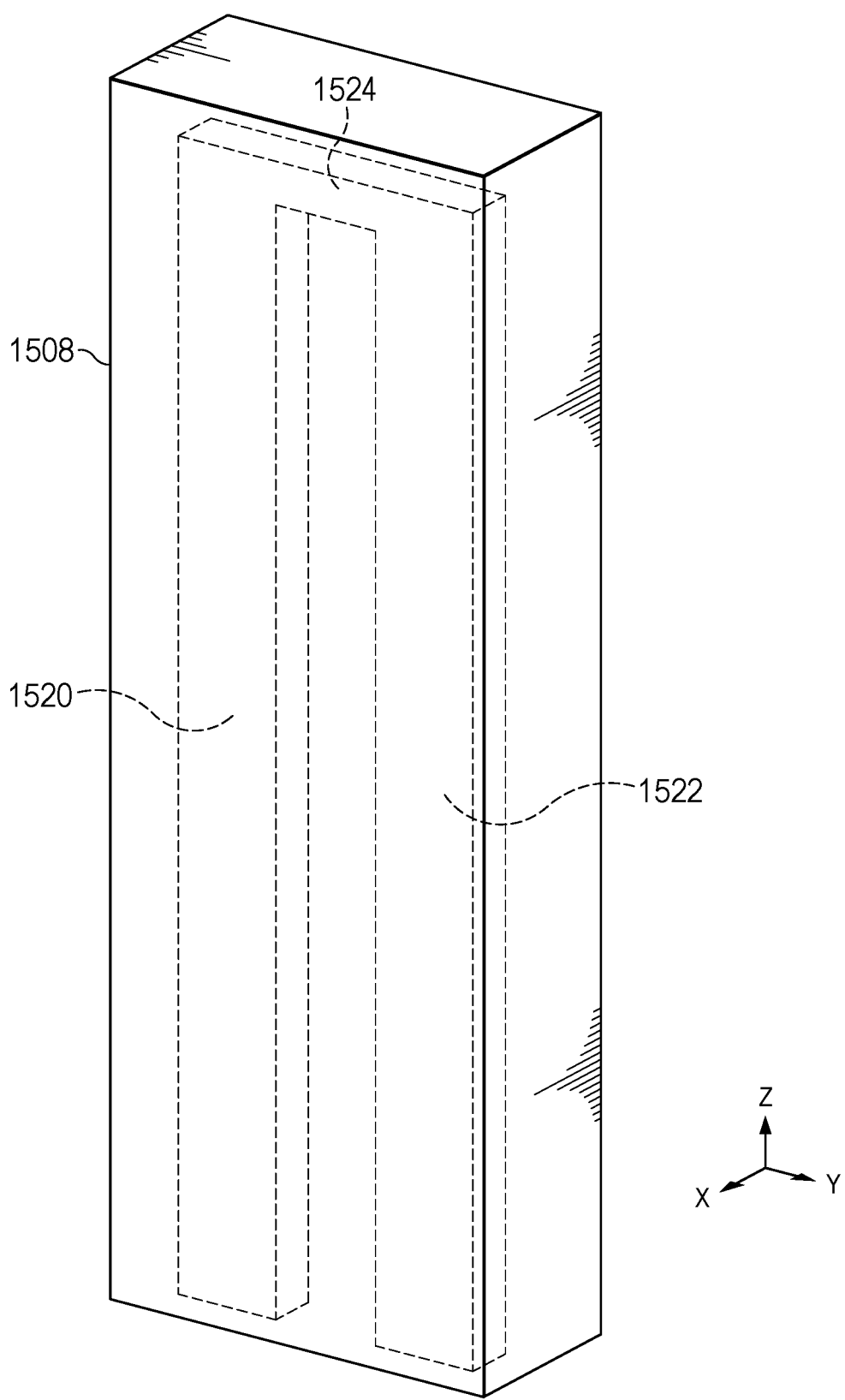

FIGS. 15A and 15B show angled and side views, respectively, of an example quantum transition frequency detector 1500 having dipolar gas-confining containers 1502 and 1504 communicatively coupled together by a signal coupler 1504, in which the containers are arranged perpendicular to (or angled from) PCB 514 containing transmit and receive antennas and circuitries. The illustrated detector is otherwise substantially similar in material respects to detector 500. FIG. 15C illustrates an example container enclosure 1508 having cavities 1520, 1522, and 1524 therein to hold in position the containers and signal coupler shown in FIGS. 15A and 15B. In some examples, container enclosure 1508 is interiorly coated with an electromagnetically reflective material (e.g., metallized), such that when containers 1502, 1504, and coupler 1506 are seated in container enclosure 1508, where the material adjoins (or is substantially in contact with) the outer surfaces of containers 1502, 1504 and signal coupler 1506. In some examples, the outer surfaces of containers 1502, 1504 and signal coupler 1506 can be coated with an electromagnetically reflective material, as described above.

Figure 16A:
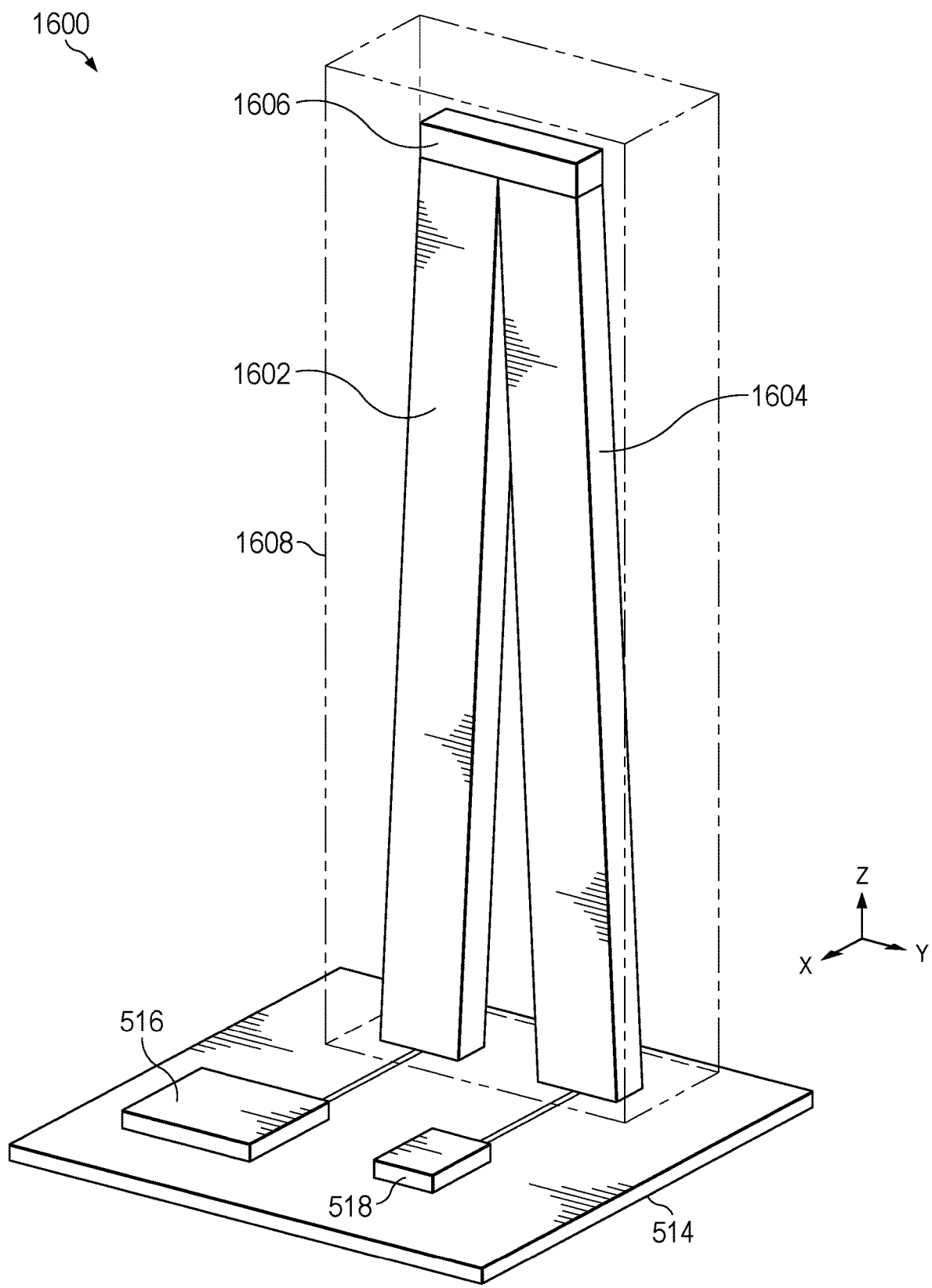
FIGS. 16A,16B, and 16C show angled and side views, respectively, of an example quantum transition frequency detector having two dipolar-gas-confining containers communicatively coupled together by a signal coupler, in which the containers are arranged perpendicular to (or angled from) a PCB containing transmit and receive antennas and circuitries.
Figure 16B:
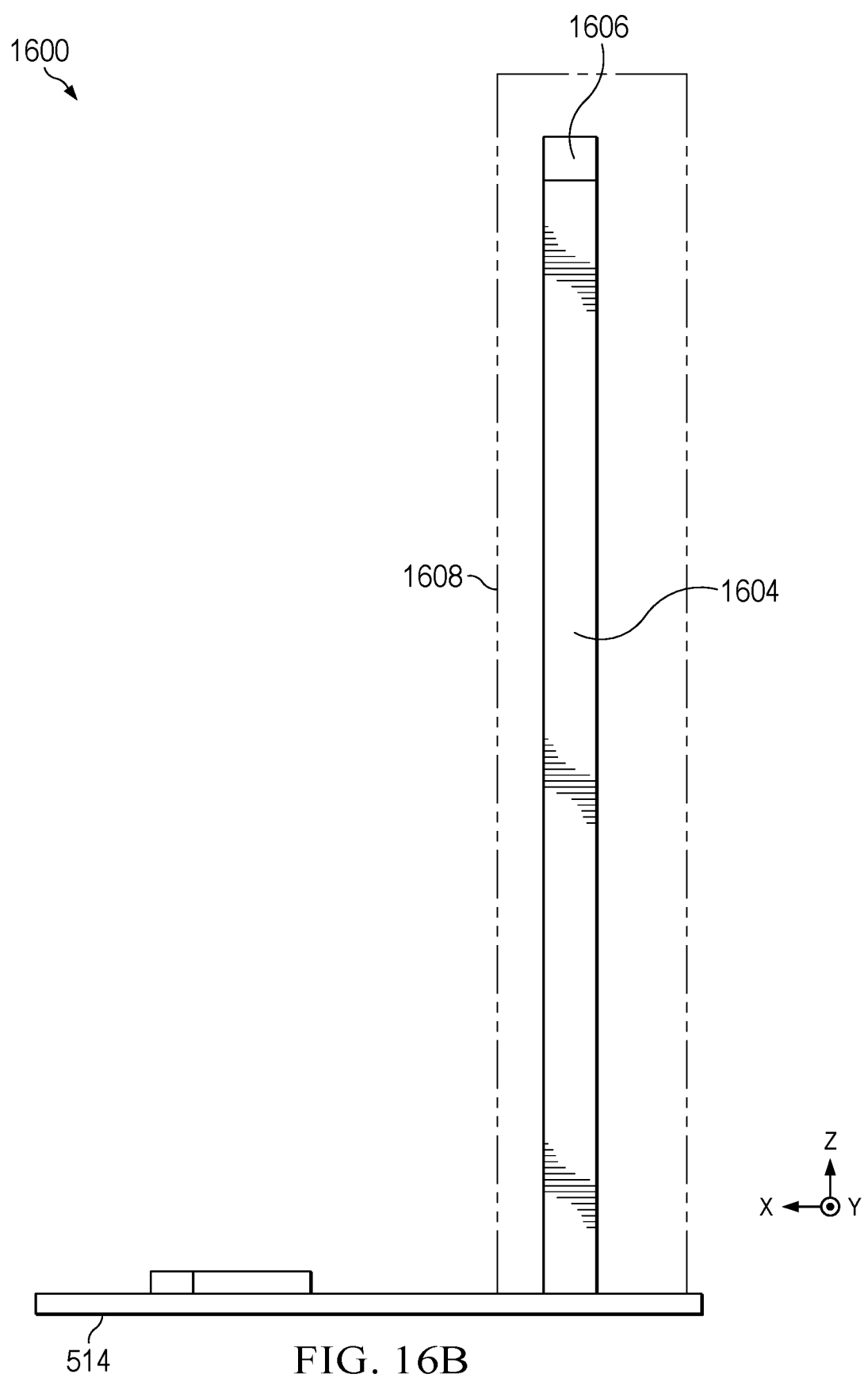
Figure 16C:
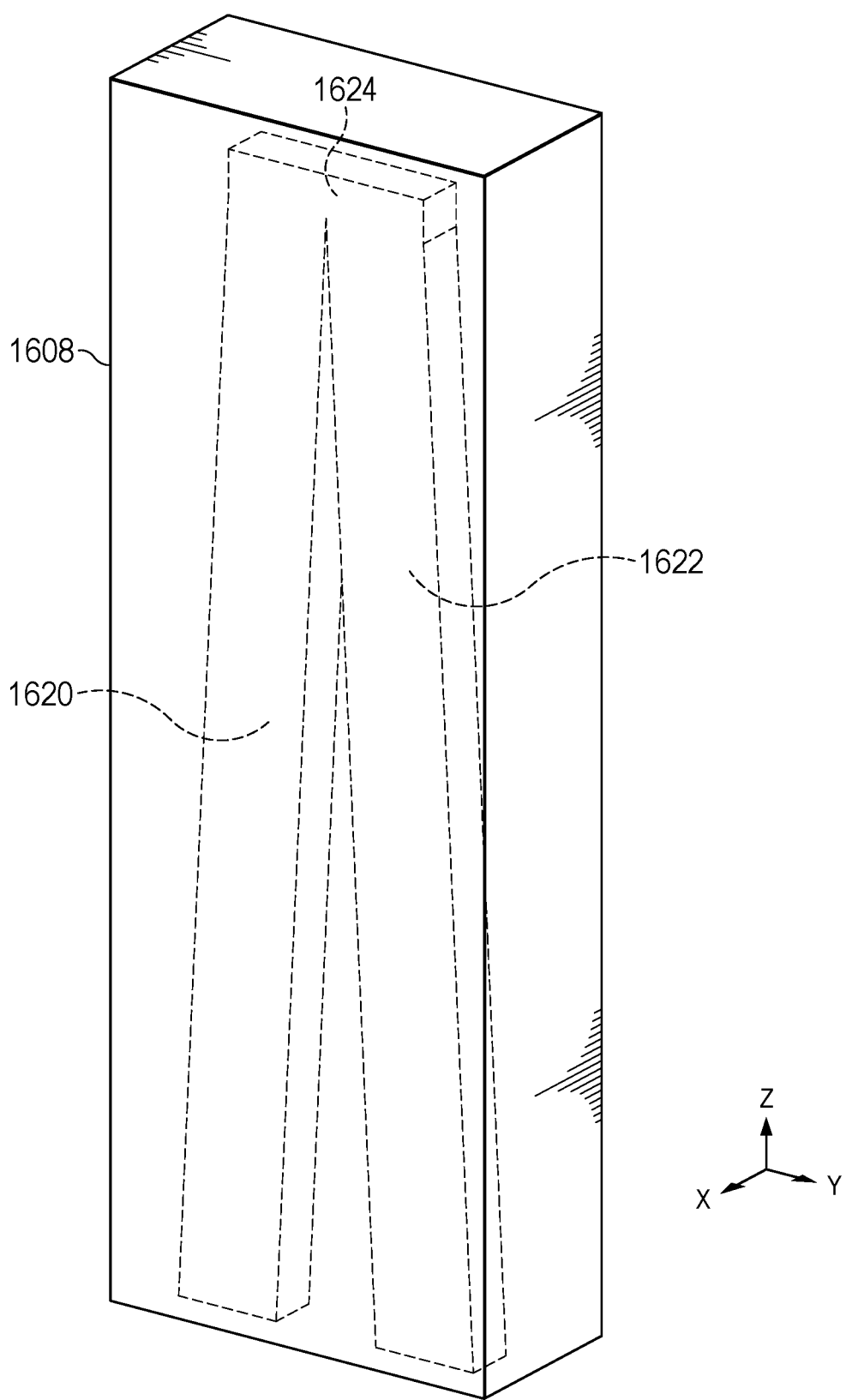

FIGS. 16A and 16B show angled and side views, respectively, of an example quantum transition frequency detector 1600 having two dipolar gas-confining containers 1602 and 1604 communicatively coupled together by a signal coupler 1606, in which the containers are arranged perpendicular to PCB 514 containing transmit and receive antennas and circuitries. The illustrated detector is otherwise substantially similar in material respects to detector 600. FIG. 16C illustrates an example container enclosure 1608 having cavities 1620, 1622, and 1624 therein to hold in position the containers and signal coupler shown in FIGS. 16A and 16B. In some examples, container enclosure 1608 is interiorly coated with an electromagnetically reflective material (e.g., metallized), such that when containers 1602, 1604, and coupler 1606 are seated in container enclosure 1608, where the material adjoins (or is substantially in contact with) the outer surfaces of containers 1602, 1504 and signal coupler 1606. In some examples, the outer surfaces of containers 1602, 1604 and signal coupler 1606 can be coated with an electromagnetically reflective material, as described above.

Figure 17A:
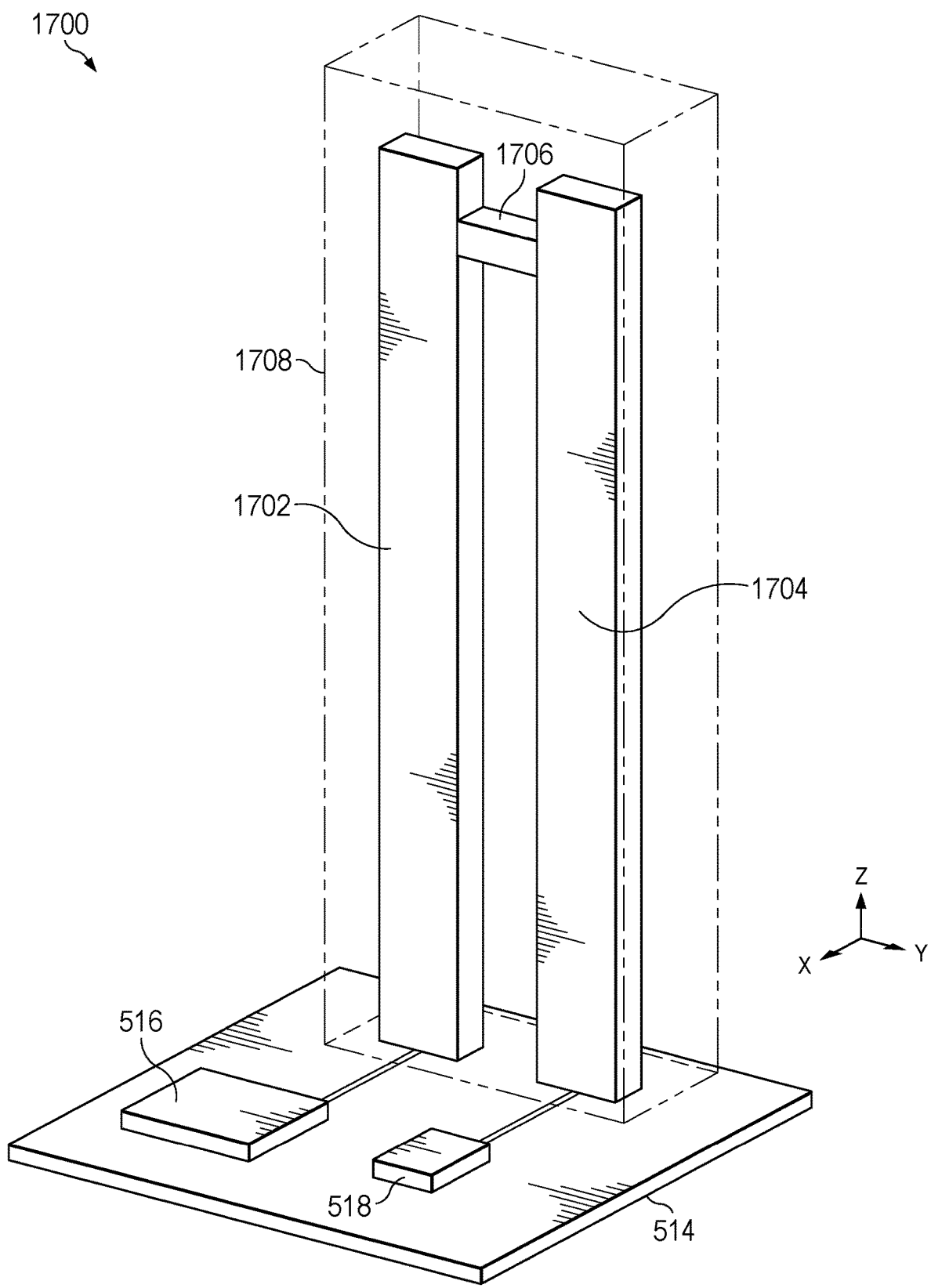
Figure 17C:
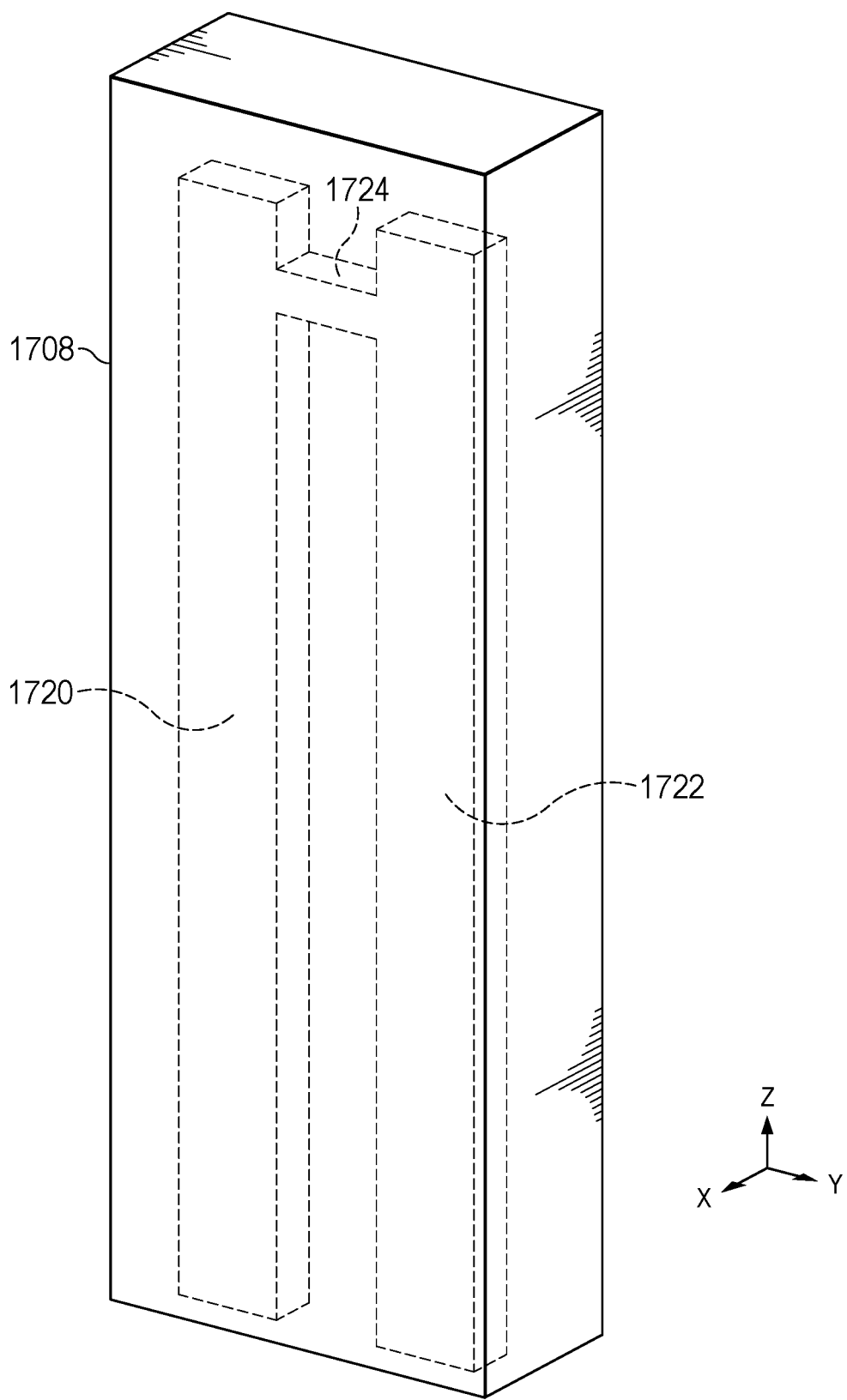

FIGS. 17A and 17B show angled and top views, respectively, of an example quantum transition frequency detector 1700 having two dipolar gas-confining containers 1702 and 1704 communicatively coupled together by a signal coupler 1706, in which the containers are arranged perpendicular to PCB 514 containing transmit and receive antennas and circuitries. The illustrated detector is otherwise substantially similar in material respects to detector 700. FIG. 17C illustrates an example container enclosure having cavities 1720, 1722, and 1724 therein to hold in position the containers and signal coupler shown in FIGS. 17A and 17B. In some examples, container enclosure 1708 is interiorly coated with an electromagnetically reflective material (e.g., metallized), such that when containers 1702, 1704, and coupler 1706 are seated in container enclosure 1708, where the material adjoins (or is substantially in contact with) the outer surfaces of containers 1702, 1704 and signal coupler 1706. In some examples, the outer surfaces of containers 1702, 1704 and signal coupler 1706 can be coated with an electromagnetically reflective material, as described above.

Figure 18A:
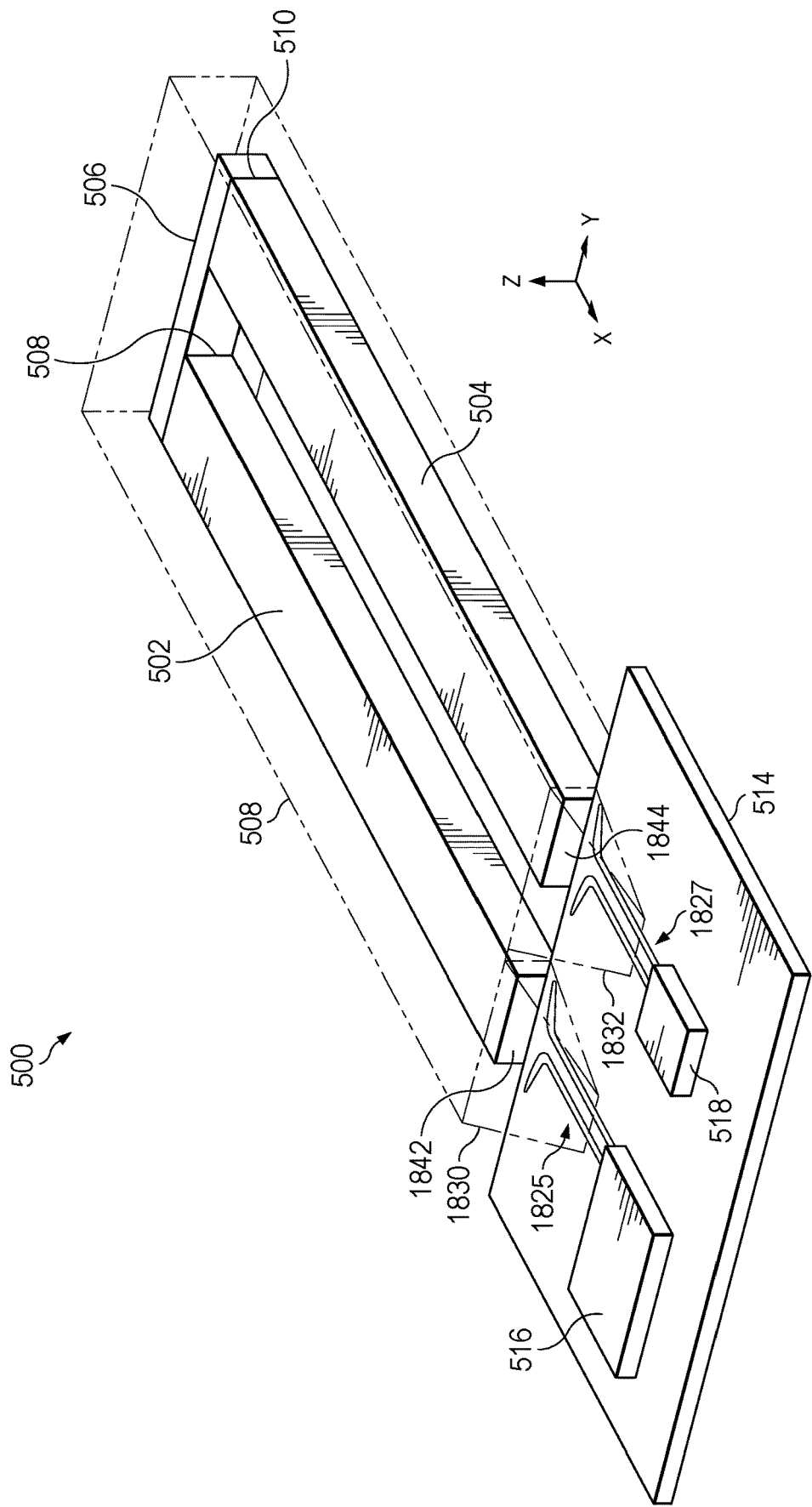
FIGS. 18A and 18B illustrate additional example signal couplers between dipolar-gas-confining containers, in which the containers are communicatively coupled to another arrangement of transmit and receive antennas, which can be Vivaldi antennas.
Figure 18B:
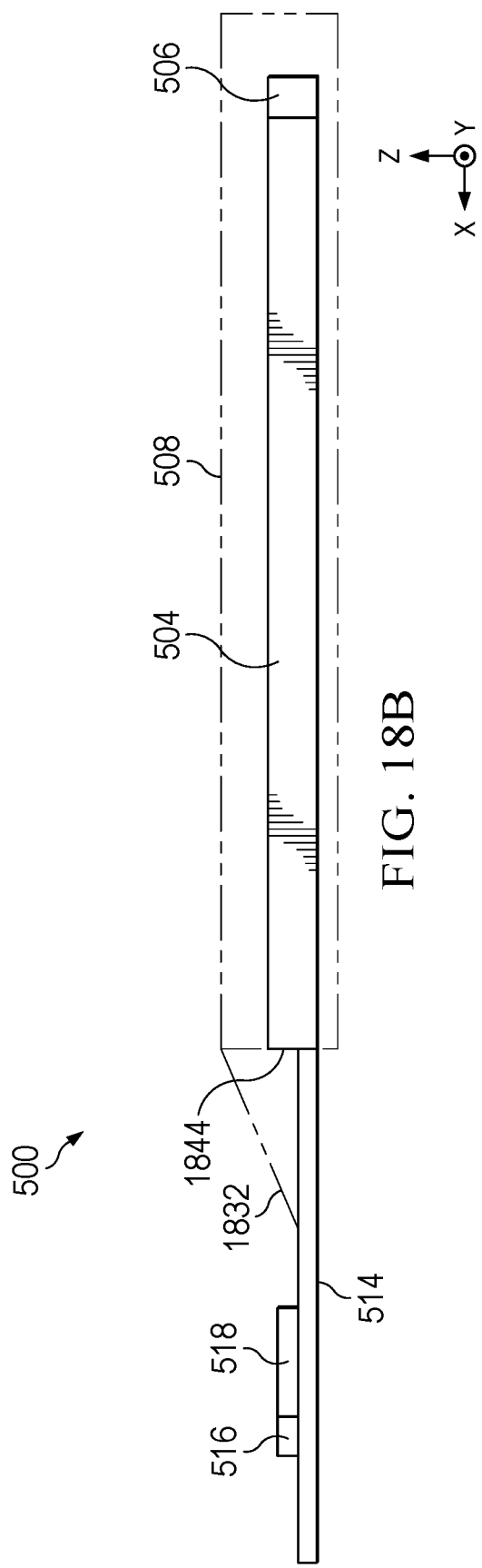

FIGS. 18A and 18B illustrate additional example signal couplers between dipolar gas containers, such as dipolar gas containers 502 and 504 of FIGS. 5A-5E and the TX and RX antennas. In FIGS. 18A and 18B, TX and RX antennas 1825, 1827 can be Vivaldi antennas. Signal couplers 1830 and 1832 can be coplanar waveguides. Signal coupler 1830 can be coupled between a side surface 1842 of container 502 that is perpendicular to the axis of extension of container 502 (e.g., x-y plane), and signal coupler 1832 can be coupled between a side surface 1844 of container 504 that is perpendicular to the axis of extension of container 504 (e.g., x-y plane). Antennas 1825 and 1827 and signal couplers 1830 and 1832 can replace the antennas and signal couplers (between gas container and antennas) of the examples of quantum transition frequency detectors described herein.

Figure 19:
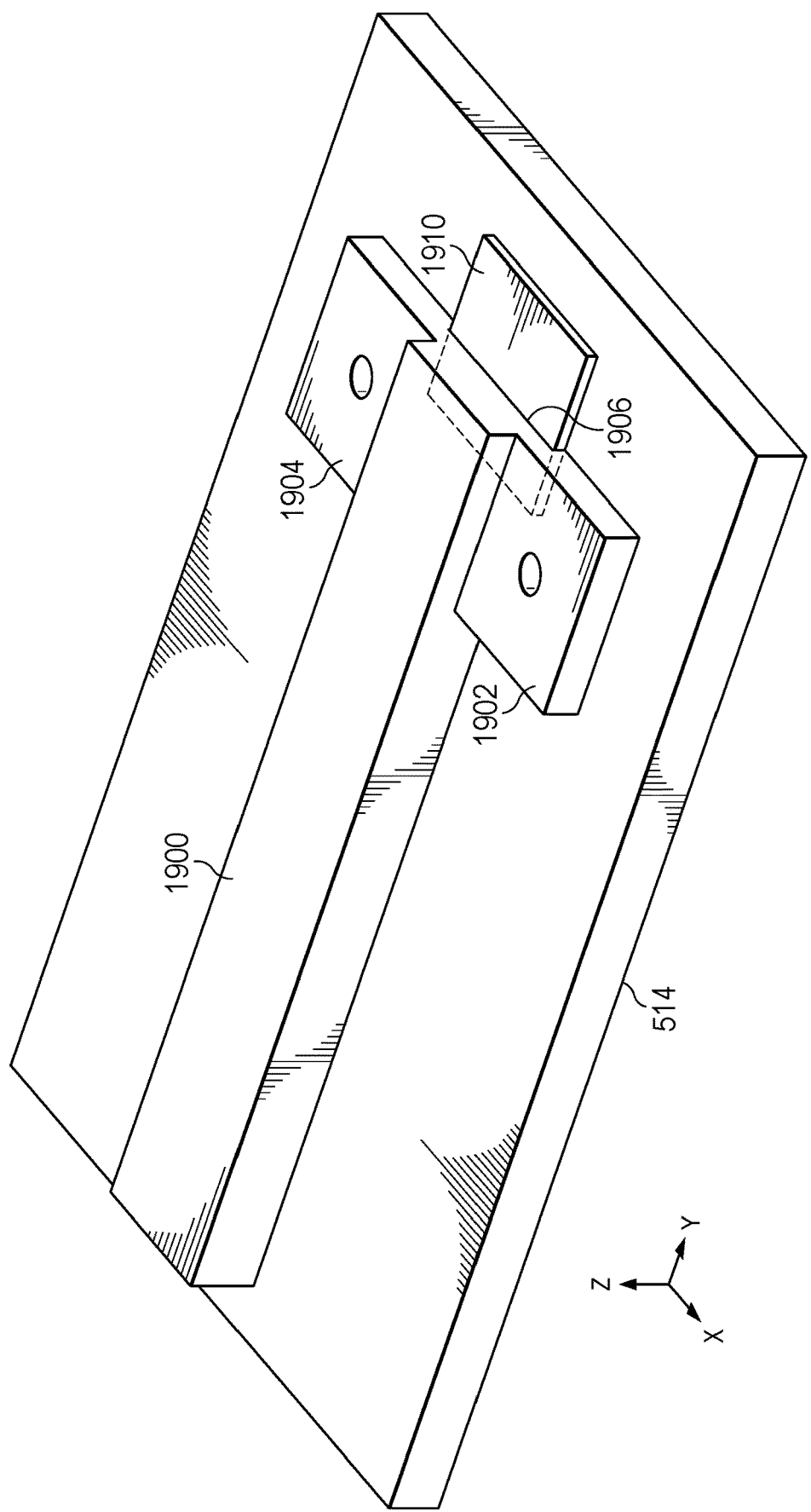
FIGS. 19 and 20 illustrate additional examples of a container enclosure.
Figure 20:
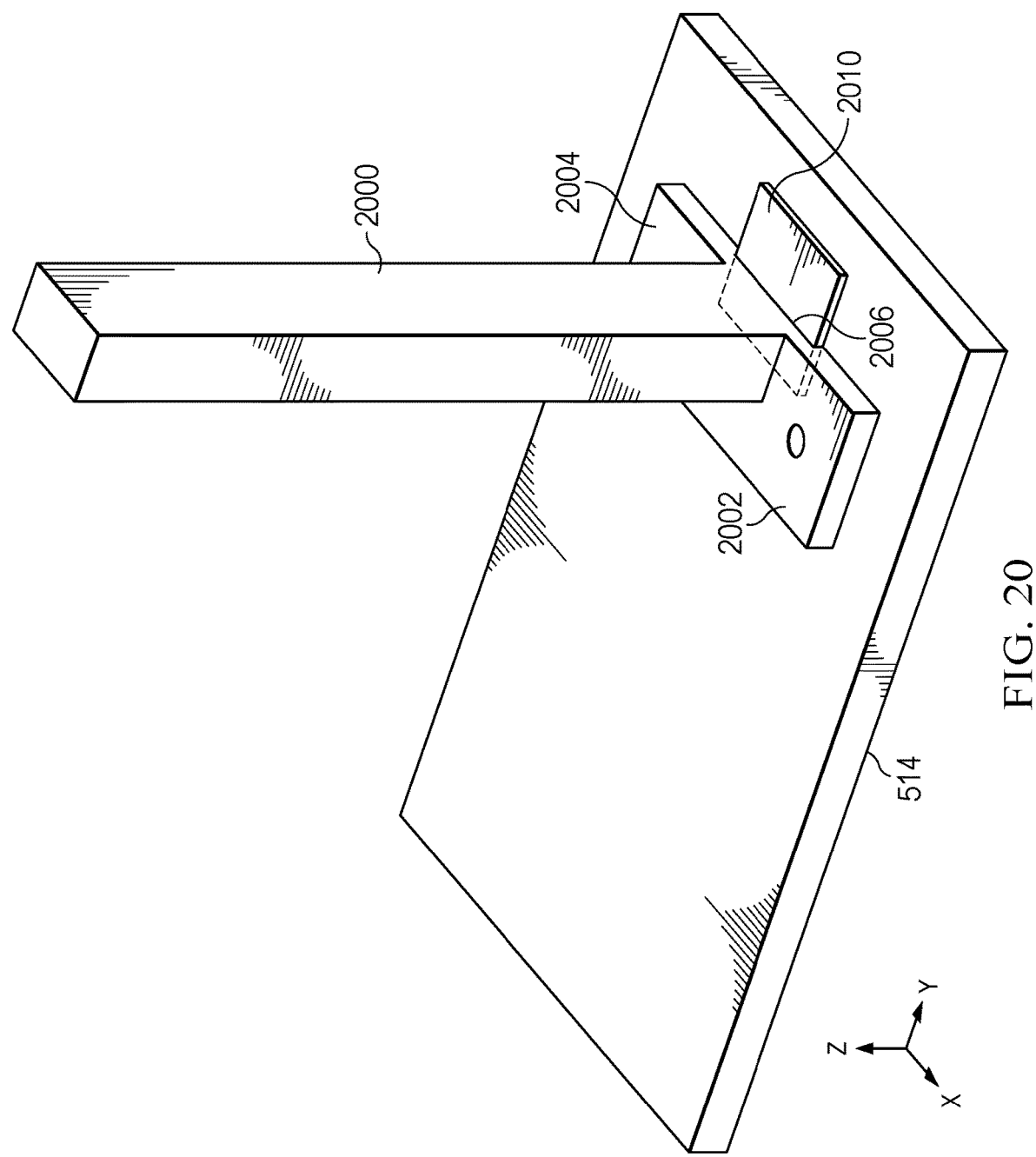

FIGS. 19 and 20 illustrate additional examples of container enclosure. In FIG. 19, container enclosure 1900 can be an example of container enclosures 508, 608, 708, 808, 908, 1108, 1208, 1308, and 1350, in examples where the dipolar-gas-confining containers extend parallel to PCB 514. Also, in FIG. 20, container enclosure 2000 can be an example of container enclosures 1508, 1608, and 1708, where the dipolar gas containers extend perpendicular to (or angled from) PCB 514. In some examples, container enclosure 1900 can be made using 3D printing. Container enclosure 1900 can be made of a mold compound (e.g., epoxy) and can be made using a molding process (e.g., injection molding). In a case where the internal cavities of the container enclosure is coated with an electromagnetic reflective layer (e.g., a metal layer), the container enclosure can be split along the axis of extension of the gas container (e.g., along the x-y plane for container enclosure 1900, along the z-x or z-y plane for container enclosure 2000) to expose the internal surfaces of the cavities, and a layer of metal can be coated (e.g., by spray coating, or other techniques) on the internal surfaces.

Referring to FIGS. 19 and 20, container enclosure 1900 can include fastening extension portions 1902 and 1904 for screw/pin (or other fastening mechanisms) to fasten container enclosure 1900 on PCB 514. Also, container enclosure 1900 includes a notch portion 1906 to hug/fit an integrated circuit (IC) 1910 containing the mm-wave transmit and receive antennas and circuitries (e.g., circuitries 516 and 518) on PCB 514. The notch portion allows fitting container enclosure 1900 with IC 1910, which can improve the mechanical coupling between container enclosure 1900 and PCB 514 and reduce stress on IC 910. In some examples, a layer of insulating material can be placed between notch portion 1906 and IC 1910 to further protect/insulate IC 1910. Referring to FIG. 20, container enclosure 2000 can also include fastening extension portions 2002 and 2004 for screw/pin (or other fastening mechanisms), and a notch portion 2006 to hug/fit an integrated circuit (IC) 2010 containing the mm-wave transmit and receive antennas and circuitries (e.g., circuitries 516 and 518) on PCB 514.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context. To aid the Patent Office, and any readers of any patent issued on this application, in interpreting the claims appended hereto, applicant notes that there is no intention that any of the appended claims invoke 35 U.S.C. § 112(f) as it exists on the date of filing hereof unless the words "means for" or "step for" are explicitly used in the claim language.

In the foregoing descriptions, for purposes of explanation, numerous specific details are set forth to provide a thorough understanding of one or more examples. However, this disclosure may be practiced without some or all these specific details, as will be evident to one having ordinary skill in the art. In other instances, well-known process steps or structures have not been described in detail in order not to unnecessarily obscure this disclosure. In addition, while the disclosure is described in conjunction with example examples, this description is not intended to limit the disclosure to the described examples. To the contrary, the description is intended to cover alternatives, modifications, and equivalents as may be included within the spirit and scope of the disclosure as defined by the appended claims.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements may be external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. An apparatus comprising:
a first gas container;
a second gas container;
a signal coupler configured to transmit a signal between the first and second gas containers;
a container enclosure enclosing the first and second gas containers and the signal coupler; and
an electromagnetic (EM) reflective coating inside the container enclosure and covering at least part of the first gas container, at least part of the second gas container, and at least part of the signal coupler.

2. The apparatus of claim 1, wherein the first gas container has a first surface, the second gas container has a second surface, and the signal coupler has a third surface opposing the first and second surfaces.

3. The apparatus of claim 2, wherein the first gas container and the second gas container are parallel to each other.

4. The apparatus of claim 2, wherein the first gas container is angled from the second gas container.

5. The apparatus of claim 1, wherein the first gas container has a first surface, the second gas container has a second surface opposing the first surface, the signal coupler has opposing third and fourth surfaces, the third surface opposing the first surface and the fourth surface opposing the second surface.

6. The apparatus of claim 5, wherein the first gas container and the second gas container are parallel to each other.

7. The apparatus of claim 5, wherein the first gas container is angled from the second gas container.

8. The apparatus of claim 1, wherein a first portion of the first gas container is one a second portion of the second gas container; and
wherein the signal coupler is between the first and second portions.

9. The apparatus of claim 1, wherein the signal coupler is a first signal coupler, and the apparatus further comprises:
a third gas container;
a fourth gas container enclosing a fourth dipolar gas;
a second signal coupler configured to transmit a signal between the second gas container and the third gas container; and
a third signal coupler configured to transmit a signal between the third gas container and the fourth gas container.

10. The apparatus of claim 9, wherein the first gas container is angled from the second gas container, the second gas container is angled from the third gas container, and the third gas container is angled from the fourth gas container.

11. The apparatus of claim 1, wherein each of the first and second gas container is configured to store a dipolar gas or a dipolar vapor.

12. The apparatus of claim 1, wherein the signal coupler includes a solid material or a cavity.

13. A system comprising:
a substrate including a transmitter and a receiver;
a first gas container and configured to receive a first signal from the transmitter;
a second gas container and configured to transmit a second signal to the receiver;
a signal coupler configured to transmit a third signal between the first and second gas containers;
a container enclosure enclosing the first and second gas containers and the signal coupler; and
an electromagnetic (EM) reflective coating inside the container enclosure and covering at least part of the first gas container, at least part of the second gas container, and at least part of the signal coupler.

14. The system of claim 13, wherein the first and second gas containers are parallel to a surface of the substrate.

15. The system of claim 13, wherein the first and second gas containers are perpendicular to a surface of the substrate.

16. The system of claim 13, wherein the container enclosure has a first opening in the EM reflective coating at a first end of the first gas container and has a second opening in the EM reflective coating at a second end of the second gas container, wherein the first gas container is configured to receive the first signal via the first opening, and the second gas container is configured to transmit the second signal via the second opening.

17. The system of claim 13, wherein the EM reflective coating is on outer surfaces of the first and second gas container and the signal coupler.

18. The system of claim 13, wherein the first gas container has a first end surface, the second gas container has a second end surface, and the signal coupler has a coupler surface facing the first and second end surfaces.

19. The system of claim 13, wherein each of the first and second gas containers is configured to store a dipolar gas or a dipolar vapor, and each of the first and second signals has a frequency at a quantum transition frequency of the dipolar gas or the dipolar vapor.

20. The system of claim 13, wherein the first and second gas containers are parallel to each other.

21. The system of claim 13, wherein the first gas container is angled from the second gas container.

22. The system of claim 13, wherein the first gas container has a first surface, the second gas container has a second surface opposing the first surface, and the signal coupler has opposing third and fourth surfaces, the third surface opposing the first surface and the fourth surface opposing the second surface.

23. The system of claim 13, wherein a first portion of the first gas container is on a second portion of the second gas container; and
wherein the signal coupler is coupled between the first and second portions.

24. The system of claim 13, wherein the container enclosure includes fastening extension portions coupled to the substrate.

25. The system of claim 13, wherein the container enclosure includes a notch portion to hug an integrated circuit on the substrate.

26. The system of claim 13, wherein the signal coupler includes a solid material or a cavity.

* * * * *